(12) United States Patent
Li et al.

(10) Patent No.: US 12,261,046 B1
(45) Date of Patent: Mar. 25, 2025

(54) SEMICONDUCTOR STRUCTURES AND MANUFACTURING METHODS THEREOF

(71) Applicant: Diodes Incorporated, Plano, TX (US)

(72) Inventors: Jie Li, New Taipei (TW); Ming-Wei Tsai, New Taipei (TW); Chiao-Shun Chuang, New Taipei (TW); Ching-Wen Wang, New Taipei (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 18/627,362

(22) Filed: Apr. 4, 2024

(30) Foreign Application Priority Data

Dec. 26, 2023 (CN) .......................... 202311802660.7

(51) Int. Cl.
*H01L 21/04* (2006.01)
*H10D 12/01* (2025.01)
*H10D 62/832* (2025.01)

(52) U.S. Cl.
CPC ....... *H01L 21/0465* (2013.01); *H10D 12/031* (2025.01); *H10D 62/8325* (2025.01)

(58) Field of Classification Search
CPC ..................... H01L 21/0465; H01L 29/66068
USPC .......................................................... 438/514
See application file for complete search history.

(56) References Cited

U.S. PATENT DOCUMENTS

| | | | |
|---|---|---|---|
| 3,997,367 A | | 12/1976 | Yau |
| 5,141,881 A | * | 8/1992 | Takeda ................. H01L 21/761 |
| | | | 257/E21.608 |
| 6,130,458 A | * | 10/2000 | Takagi ................. H01L 21/743 |
| | | | 257/349 |

FOREIGN PATENT DOCUMENTS

| | | |
|---|---|---|
| CN | 115939178 A | 4/2023 |
| CN | 115954377 A | 4/2023 |

OTHER PUBLICATIONS

Office Action and Search Report from Taiwan Patent Application No. 113101683, dated Aug. 8, 2024, 13 pages.

* cited by examiner

*Primary Examiner* — Ori Nadav
(74) *Attorney, Agent, or Firm* — Hong Zou; AP3 Law Firm PLLC

(57) ABSTRACT

Various methods for manufacturing semiconductor structures are provided. An embodiment method includes forming a first patterned hard mask and epitaxial layer on a semiconductor substrate, and forming a first doped region in the epitaxial layer by performing a first implantation through the first patterned hard mask. A second doped region is formed in the epitaxial layer by performing a second implantation through the first patterned hard mask, with the first doped region at least partially overlapping the second doped region. A second patterned hard mask is formed, which surrounds the first patterned hard mask and covers at least a portion of the first doped region. A third doped region is formed in the epitaxial layer by performing a third implantation through the first patterned hard mask and the second patterned hard mask.

20 Claims, 60 Drawing Sheets

SEMICONDUCTOR STRUCTURES AND MANUFACTURING METHODS THEREOF

CROSS-REFERENCE TO RELATED APPLICATIONS

This patent application claims priority to Chinese Patent Application No. 2023118026607, filed on Dec. 26, 2023 and entitled "Method of manufacturing semiconductor structures," which is hereby incorporated by reference herein as if reproduced in its entirety.

TECHNICAL FIELD

The present disclosure relates generally to the field of semiconductors, and in particular embodiments, to techniques and mechanisms for semiconductor structures and manufacturing methods thereof. In some embodiments, a method for forming a self-aligned doped region in a semiconductor structure is provided.

BACKGROUND

Silicon carbide (SiC), as a material, has performance that is multiple times better than traditional silicon materials in terms of field strength, energy gap, thermal conductivity, and so on. Semiconductor structures made of silicon carbide are more suitable for application in working environments of high-pressure, high-temperature, and high-frequency, are able to meet the needs of power electronics technology development, and are preferred choices in making high-power converters. Compared with traditional high-power metal oxide semiconductor field effect transistors made of silicon, metal oxide semiconductor field effect transistors (MOSFETs) made of silicon carbide are more resistant to high voltages, and provide a higher switching speed which insulated gate bipolar transistors (IGBTs) made of silicon cannot provide, which makes such MOSFETs more suitable for high voltage and high frequency applications.

SUMMARY

Technical advantages are generally achieved, by embodiments of this disclosure which describe semiconductor structures and manufacturing methods thereof.

Embodiments of the present disclosure provide a method for manufacturing a semiconductor structure, which includes: forming an epitaxial layer on a semiconductor substrate; forming a first patterned hard mask above the epitaxial layer; and performing a first implantation process using the first patterned hard mask to form a first doped region in the epitaxial layer; performing a second implantation process using the first patterned hard mask to form a second doped region in the epitaxial layer, wherein the first doped region at least partially overlap the second doped region; forming a second patterned hard mask surrounding the first patterned hard mask and covering at least part of the first doped region; and performing a third implantation process using the second patterned hard mask to form a third doped region in the epitaxial layer.

Embodiments of the present disclosure provide another method for manufacturing a semiconductor structure, which includes: sequentially forming an epitaxial layer and a first patterned hard mask on a semiconductor substrate; performing a first implantation process using the first patterned hard mask to form a first doped region in the epitaxial layer; forming a second patterned hard mask surrounding the first patterned hard mask; performing a second implantation process using the second patterned hard mask to form a second doped region in the epitaxial layer; forming a third patterned hard mask surrounding the second patterned hard mask; and performing a third implantation process using the third patterned hard mask to form a third doped region in the epitaxial layer.

Embodiments of the present disclosure provide yet another method for manufacturing a semiconductor structure, which includes: sequentially forming an epitaxial layer and a first patterned hard mask on a semiconductor substrate; forming a second patterned hard mask surrounding the first patterned hard mask; performing a first implantation process using the second patterned hard mask to form a first doped region in the epitaxial layer; removing the second patterned hard mask; performing a second implantation process using the first patterned hard mask to form a second doped region surrounding the first doped region in the epitaxial layer; removing part of the first patterned hard mask to form a third patterned hard mask; and performing a third implantation process using the third patterned hard mask to form a third doped region in the epitaxial layer, wherein the third doped region at least partially overlaps the second doped region.

The embodiment methods of manufacturing the semiconductor structures in the present disclosure use patterned hard mask(s) as shielding layer(s), and inject doping ions in a self-aligned manner to form doping region(s) or adjustment region(s) The embodiment methods can accurately locate doping position(s) and reduce the mis-alignment errors.

In accordance with one aspect of the present disclosure, a method for manufacturing a semiconductor structure is provided. The method includes: forming an epitaxial layer on a semiconductor substrate; forming a first patterned hard mask above the epitaxial layer; forming a first doped region in the epitaxial layer by performing a first implantation through the first patterned hard mask; forming a second doped region in the epitaxial layer by performing a second implantation through the first patterned hard mask, the first doped region at least partially overlapping the second doped region; forming a second patterned hard mask surrounding the first patterned hard mask and covering at least a portion of the first doped region; and forming a third doped region in the epitaxial layer by performing a third implantation through the first patterned hard mask and the second patterned hard mask.

In accordance with another aspect of the present disclosure, a method for manufacturing a semiconductor structure is provided. The method includes: sequentially forming an epitaxial layer and a first patterned hard mask on a semiconductor substrate; forming a first doped region in the epitaxial layer by performing a first implantation through the first patterned hard mask; forming a second patterned hard mask surrounding the first patterned hard mask; forming a second doped region in the epitaxial layer, by performing a second implantation through the first patterned hard mask and the second patterned hard mask, the first doped region at least partially overlapping the second doped region; forming a third patterned hard mask surrounding the second patterned hard mask; and forming a third doped region in the epitaxial layer by performing a third implantation through the first patterned hard mask, the second patterned hard mask and the third patterned hard mask.

In accordance with another aspect of the present disclosure, a method for manufacturing a semiconductor structure is provided. The method includes: sequentially forming an epitaxial layer and a first patterned hard mask on a semiconductor substrate; forming a second patterned hard mask surrounding the first patterned hard mask; forming a first doped region in the epitaxial layer by performing a first implantation through the first patterned hard mask and the second patterned hard mask; removing the second patterned hard mask; forming, in the epitaxial layer, a second doped region surrounding the first doped region by performing a second implantation through the first patterned hard mask; removing a portion of the first patterned hard mask to form a third patterned hard mask; and forming a third doped region in the epitaxial layer by performing a third implantation through the third patterned hard mask, the third doped region at least partially overlapping the second doped region.

BRIEF DESCRIPTION OF THE DRAWINGS

Aspects of the present disclosure may be better understood from the following described embodiments when read with accompanying drawings. It should be noted that, in accordance with the standard practice in the industry, various structures may not be drawn to scale. In fact, dimensions of the various structures may be arbitrarily increased or reduced for clarity of discussion.

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1:
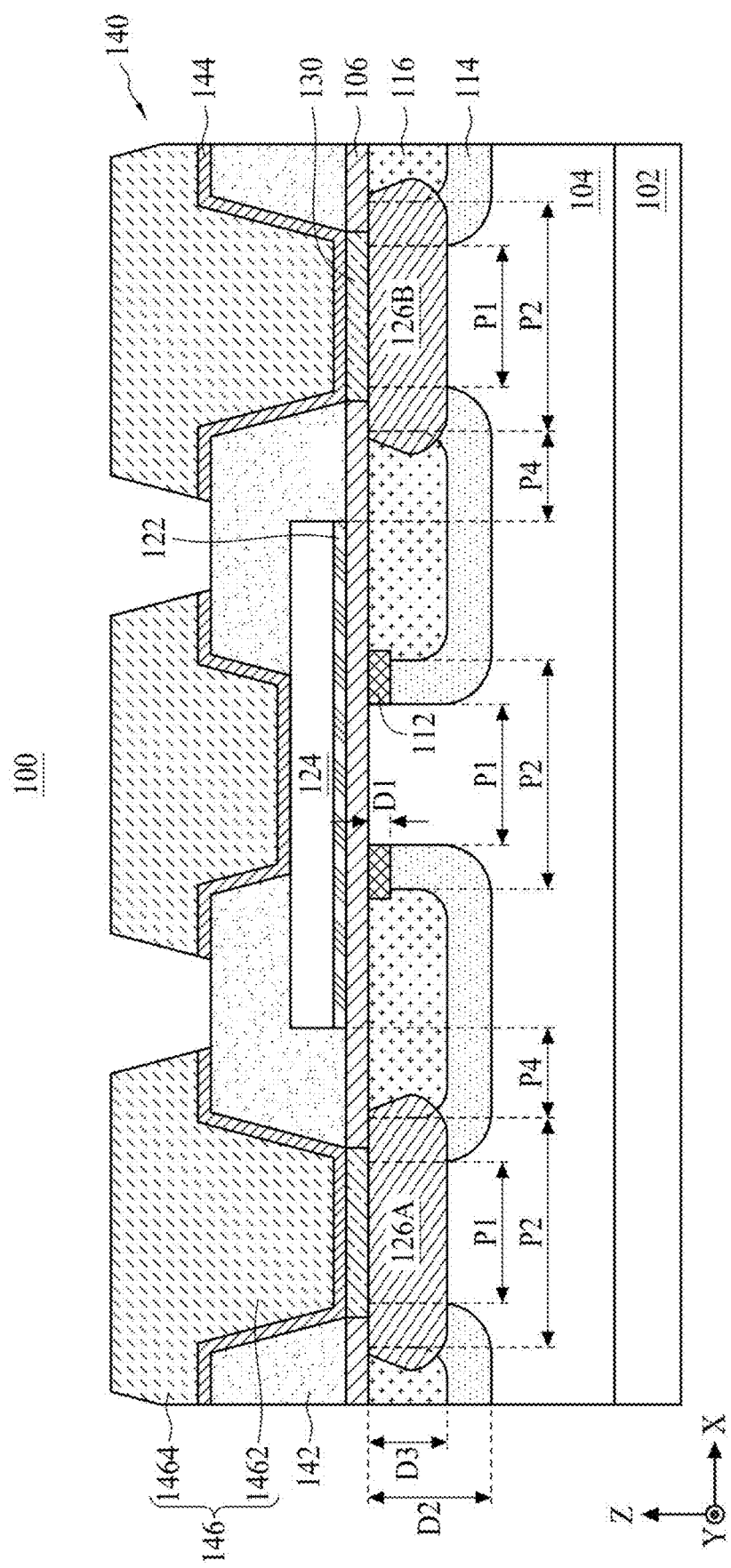
FIG. 1 is a schematic cross-sectional view of a semiconductor structure according to some embodiments of the present disclosure.

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

Further, one or more features from one or more of the following described embodiments may be combined to create alternative embodiments not explicitly described, and features suitable for such combinations are understood within the scope of this disclosure. It is therefore intended that the appended claims encompass any such modifications or embodiments.

The following disclosure provides various different embodiments or examples for implementing different features/components of the presented subject matter. Specific embodiments of components and configurations are described below. Certainly, these are examples only and are not intended to be limiting. In this disclosure, references to forming a first feature/component over or on a second feature/component may include embodiments where the first and second features/components are formed in direct contact, and may also include embodiments where an additional feature/component is formed between the first feature/component and the second feature/component such that the first feature/component and the second feature/component may not be in direct contact. In addition, the present disclosure may repeat reference numerals and/or letters in various embodiments. Such repetition is for simplicity and clarity and does not in itself indicate a relationship between the various embodiments and/or configurations discussed.

Further, for description convenience, spatially relative terms such as "below", "under", "lower", "above", "upper", "on", and the like, may be used in this disclosure to describe the relationship of one assembly or component with another assembly or component, as shown in the accompanying drawings. The spatially relative terms are not only used to depict the orientations in the accompanying drawings, but also intended to encompass different orientations of a device in use or operation. A device may be oriented in other ways (e.g., rotated 90 degrees or in other orientations), and the spatially relative terms used herein may be interpreted in a corresponding way similarly.

As used herein, terms such as "first," "second" and "third" describe various assemblies, components, regions, layers and/or sections, but such assemblies, components, regions, layers and/or sections shall not be limited by these terms. These terms are only used to distinguish one assembly, component, region, layer or section from the other one. Terms such as "first," "second" and "third", when used herein, do not imply a sequence or order unless otherwise indicated clearly by the context.

The singular forms "a," "a" and "the" may also include the plural forms unless otherwise dictated clearly by the context. The term "connect" along with its derivatives may be used herein to describe the structural relationship between components. "Connected" may be used to describe two or more components in direct physical or electrical contact with each other. "Connected" may also be used to indicate that two or more components are in direct or indirect (with intervening components between them) physical or electrical contact with each other, and/or that the two or more components cooperate or interact with each other.

FIG. 1 is a schematic cross-sectional view of an example semiconductor structure 100 in accordance with some embodiments of the present invention. As shown, the semiconductor structure 100 may be a power metal oxide semiconductor field effect transistor (MOSFET). The semiconductor structure 100 may include a substrate 102, an epitaxial layer 104, a protective layer 106, a plurality of channel adjustment regions 112, and a plurality of well regions 114, a plurality of heavily doped regions 116, a gate dielectric layer 122, a gate electrode 124, a source region 126A, a drain region 126B, a metal silicide region 130 and interconnect structure 140. In some embodiments, the channel adjustment regions 112 may also be referred to as a first doped region, the well regions 114 may also be referred to as a second doped region, and the heavily doped region 116 may be referred to as a third doped region.

The substrate 102 is a semiconductor substrate, such as a silicon carbide substrate. The epitaxial layer 104 may be disposed on the substrate 102. The epitaxial layer 104 may be composed of a single layer or multiple layers of silicon carbide, and may be used as a drift region of the power MOSFET. The channel adjustment regions 112, the well regions 114, the heavily doped regions 116, the source region 126A and the drain region 126B may be respectively provided in the epitaxial layer 104, and can be formed by ion implantation. The gate dielectric layer 122, the gate electrode 124, the metal silicide region 130 and the interconnection structure 140 may be respectively disposed above the epitaxial layer 104.

In some embodiments, the channel adjustment regions 112 may extend downwardly from the top surface of the epitaxial layer 104 (away from the surface of the substrate 102) by a first depth D1. The well regions 114 may extend downwardly from the top surface of the epitaxial layer 104 by a second depth D2. The heavily doped region 116 may extend downward from the top surface of the epitaxial layer 104 by a third depth D3. The first depth D1 is smaller than the second depth D2, and the third depth D3 is larger than the first depth D1 and smaller than the second depth D2. In addition, the source region 126A and the drain region 126B may, for example, extend downwardly from the top surface of the epitaxial layer 104, by a depth that is equal to or slightly less than the third depth D3.

The well regions 114 in the semiconductor structure 100 are separated from each other in the first direction X, and each heavily doped region 116 is surrounded by one well region 114. The well regions 114 include impurities of a first conductivity type, and the heavily doped regions 116 include impurities of a second conductivity type. The second conductivity type is different from the first conductivity type. In some embodiments, the first conductivity type is P-type and the second conductivity type is N-type. The heavily doped regions 116 may have a higher doping concentration than the well regions 114.

The well regions 114 may be separated from each other by a first pitch distance P1 along the first direction X. The heavily doped regions 116 may be separated from each other by a second pitch distance P2 along the first direction X. The second pitch distance P2 is greater than the first pitch distance P1. In some embodiments, the well regions 114 and the heavily doped regions 116 are in U-shapes when viewed in the cross-sectional view (i.e., the X-Z direction). The distance from the left edge of a heavily doped region 116 to the left edge of a well region 114 is approximately equal to the distance from the right edge of the heavily doped region 116 to the right edge of the well region 114.

Each well region 114 also surrounds at least one channel adjustment region 112. The channel adjustment regions 112 may extend inwardly from edges of the well regions 114 into the heavily doped regions 116, to partially overlap the well regions 114 and the heavily doped region s116. The channel adjustment regions 112 may have a rectangular cross section or a rounded rectangular cross section (in the −Z direction). In some embodiments, the impurities in the channel adjustment regions 112 may be selected from the nitrogen group (e.g., nitrogen, phosphorus, and so on), the boron group (e.g., boron, aluminum, and so on), or boron difluoride. The channel adjustment regions 112 may have a doping concentration of $1 \times 10^{13}$ cm$^{-2}$ to $1 \times 10^{15}$ cm$^{-2}$.

The protective layer 106 covers the top surface of epitaxial layer 104. For example, the protective layer 106 is a silicon-containing layer. The gate dielectric layer 122 is disposed between the protective layer 106 and the gate electrode 124. The gate dielectric layer 122 and the gate electrode 124 disposed above the protective layer 106 may continuously extend from an approximately middle position of one heavily doped region 116 to an approximately middle position of another neighbor heavily doped region 116. The gate dielectric layer 122 may be made of silicon oxide ($Si_xO_y$, e.g., $SiO_2$), silicon nitride ($Si_xN_y$, e.g., $Si_3N_4$), silicon oxynitride ($SiO_xN_y$), or other dielectric materials. In some embodiments, the gate dielectric layer 122 may have a thickness ranging from about 10 angstroms (Å) to about 1000 angstroms. The gate electrode 124 may include polysilicon or metal.

The source region 126A and the drain region 126B may be disposed in the epitaxial layer 104 at opposite ends of the gate electrode 124. There is a fourth pitch distance P4 between an edge of the source region 126A and an edge of the gate dielectric layer 122 or the gate electrode 124. There is also the fourth pitch distance P4 between an edge of the drain region 126B and another edge of the gate dielectric layer 122 or the gate electrode 124. The source region 126A may partially overlap a well region 114 and a heavily doped region 116 on the left side of the gate electrode 124, and the drain region 126B may partially overlap a well region 114 and a heavily doped region 116 on the right side of the gate electrode 124. In some embodiments, the source region 126A may extend outward into a well region 114 and a heavily doped region 116 that are located on the far left side of FIG. 1 and that do not overlap the gate dielectric layer 122 and/or the gate electrode 124. The drain region 126B may extend outward into a well region 114 and a heavily doped region 116 that are located on the far right side of FIG. 1 and that do not overlap the gate dielectric layer 122 and/or the gate electrode 124.

The metal silicide region 130 may be formed in the protective layer 106 and may contact the source region 126A and the drain region 126B. The metal silicide region 130 is mainly used to reduce the contact resistance between the source region 126A and the interconnection structure 140, and between the drain region 126B and the interconnection structure 140. In some embodiments, the metal silicide region 130 may be formed in a region of the source region 126A and the drain region 126B that does not overlap the channel adjustment region 112, the well regions 114 and the heavily doped regions 116. The metal silicide region 130 may include nickel silicide ($Ni_xSi_y$), cobalt silicide ($Co_xSi_y$), titanium silicide ($Ti_xSi_y$), or aluminum silicon carbide (Al-SiC). The thickness of metal silicide region 130 may range from about 10 angstroms to about 10,000 angstroms.

The interconnect structure 140 may be disposed above the protective layer 106, the gate electrode 124 and the metal silicide regions 130, and may include an interlayer dielectric layer 142 and a plurality of conductive features 146. In some embodiments, the interlayer dielectric layer 142 may cover the protective layer 106, the metal silicide region 130, and the gate electrode 124. In addition to being disposed in the interlayer dielectric layer 142, the conductive features 146 may also be disposed above the interlayer dielectric 142. The conductive features 146 are used for physical and electrical contact with the metal silicide region 130 and the gate electrode 124. The conductive features 146 may have a thickness between about 1 micron and about 10 microns.

The conductive features 146 may include contact plugs 1462 and wires 1464. The contact plugs 1462 are located in the interlayer dielectric layer 142, and are in physical contact with the metal silicide region 130 above the source region 126A, in physical contact with the metal silicide region 130 above the drain region 126B, or in physical contact with the gate electrode 124. The wires 1464 may be disposed above the interlayer dielectric layer 142 and the contact plugs 1462, and in physical contact with the contact plugs 1462. There may be electrical isolation between conductive features 146 contacting the gate electrode 124 and conductive features 146 contacting the metal silicide regions 130. While only one interlayer dielectric layer 142 and one layer of the conductive features 146 are shown in FIG. 1, the interconnect structure 140 may include multiple interlayer dielectric layers 142 and multiple layers of the conductive features 146.

In some embodiments, the contact plugs 1462 and the wires 1464 may be formed from the same metallic material, such as copper, aluminum, or aluminum-copper alloy. The contact plugs 1462 and the wires 1464 may be integrally formed, as an example. For example, a deposition process may be used to form a metallic material in and above the interlayer dielectric layer 142, and then a patterning process may be performed to pattern the metallic material above the interlayer dielectric layer 142 to form the conductive features 146. The patterning process may include suitable photolithography processes and etching processes. The contact plugs 1462 and the conductive wires 1464 may be formed in the interlayer dielectric layer 142 by use of a dual damascene process, as an example.

In some embodiments, the contact plugs 1462 and the wires 1464 may be formed from different metal materials. For example, the contact plugs 1462 may be formed using tungsten, and the wires 1464 may be formed using copper, aluminum, or aluminum-copper alloy. The contact plugs 1462 may be formed using a single damascene process, and the conductive wires 1464 may be formed using a deposition process and a patterning process.

The interconnect structure 140 may optionally include one or more diffusion barrier layers 144 disposed at least between the interlayer dielectric layer 142 and the conductive features 146, for preventing the metallic material (e.g., copper) of the conductive features 146 from diffusing into the interlayer dielectric layer 142. The diffusion barrier layers 144 may further be disposed between the metal silicide region 130 and the conductive features 146 and between the gate electrode 124 and the conductive features 146, to completely surround conductive feature 146, thereby reducing manufacturing complexity. In some embodiments, a thin seed layer (not shown) may be formed between the diffusion barrier layers 144 and the conductive features 146. The seed layer may include copper or copper alloys, and may also include metals such as tungsten, silver, gold, aluminum, or any combination thereof.

The channel region of the semiconductor structure 100 is formed between the source region 126A and the drain region 126B. The channel adjustment region 112 is provided in the channel region and may be used to adjust the doping concentration distribution in the channel region, thereby changing the channel resistance value of the semiconductor structure 100. therefore, the semiconductor structure 100 can accurately control the threshold voltage in high-speed, low-power consumption or depletion mode operations.

Figure 2:
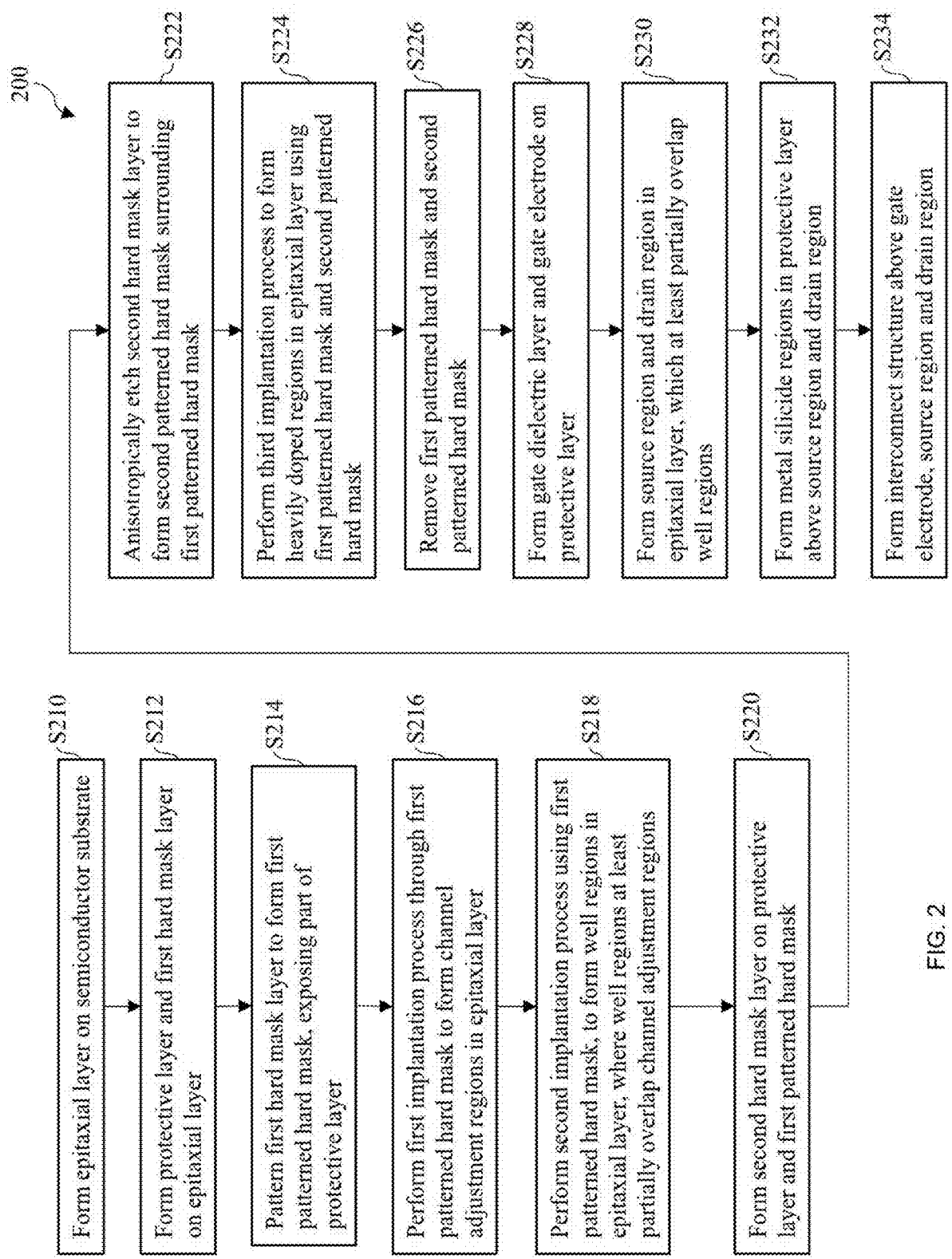
FIG. 2 is a flowchart of a method of fabricating a semiconductor structure according to some embodiments of the present disclosure.

FIG. 2 is a flowchart of an example method 200 for manufacturing the semiconductor structure 100 in accordance with some embodiments of the present disclosure. The method 200 is an example only, and is not intended to limit the disclosure beyond what is expressly recited in the claims. Additional steps may be provided before, between, and after the method 200, and some of the steps described may be moved, replaced, or omitted for additional embodiments of the method 200. The method 200 will be described below in conjunction with further figures showing schematic cross-sectional views during various intermediate steps of the method 200.

Figure 3:
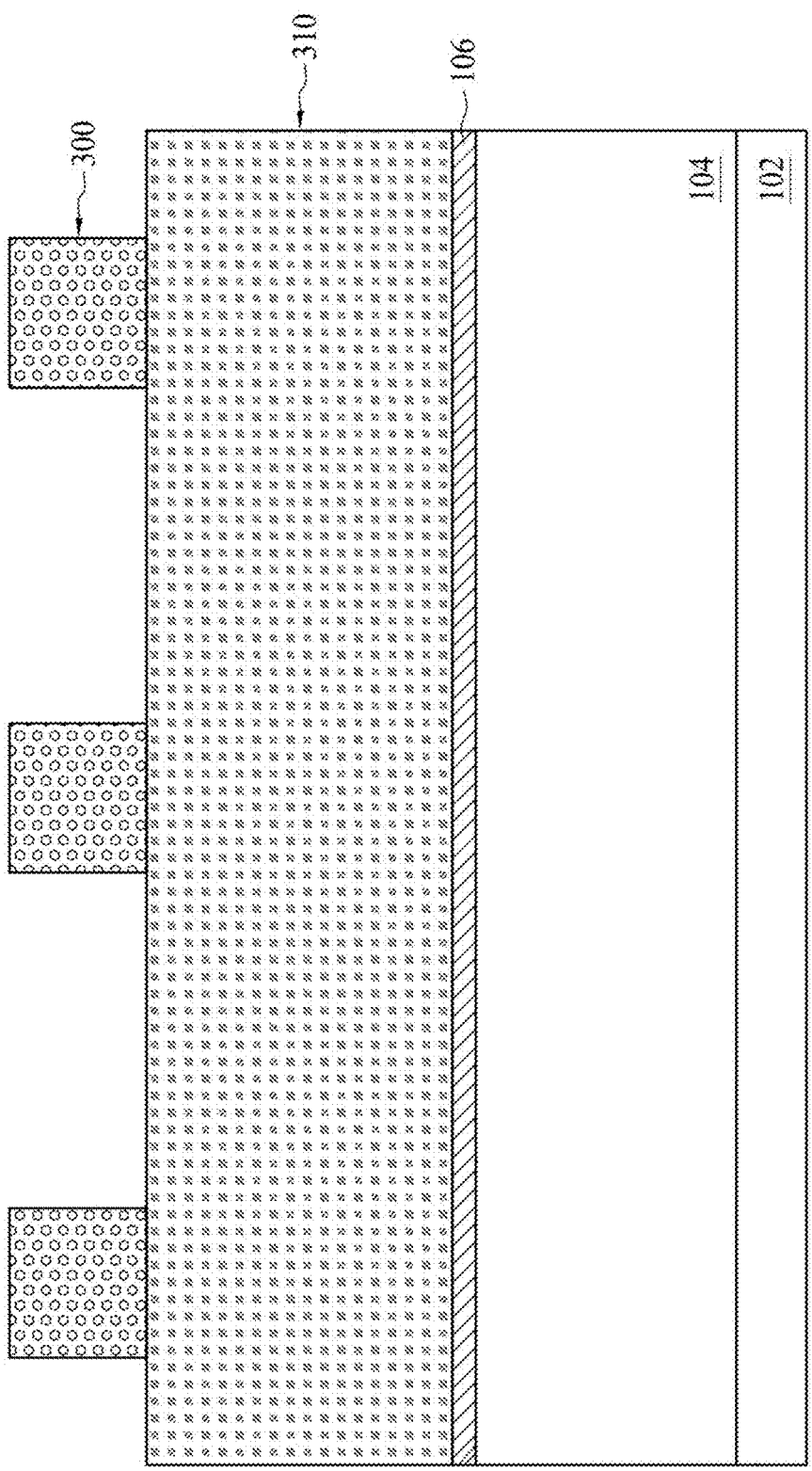
FIG. 3 to FIG. 5 are schematic cross-sectional views illustrating various intermediate steps in a fabrication process of a semiconductor structure according to some embodiments of the present disclosure.

Referring to FIG. 2 and FIG. 3, the method 200 begins with step S210, which includes forming the epitaxial layer 104 on the semiconductor substrate 102. The substrate 102 may, for example, includes a semiconductor material. In some embodiments, the substrate 102 may be a doped or undoped semiconductor substrate. The semiconductor material of the substrate 102 may include silicon, germanium, or compound semiconductors (e.g., silicon carbide).

The epitaxial layer 104 is a semiconductor layer. In some embodiments, the epitaxial layer 104 may include silicon carbide, for example. The epitaxial layer 104 can be used to tune performance. For example, the breakdown voltage can be increased by increasing the channel length using vertical dimensions. Increasing the thickness of the epitaxial layer 104 may increase the breakdown voltage, while decreasing the thickness of the epitaxial layer 104 may decrease the breakdown voltage. The epitaxial layer 104 may be formed using an epitaxial process, as an example. For example, the epitaxial process may include chemical vapor deposition (CVD), molecular beam epitaxy (MBE) and/or other suitable processes. The epitaxial layer 104 may be a doped or undoped semiconductor layer. When the epitaxial layer 104 is a doped semiconductor layer, a blanket implant may be performed to form a lightly doped layer (not shown) in the epitaxial layer 104. The lightly doped layer may, for example, have a different conductivity type than the epitaxial layer 104, in order to adjust the epitaxial profile without affecting the conductivity type of the epitaxial layer 104. For example, the epitaxial layer 104 may have an N-type conductivity type, and the lightly doped layer may have a P-type conductivity type. In some embodiments, the substrate 102 may have the same conductivity type as the epitaxial layer 104.

In step S212, the protective layer 106 and a first hard mask layer 310 are formed on the epitaxial layer 104. The protective layer 106 may be a dielectric layer. The protective layer 106 may be formed from a low-k dielectric material, such as silicon dioxide ($SiO_2$). For example, the protective layer 106 may be deposited on the epitaxial layer 104 using a spin-on coating process, a chemical vapor deposition process, a plasma enhanced chemical vapor deposition (PECVD) process, a low pressure chemical vapor deposition (low pressure CVD) process, or a thermal oxidation process. In addition, the protective layer 106 may be formed of different applicable materials, such as extremely low-k (ELK) dielectric, polymers (such as polyimide), or any combination thereof.

The first hard mask layer 310 may have a single-layer structure. In some embodiments, the thickness of the first hard mask layer 310 may be no less than 3 micrometers (μm). The first hard mask layer 310 may be formed of a dielectric material, which may include silicon oxide, silicon nitride, silicon oxynitride, hafnium dioxide ($HfO_2$), zirconium dioxide ($ZrO_2$), aluminum oxide ($Al_2O_3$). However, the present disclosure is not limited thereto. In some embodiments, the first hard mask layer 310 may include a semiconductor material, such as silicon. The first hard mask layer 310 may be formed by use of an applicable process, such as a rotation coating process, a chemical vapor deposition process, a sputtering process, a physical vapor deposition (PVD) process, an atomic layer deposition (ALD) process, and/or other applicable processes. An appropriate etching selectivity ratio may be used between the protective layer 106 and the first hard mask layer 310. Therefore, the protective layer 106 may function as an etching stop layer, so that subsequent processes can be well controlled.

In some embodiments, a photoresist layer (not shown) may be disposed above the first hard mask layer 310. The photoresist layer may include a photosensitive material that may be patterned by radiation. In some embodiments, the photoresist layer may be applied to the surface of the first hard mask layer 310, e.g., by use of spin coating. Then an exposure process may be performed to expose a portion of the photoresist layer to radiant energy, such as ultraviolet (UV), deep ultraviolet (DUV) or extreme ultraviolet (EUV). Because the photoresist layer is sensitive to radiant energy, chemical changes occur in the portion of the photoresist layer that is exposed to the radiant energy. Thereafter, a development process may be performed to such that, the portion of the photoresist layer exposed to the radiant energy, or a portion of the photoresist layer not exposed to the radiant energy, dissolves (depending on whether a positive or negative resist is used in the photoresist layer), thereby forming a patterned photoresist layer 300 to expose portions of the first hard mask layer 310.

Figure 4:
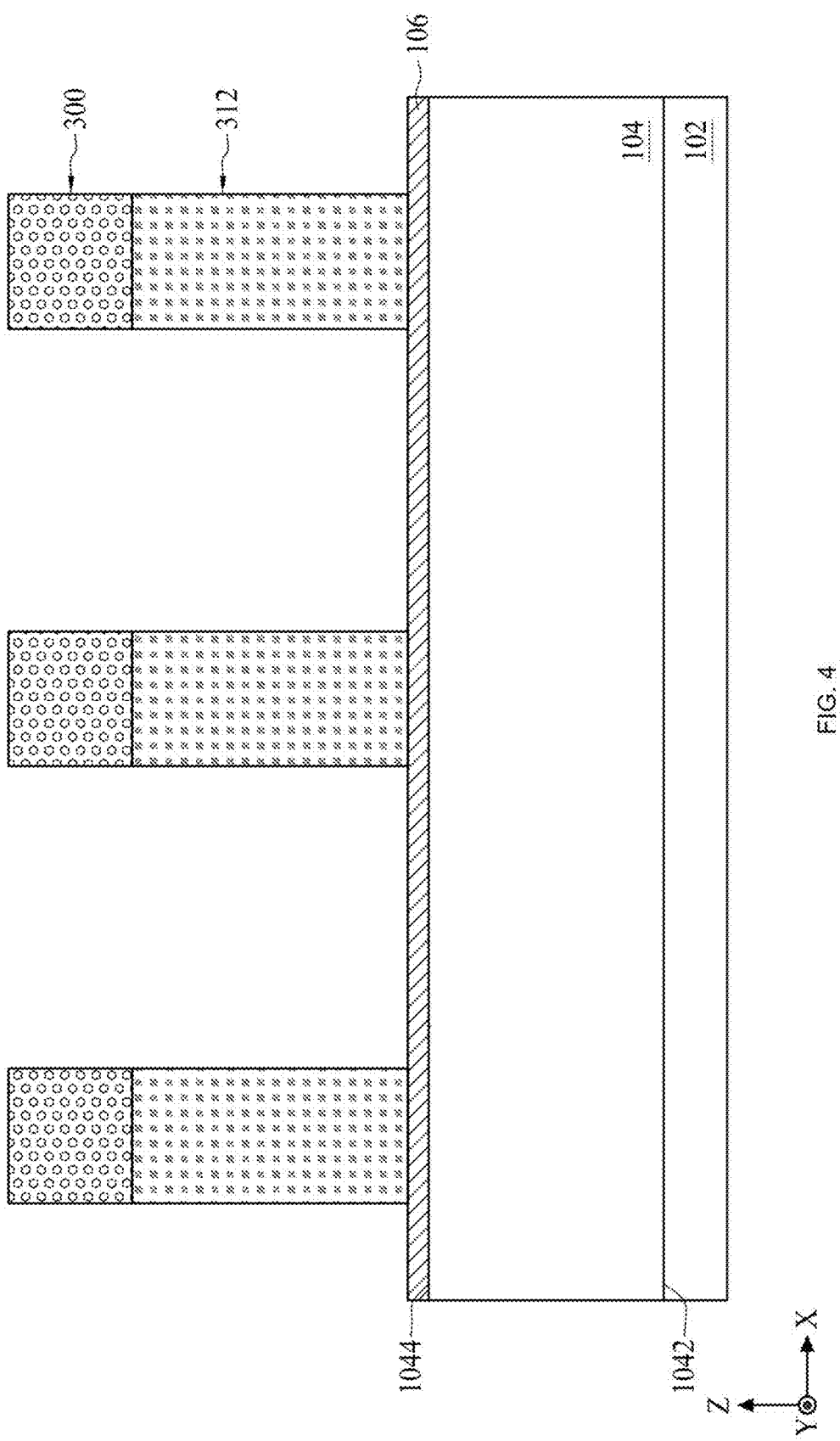
Figure 5:
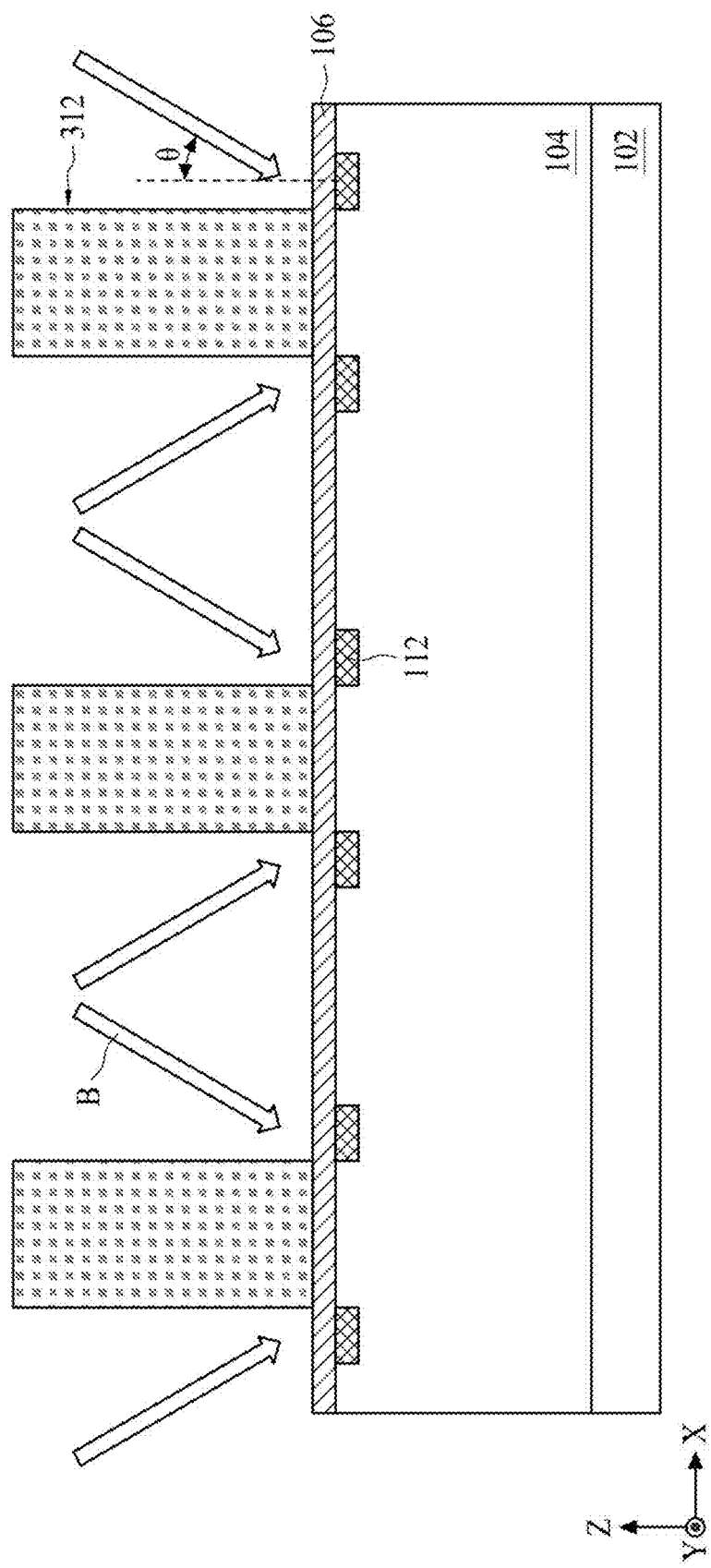

Referring to FIG. 2 to FIG. 4, in step S214, the patterned photoresist layer 300 is used as an etching mask to remove the exposed portions of the first hard mask layer 310, to form a first patterned hard mask 312. In some embodiments, the first patterned hard mask 312 exposing the patterned photoresist layer 300 may be removed by use of an etching process until the protective layer 106 is reached and exposed. The etching process may include performing a wet etching process, a dry etching process, another suitable etching process, or any combination of the foregoing processes. Subsequently, the patterned photoresist layer 300 is removed, for example, in an ashing or stripping process.

Referring to FIG. 2 to FIG. 5, in step S216, a first implantation process is performed through the first patterned hard mask 312, to form the channel adjustment regions 112 in the epitaxial layer 104. Impurities may be introduced into the epitaxial layer 104 by performing one or more first implant processes, thereby forming the plurality of channel adjustment regions 112 separated from each other in the first direction X. The first implantation process uses the first patterned hard mask 312 as a shielding layer to inject specific impurity atoms into a designated area of the epitaxial layer 104 in an ion acceleration manner, to change the conductive characteristics of the designated area, thereby achieving the effect of adjusting the performance of the semiconductor structure 100. In this embodiment, the channel adjustment regions 112 may be formed in the epitaxial layer 104 on two sides of the bottom of the first patterned hard mask 312, and may be used to modulate the resistance value of the channel of the semiconductor structure 100. The aforementioned specific impurity atoms may be selected from the nitrogen group (e.g., nitrogen, phosphorus, and so on), the boron group (e.g., boron, aluminum, and so on), or boron difluoride.

The first implantation process may be performed at room temperature (for example, approximately 25 degrees Celsius), or the first implantation process may be a hot implantation process. Using the hot implantation process to implant impurities helps reduce damage to the epitaxial layer 104 by implanted ions. The precise positioning of doping impurities is an important factor in ensuring a generally optimal operation of the semiconductor structure 100. In some embodiments, the impurity implantation may be performed by tilting an ion beam B relative to the direction of the epitaxial layer 104, and may be performed repeatedly by rotating the substrate 102 and the epitaxial layer 104.

Figure 6:
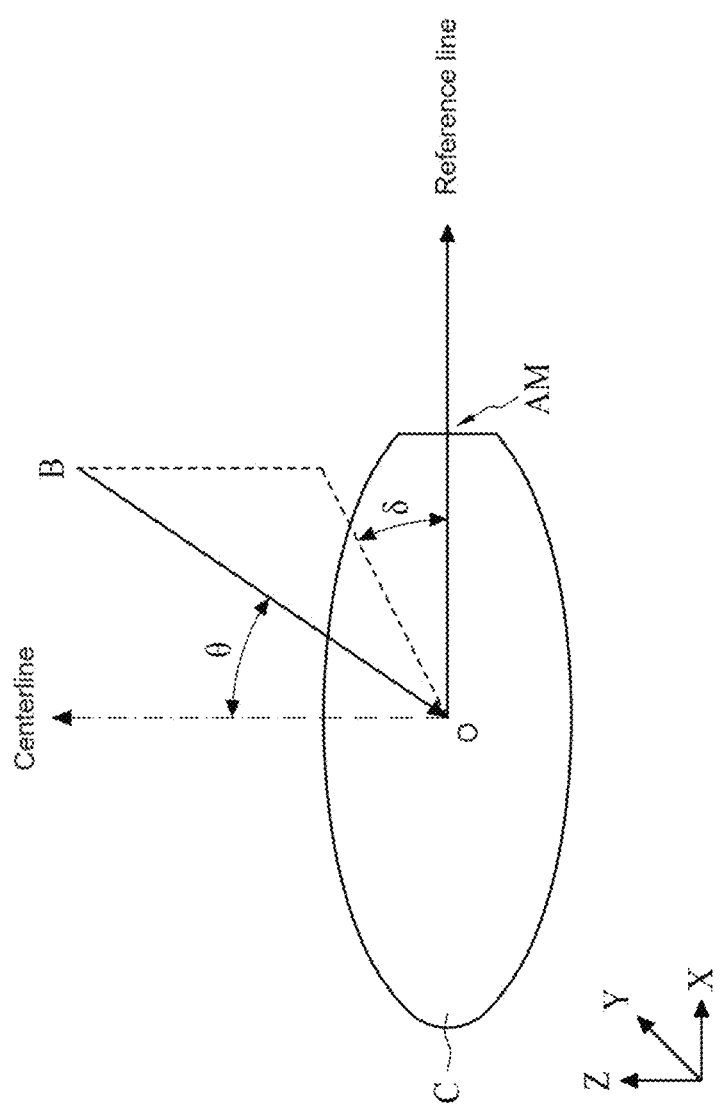
FIG. 6 is a schematic diagram showing an injection tilt angle and a twist angle according to the present disclosure.

Referring to FIG. 6, the first implantation process may be performed at least at an implantation tilt angle θ. For example, the ion beam B is generated by an ion implanter (not shown), and is tiled at a specific angle with respect to the normal line (i.e., the z-axis in this embodiment) of a chip processing surface (e.g., the top surface of the epitaxial layer 104), at which the impurity atoms are implanted into an appropriate position in the epitaxial layer 104. The implantation tilt angle θ is the angle formed between the aforementioned normal line and the ion beam B. The difference in the implantation tilt angles θ will cause the ion implantation depth to change, and thus affect the electrical parameters of the semiconductor structure. In some embodiments, the implantation tilt angle θ may range from 0 degrees to about 45 degrees.

In some embodiments, the first implantation process may also include using a twist angle δ. For example, a reference line may be formed by connecting an initial position of an alignment mark AM that is on the edge of a semiconductor chip C and the center O of the semiconductor chip C. By rotating the wafer (the semiconductor chip C) with a centerline of the semiconductor chip C as the rotating axis, the position of the ion beam implanting into the epitaxial layer 104 may be adjusted. The centerline is perpendicular to the surface of the semiconductor chip C and passes through the center O of the semiconductor chip C. The twist angle δ is the angle formed between the aforementioned reference line and a projection line (shown as a dotted line) of the ion beam B projected on the semiconductor chip C. The twist angle δ may range from 0 degrees to 360 degrees. The semiconductor chip C may rotate in a clockwise direction or in a counterclockwise direction. Control of the implantation tilt angle θ and the twist angle δ may allow a sufficient dose of impurities to be implanted into an appropriate location in the epitaxial layer 104.

Figure 7:
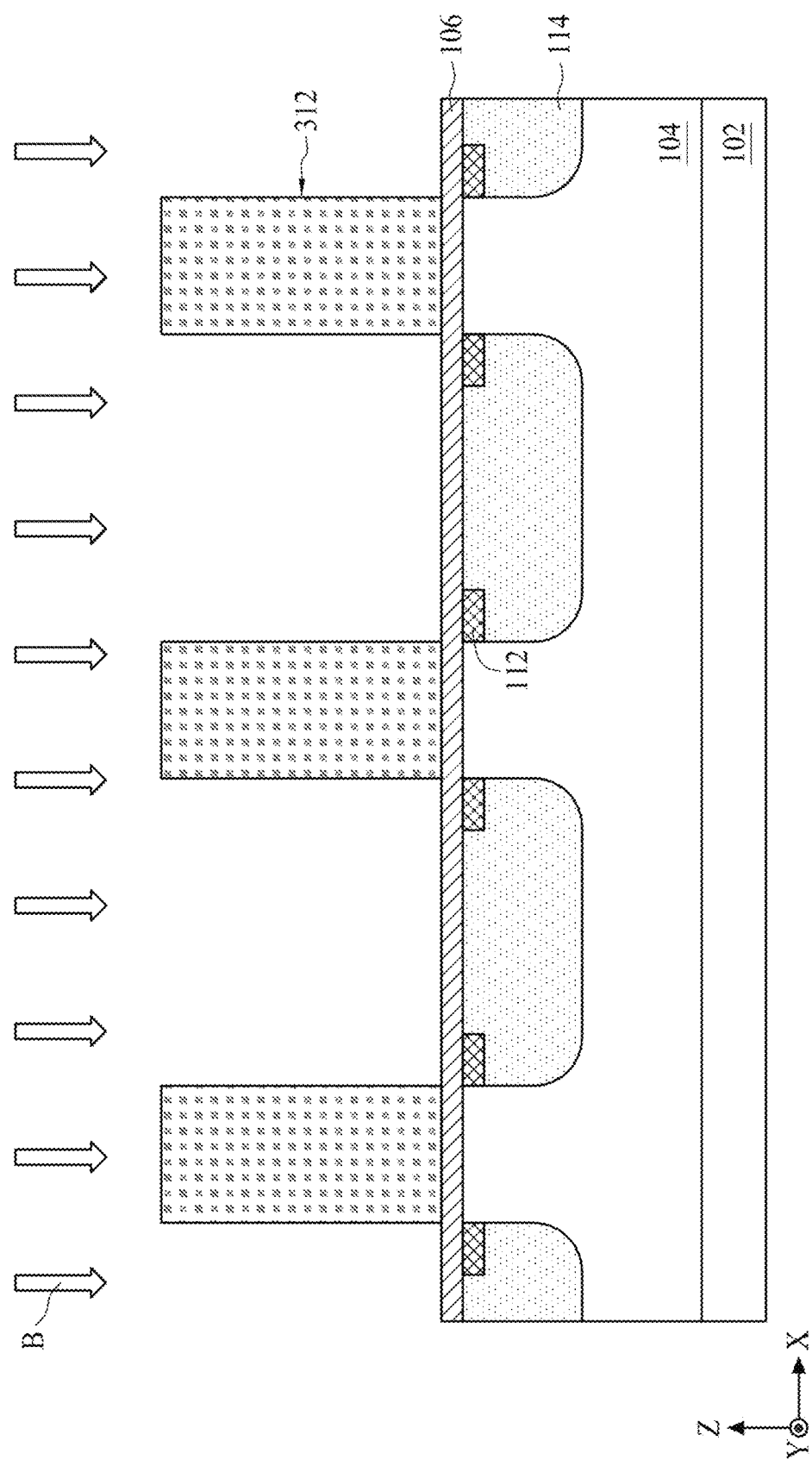
FIG. 7 to FIG. 12 are schematic cross-sectional views illustrating various intermediate steps in fabrication process of a semiconductor structure according to some embodiments of the present disclosure.

Referring to FIG. 2 and FIG. 7, in step S218, a second implantation process may be performed using the first patterned hard mask 312 as a shielding layer, to form the plurality of well regions 114 in the epitaxial layer 106. In some embodiments, the plurality of well regions 114 are separated from each other in the first direction X. The channel adjustment regions 112 are located above the well regions 114. Each well region 114 may at least partially overlap two channel adjustment regions 112. In some embodiments, each well region 114 may surround two channel adjustment regions 112. The second implantation process may implant impurities of the first conductivity type into the epitaxial layer 104 through an implantation tilt angle θ of approximately 0 degree. In some embodiments, the first conductivity type is P-type.

Figure 8:
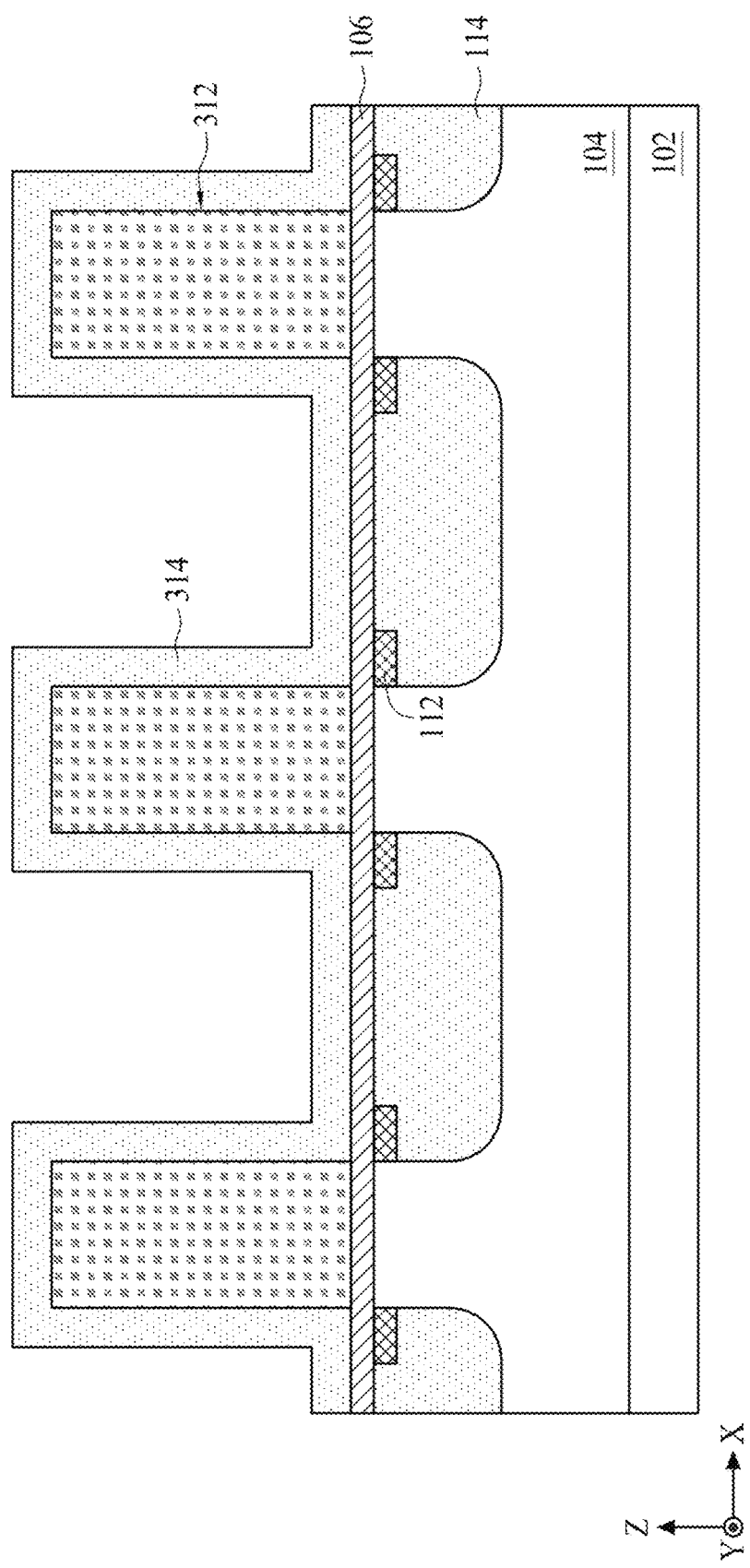

Referring to FIG. 2 and FIG. 8, in step S220, a second hard mask layer 314 may be formed on the protective layer 106 and the first patterned hard mask 312. The thickness of the second hard mask layer 314 is less than the thickness of the first hard mask layer 312. The second hard mask layer 314 is substantially conformal to the shape of the protective layer 106 and the first hard mask layer 312. The term "conformal" as used herein means that the horizontal portion of the second hard mask layer 314 (i.e., the portion extending in the first direction X) is substantially parallel to the protective layer 106 and the top surface of the first hard mask layer 312, and the vertical portion of the second hard mask layer 314 (i.e., the portion extending in the second direction Y) is substantially parallel to the side surface of the first hard mask layer 312. The first hard mask layer 312 and the second hard mask layer 314 have different material compositions, and an appropriate etching selectivity ratio may be used between the first hard mask layer 312 and the second hard mask layer 314. The second hard mask layer 314 may be formed of a dielectric material or a semiconductor material through a chemical vapor deposition process, as an example. The dielectric material may include silicon oxide, silicon nitride, silicon oxynitride, hafnium dioxide, zirconium dioxide, aluminum oxide, and so on, as described above. The semiconductor material may be silicon, for example. There is an appropriate etching selectivity ratio between the protective layer 106 and the second hard mask layer 314. Therefore, the protective layer 106 can function as an etching stop layer, so that the subsequent process can be well controlled.

Figure 9:
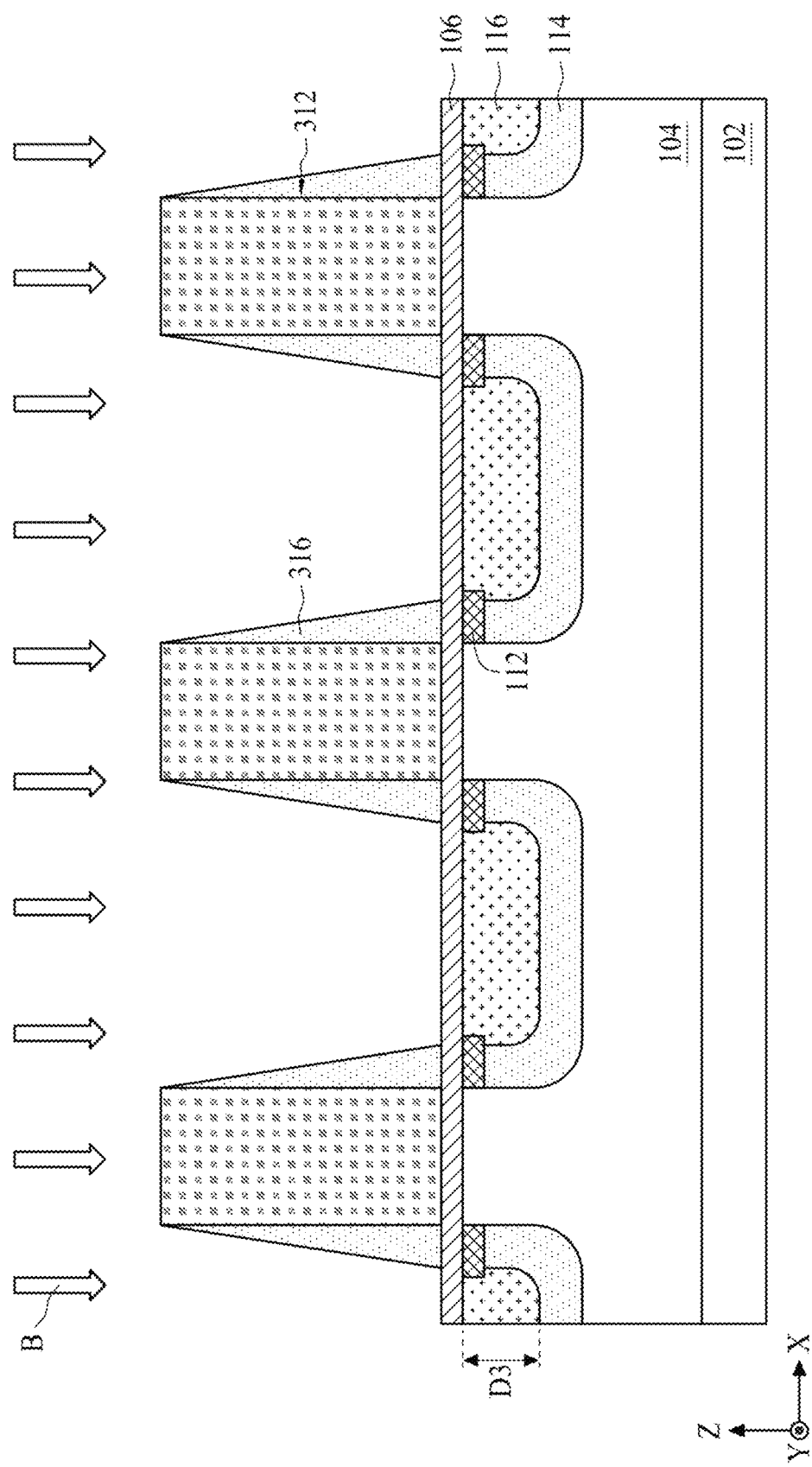

Referring to FIG. 2 and FIG. 9, in step S222, the second hard mask layer 314 may be anisotropically etched to form a second patterned hard mask 316 surrounding the first patterned hard mask 312. Anisotropic etching can remove a portion of the second hard mask layer 314 (i.e., the horizontal portion of the second hard mask layer 314) that is located on the top surface of the protective layer 106 and the top surface of the first patterned hard mask 312, and keep a portion of the second hard mask layer 314 (i.e., the vertical portion of the second hard mask layer 314) located on the sides of the first patterned hard mask 312 as the second patterned hard mask 316. In some embodiments, the second patterned hard mask 316 has an outer shape that gradually becomes narrower from one end. For example, the width of the lower portion of the second patterned hard mask 316 that contacts the protective layer 106 is greater than the width of the upper portion of the second patterned hard mask 316 that is away from the protective layer 106.

In step S224, a third implantation process may be performed from the heavily doped regions 116 in the epitaxial layer 104 by using the first patterned hard mask 312 and the second patterned hard mask 316 as shielding layers. The third implantation process is used to introduce impurities of a second conductivity type into the well regions 114, thereby forming the heavily doped regions 116 that are surrounded by the well regions 114 and that partially overlap the channel adjustment regions 112. The second conductivity type is different from the first conductivity type, and may be, for example, N-type. In some embodiments, the third implantation process implants impurities into the epitaxial layer 104 through an implantation tilt angle θ of approximately 0 degree.

In step S226, the first patterned hard mask 312 and the second patterned hard mask 316 are removed. In some embodiments, the first patterned hard mask 312 and the second patterned hard mask 316 are removed using a suitable process such as multiple wet etching processes. The protective layer 106 may have a sufficient etch selectivity relative to the first patterned hard mask 312 and the second patterned hard mask 316, and can be used as an etch stop layer. That is, removing the first patterned hard mask 312 and the second patterned hard mask 316 using the etching process does not remove the protective layer 106.

A dielectric layer (not shown) may then be deposited on the protective layer 106 by use of, for example, a chemical vapor deposition process or a spin coating process, and a conductive layer (not shown) may be deposited, e.g., using a chemical vapor deposition process, or sputtered on the dielectric layer. The dielectric layer may basically cover the entire surface of the protective layer 106, and the conductive layer may basically cover the entire surface of the dielectric layer. The dielectric layer may be formed of silicon oxide, silicon nitride, silicon oxynitride or other dielectric materials. The conductive layer may be formed of polysilicon or metal materials.

Figure 10:
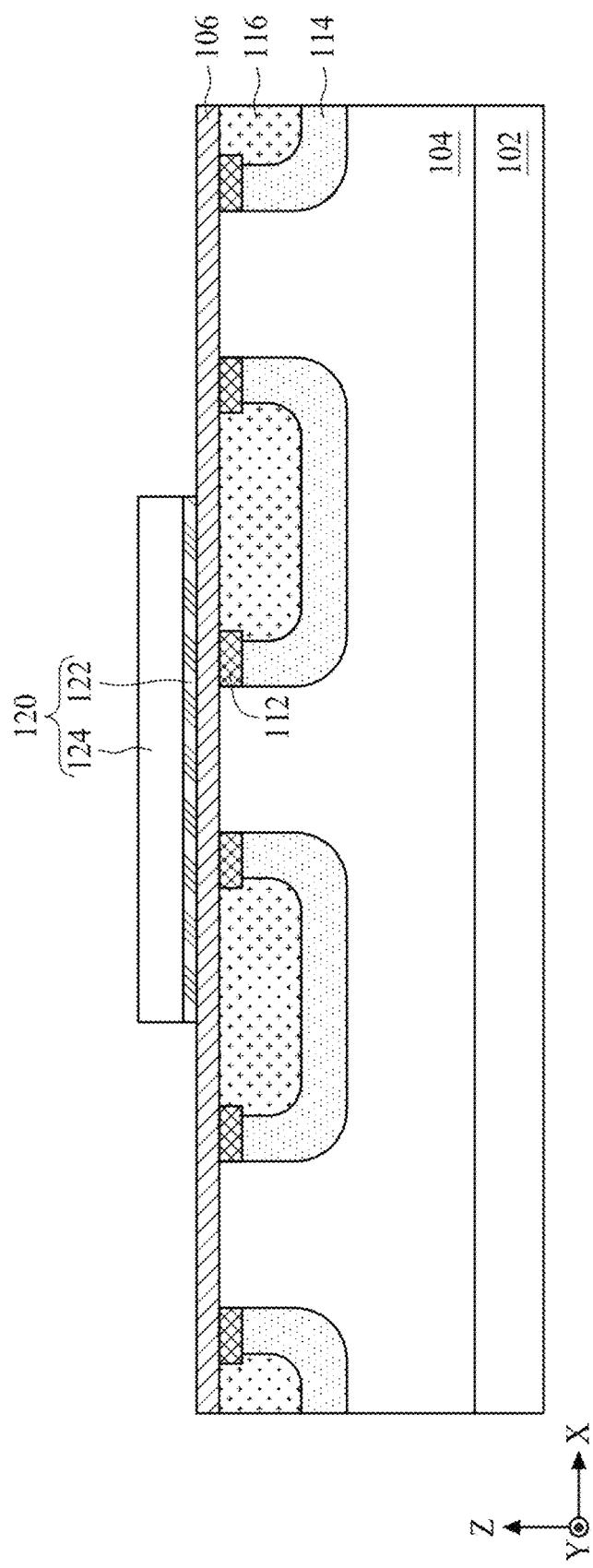

Then, the dielectric layer and the conductive layer may be patterned to form the gate structure 120 as shown in FIG. 10, where the gate structure 120 includes the gate dielectric layer 122 and the gate electrode 124 sequentially formed on the protective layer 106 (step S228). In some embodiments, an etching process may be performed to the dielectric layer and the conductive layer to form the gate structure 120, using a soft mask formed by a photolithography process (e.g., patterned photoresist) or a hard mask formed of a dielectric material (e.g., silicon nitride) as an etch mask. The gate structure 120 may continuously extend from a first position on the protective layer 106 to a second position on the protective layer 106. The first position is substantially above a middle of a heavily doped regions 116, and the second position is substantially above a middle of an adjacent heavily doped region 116.

Figure 11:
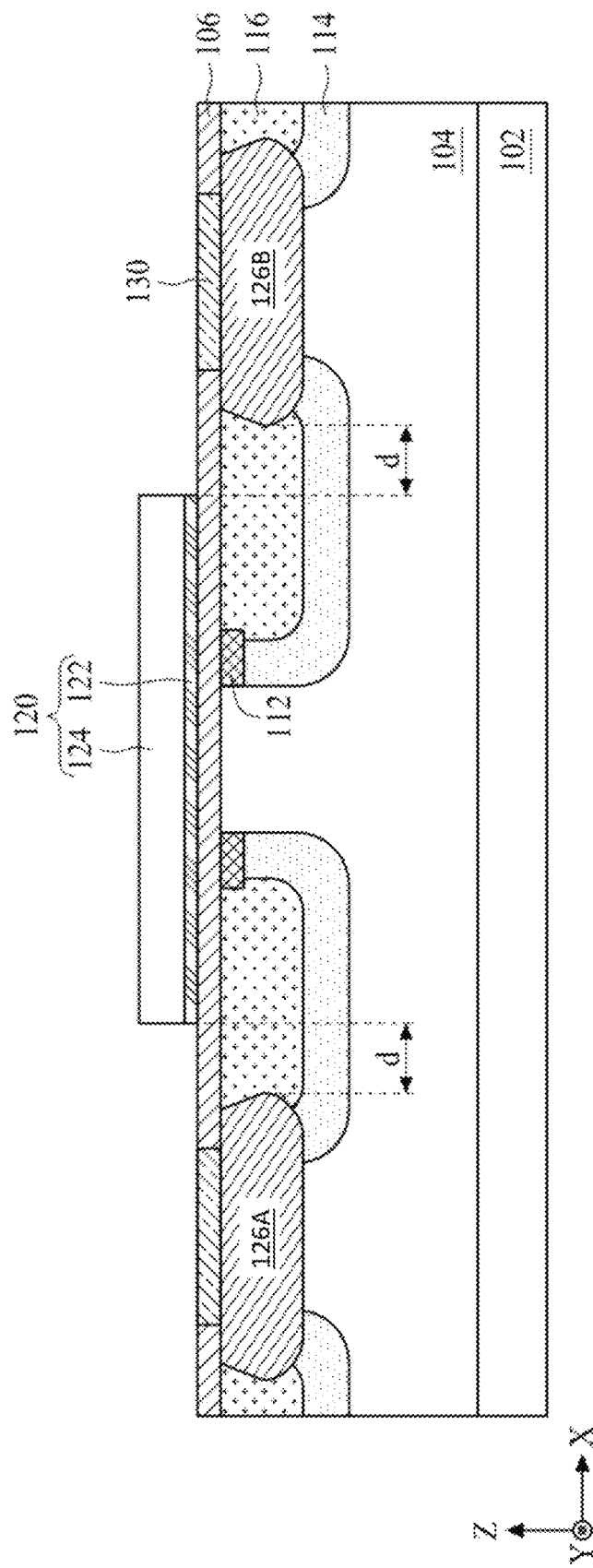

Referring to FIG. 2 and FIG. 11, in step S230, a source region 126A and a drain region 126B are formed in the epitaxial layer 114. In some embodiments, one or more ion implantations may be performed using a patterned photoresist as an implantation mask to introduce dopants into the epitaxial layer 114, to form the source region 126A and the drain region 126B. The source region 126A and the drain region 126B are located at opposite sides of the gate structure 120, and the source region 126A and the drain region 126B may be spaced apart from the gate structure 120 by a distance d. The source region 126A and the drain region 126B may extend into heavily doped regions 116 that at least partially overlap the gate structure 120.

In step S232, the metal silicide regions 130 may be formed in the protective layer 106 above the source region 126A and the drain region 126B. The metal silicide regions 130 may extend through the protective layer 106 and end on the top surface of the epitaxial layer 104. In some embodiments, one or more thin metal layers (not shown) may be deposited on the protective layer 106 at specific locations (for example, positions where the source region 126A and the drain region 126B do not overlap the channel adjustment regions 112, the well regions 114 and the heavily doped region), and then are tempered such that reaction occurs between the thin metal layer and the silicon in the protective layer 106 to form the metal silicide regions 130 in the protective layer 106. The thin metal layer may include a barrier metal layer, such as nickel (Ni), cobalt (Co), titanium (Ti), titanium nitride (TiN), tantalum nitride (TaN), and so on, and any combination thereof. The thin metal layer may also include metal carbides such as aluminum carbide (Al). The protective layer 106 is mainly used to form the metal silicide regions 130. Therefore, in some embodiments, after forming the metal silicide regions 130, an etching process may be performed to remove the remaining protective layer 106.

Figure 12:
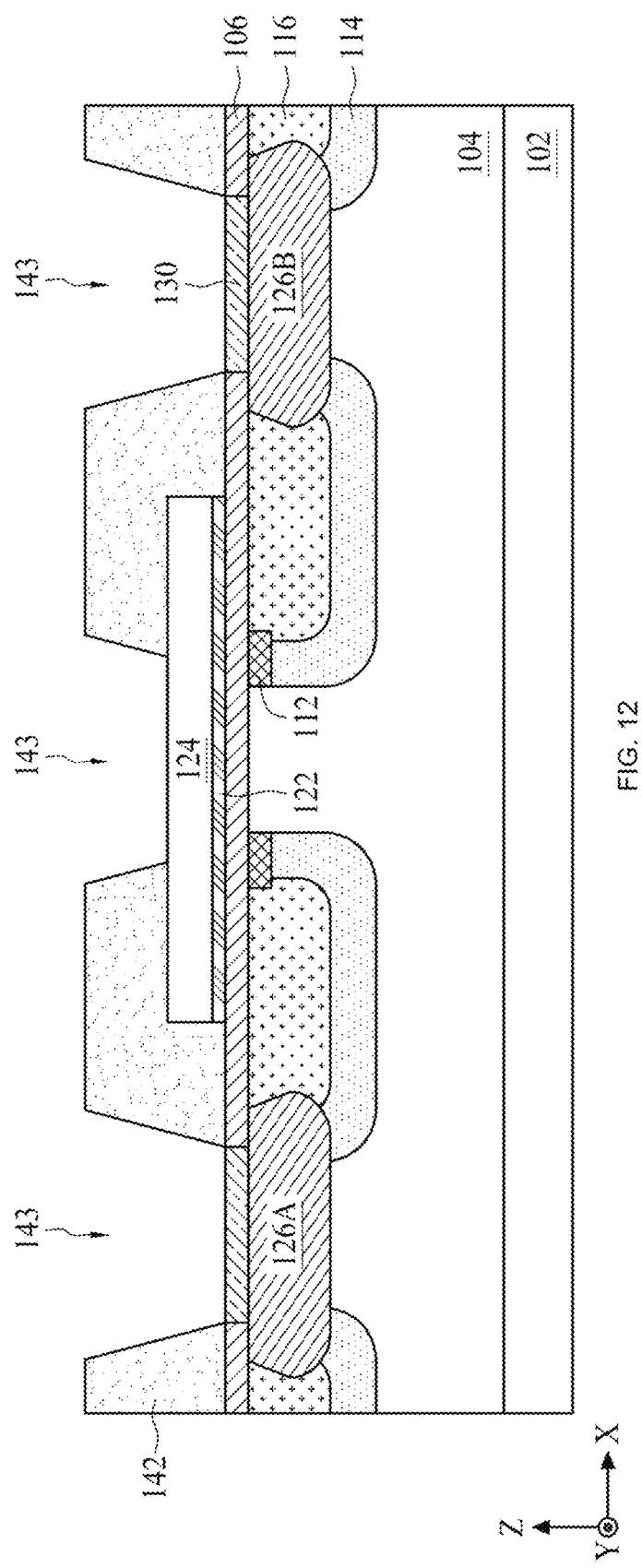

Referring to FIG. 2, the method 200 proceeds to step S234 to form the interconnect structure 140 above the gate electrode 124, the source region 126A and the drain region 126B. Referring now to FIG. 12, after the metal silicide region 130 is formed, an interlayer dielectric layer 142 may be formed above the protective layer 106, the gate electrode 124 and the metal silicide regions 130 using, for example, a chemical vapor deposition process or other suitable processes (e.g., a spin coating process). The interlayer dielectric layer 142 may include dielectric materials including silicon dioxide, silicon nitride, low-K dielectric materials, or any combination thereof. Thereafter, a chemical-mechanical planarization (CMP) process may be performed to planarize the surface of the interlayer dielectric layer 142. The interlayer dielectric layer 142 may have a thickness between about 50 Angstroms and about 30,000 Angstroms.

Contact holes 143 may then be formed in the interlayer dielectric layer 142. Formation of the contact hole 143 may include etching the interlayer dielectric layer 142 so that the gate electrode 124 and the metal silicide regions 130 are exposed in the contact holes 143. The contact hole 143 may be configured to be aligned with the metal silicide regions 130. In some embodiments, the contact holes 143 may have an outer shape that is wider at the top and narrower at the bottom. The etching process may include one or more etching steps designed to selectively etch the interlayer dielectric layer 142, such as wet etching, dry etching, or a combination thereof.

Referring back to FIG. 1, the diffusion barrier layer 144 may be deposited on the top surface of the interlayer dielectric layer 142 and in the contact holes 143, e.g., using an atomic layer deposition process or a physical vapor deposition process. The diffusion barrier layer 144 has a generally uniform thickness such that the diffusion barrier layer 144 substantially conforms to the shapes of the interlayer dielectric layer 142, the metal silicide regions 130 and the gate electrode 124. The diffusion barrier layer 144 may include titanium, cobalt, nickel, titanium nitride, tantalum nitride, and so on, and any combination thereof. The diffusion barrier layer 144 may have a thickness between about 50 Angstroms and about 5000 Angstroms. In some embodiments, the diffusion barrier layer 144 may not be formed above the gate electrode 124. In these embodiments, a portion of the diffusion barrier layer 144 may be removed by performing a patterning process to expose the gate electrode 124, or a shielding layer may be used to shield the gate electrode 124 before the diffusion barrier layer 144 is deposited, and then the shielding layer and the diffusion barrier layer 144 deposited on the shielding layer are removed to expose the gate electrode 124.

After the formation of the diffusion barrier layer 144 is completed, a conductive material may be deposited to fill the contact holes 143. The deposition of the conductive material includes filling the remainder of the contact holes 143 using, for example, electroplating, electroless plating, chemical vapor deposition, or the like. A planarization process, such as a chemical-mechanical planarization process or a mechanical polishing process, may be performed to remove excessive portions of the conductive material, or a photolithography and etching process may be performed to pattern the conductive material and the diffusion barrier layer 144 and expose a portion of the interlayer dielectric layer 142, thereby forming the conductive features 144 and the semiconductor structure 100 as shown in FIG. 1. FIG. 1 and FIG. 12 only show the method of manufacturing one layer of the interconnection structure 140, and methods of manufacturing other layers of the interconnection structures 140 are similar.

In the present disclosure, the order of the steps for forming the channel adjustment regions 112, the well regions 114 and the heavily doped regions 116 are changeable. For example, the heavily doped regions 116 defined by using the first patterned hard mask 312 and the second patterned hard mask 316 as shielding layers may be formed first, and then the channel adjustment regions 112 and the well regions 114 defined by using the first patterned hard mask 312 as a shielding layer may be formed. These changes do not affect the function of the semiconductor structure 100.

Figure 13:
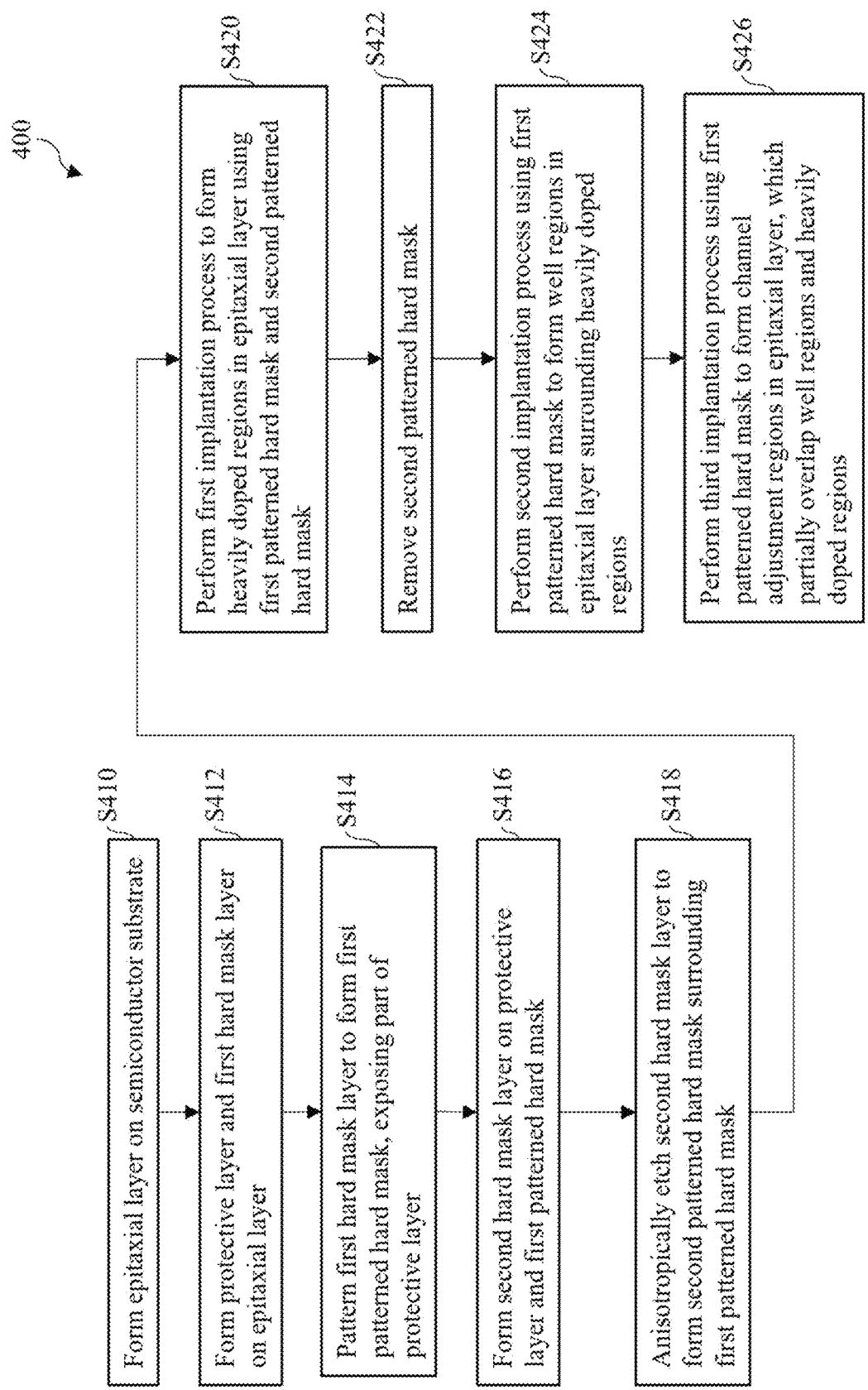
FIG. 13 is a flowchart of another method of fabricating a semiconductor structure in accordance with some embodiments of the present disclosure.

FIG. 13 is a flowchart of an example method 400 for fabricating the semiconductor structure 100 in accordance with some embodiments of the present disclosure. The method 400 is an example only, and is not intended to limit the disclosure beyond what is expressly recited in the claims. Additional steps may be provided before, between, and after the method 400, and some of the steps described may be moved, replaced, or omitted for additional embodiments of the method 400. The method 400 will be described below in conjunction with further figures showing schematic cross-sectional views during various intermediate steps of the method 400.

Referring to FIG. 13, the method 400 begins in step S410, where an epitaxial layer is formed over a semiconductor substrate. The method 400 continues to step S412 to form a protective layer and a first hard mask layer above the epitaxial layer. The method 400 continues to step S414, where the first hard mask layer is patterned, forming a first patterned hard mask to expose a portion of the protective layer. The method 400 continues to step S416, where a second hard mask layer is formed above the protective layer and the first patterned hard mask. The method 400 continues to step S418, where the second hard mask layer is anisotropically etched to form a second patterned hard mask surrounding the first patterned hard mask. The method 400 continues to step S420, where a first implantation process is performed through the second patterned hard mask to form a heavily dope regions in the epitaxial layer. The method 400 continues to step S422, where the second hard mask pattern is removed. The method 400 continues to step S424, where a second implant process is performed through the first patterned hard mask to form a well region surrounding the heavily doped region in the epitaxial layer. The method 400 continues to step S426, where a third implantation process is performed with an epitaxial layer and through the first patterned hard mask to form a channel adjustment region that partially overlap the heavily doped region and the well region. The method 400 will be described below in conjunction with further figures showing schematic cross-sectional views of the semiconductor structure 100 during intermediate steps of the method 400.

Steps S410, S412, and S414 in FIG. 13 are respectively the same as steps S210, S212, and S214 in FIG. 2. Descriptions about the related specific implementations can be obtained in conjunction with FIG. 3 to FIG. 4 above respectively, and will not be repeated here.

Figure 14:
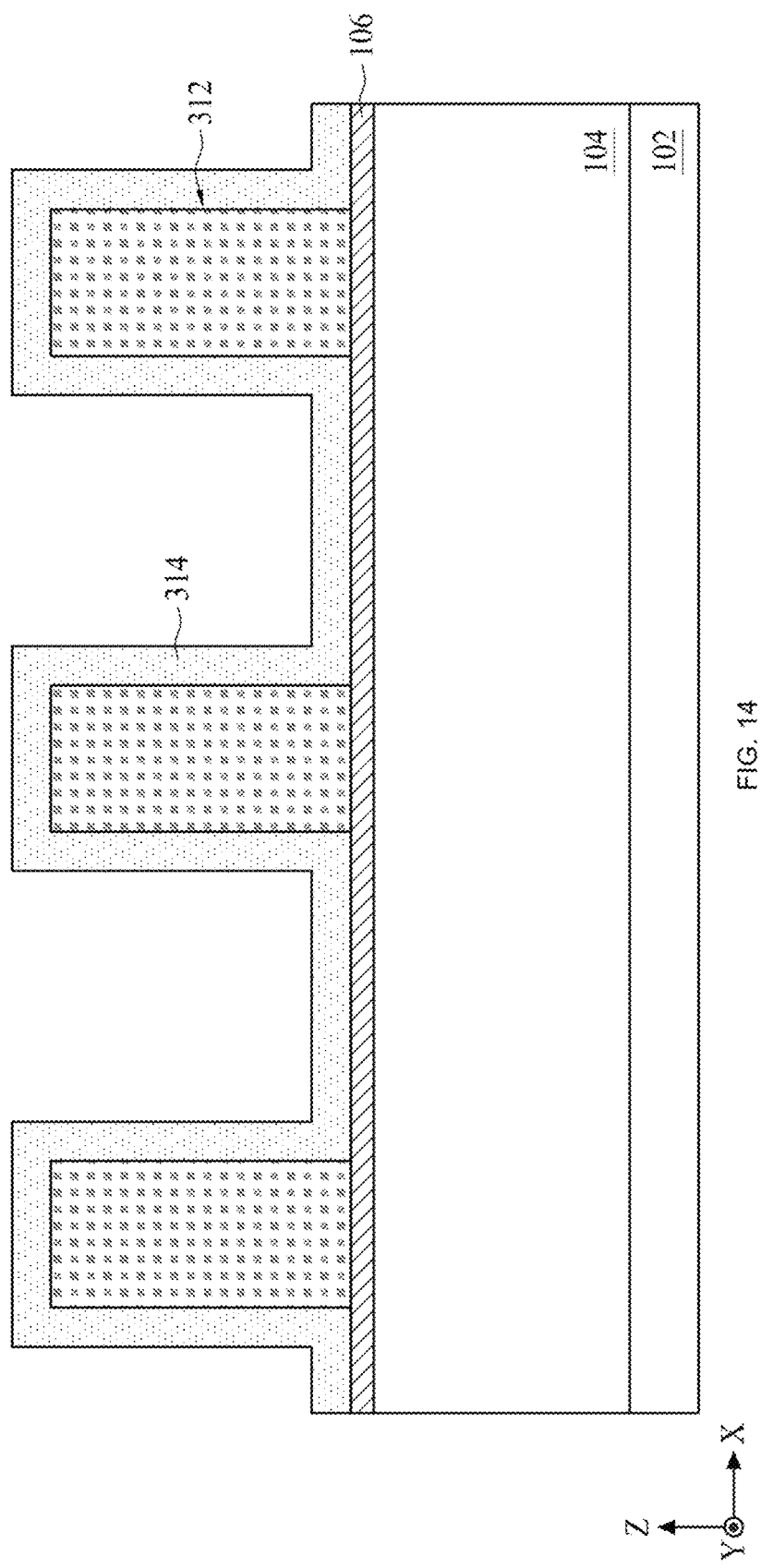
FIG. 14 to FIG. 17 illustrate schematic cross-sectional views illustrating various intermediate steps in a fabrication process of a semiconductor structure according to some embodiments of the present disclosure.

Referring to FIGS. 13 and 14, the method 400 proceeds to step S416 to form the second hard mask layer 314 above the protective layer 106 and the first patterned hard mask 312. The thickness of the second hard mask layer 314 is less than the thickness of the first patterned hard mask 312, and the second hard mask layer 314 is substantially conformal to the shapes of the protective layer 106 and the first patterned hard mask 312.

Figure 15:
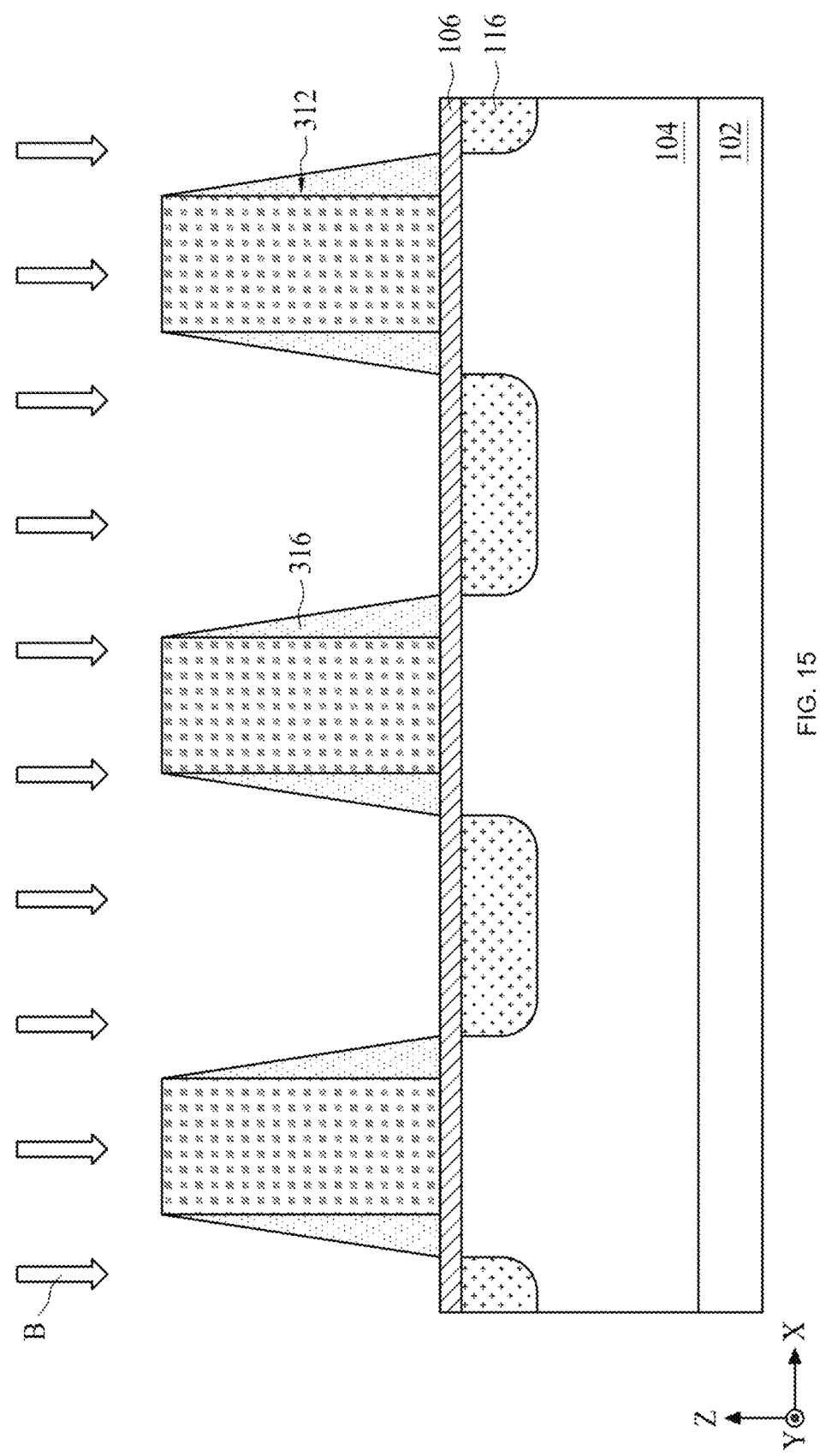

Referring to FIGS. 13 and 15, in step S418, the second hard mask layer 314 is anisotropically etched to form the second patterned hard mask 316 surrounding the first patterned hard mask 312. The anisotropic etching may remove the second hard mask layer 314 disposed on the top surface of the protective layer 106 and on the top surface of the first patterned hard mask 312, leaving behind the second hard mask layer 314 on the sides of the first patterned hard mask 312, as the second patterned hard mask 316.

Next, in step S420, a first implantation process may be performed through the second patterned hard mask 316 as a shielding layer to form a plurality of heavily doped regions 116 in the epitaxial layer 104. The heavily doped regions 116 are separated from each other in the first direction X. In some embodiments, the first implant process implants impurities into the epitaxial layer 104 through an implantation tilt angle θ of approximately 0 degree.

The method 400 continues to step S422 to remove the second patterned hard mask 316. In some embodiments, the second patterned hard mask 316 may be removed using a suitable process such as one or more wet etching processes. The protective layer 106 and the first patterned hard mask 312 may respectively have sufficient etch selectivity relative to the second patterned hard mask 316, and thus may serve as an etching stop layer. That is, when the second patterned hard mask 316 is removed by an etching process, the protective layer 106 and the first patterned hard mask 312 are removed.

Figure 16:
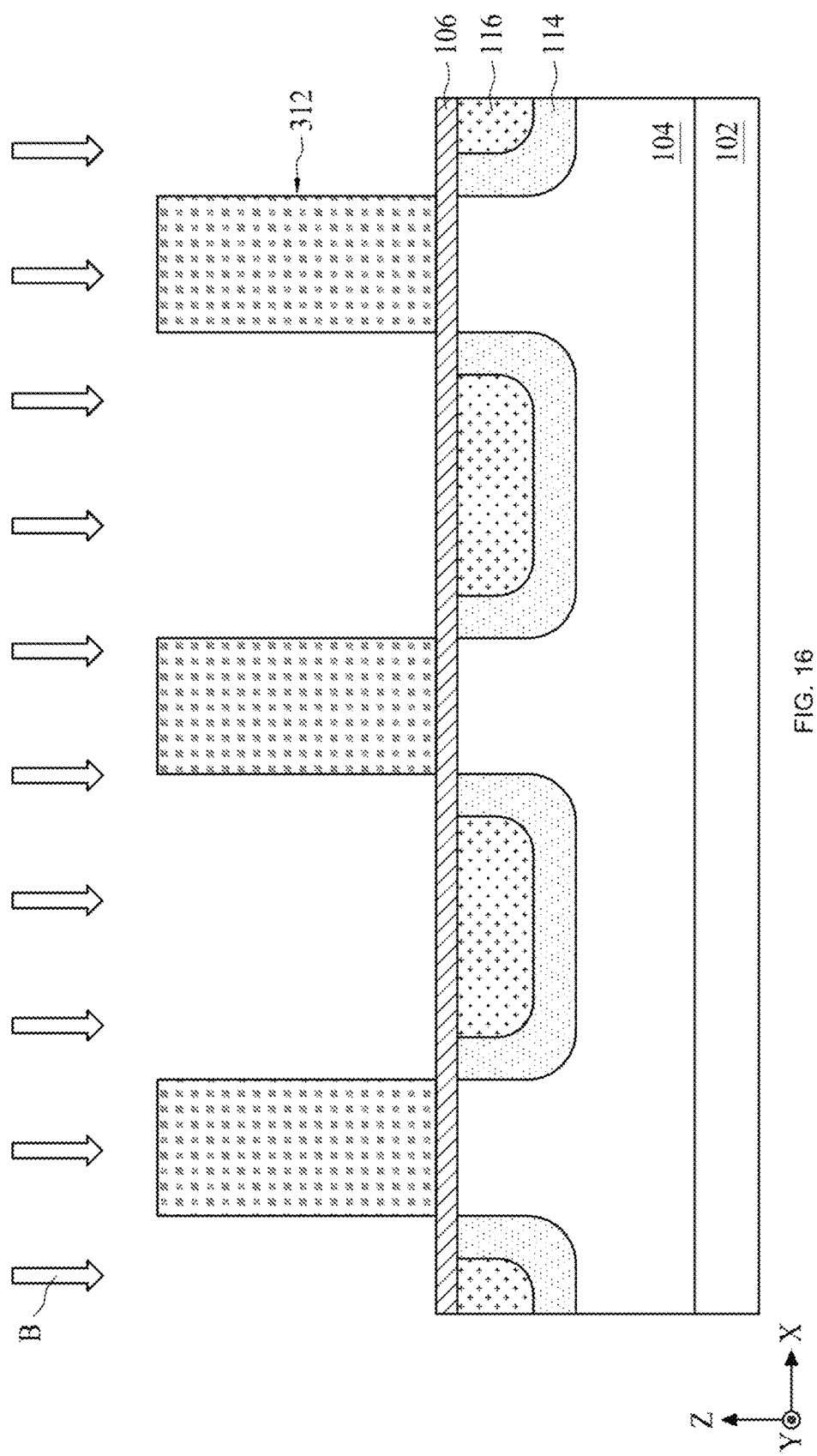

Referring to FIGS. 13 and 16, in step S424, a second implantation process may be performed using the first patterned hard mask 312 as a shielding layer to form well regions 114 surrounding the heavily doped regions 116 in the epitaxial layer 104. In some embodiments, the heavily doped regions 116 are located above the well regions 114. The second implantation process may implant P-type impurities into the epitaxial layer 104 through an implantation tilt angle θ of about 0 degree.

Figure 17:
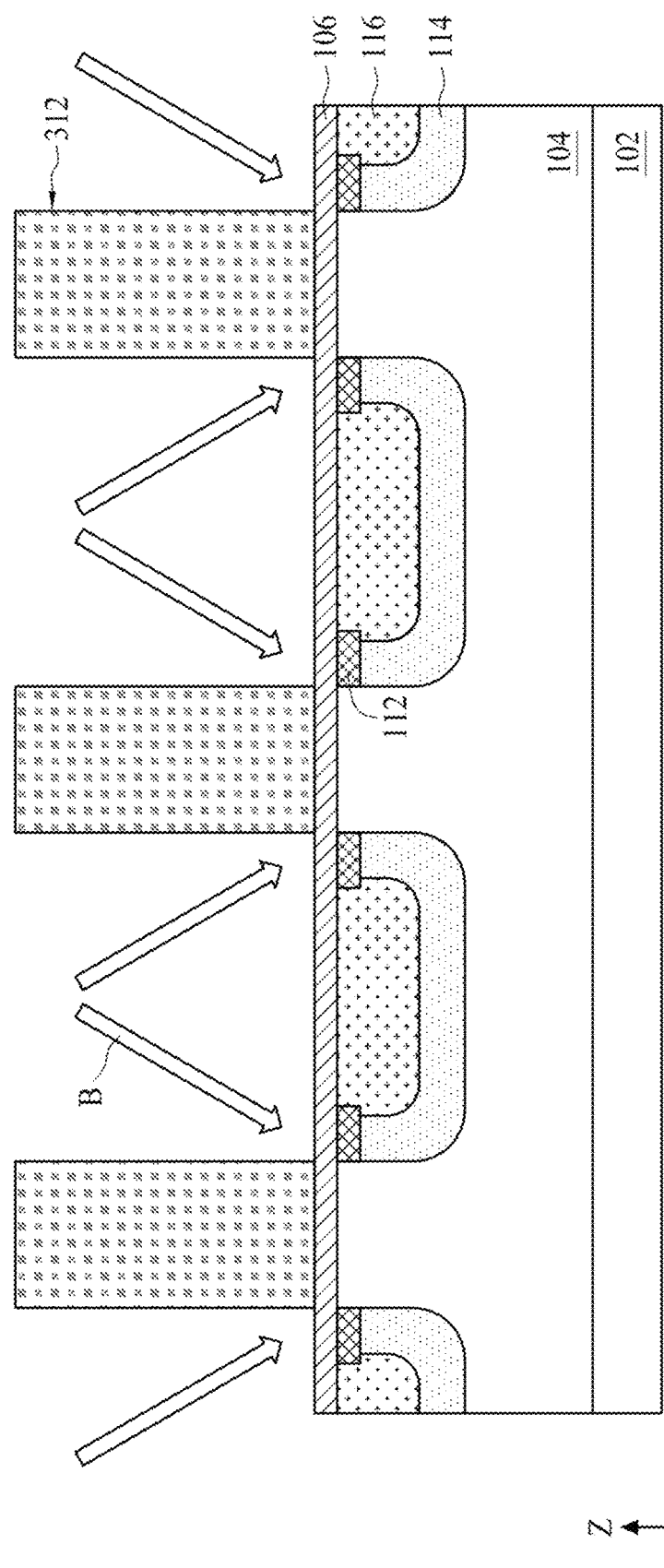

Referring to FIG. 13 and FIG. 17, in step S426, a third implantation process may be performed through the first patterned hard mask 312 to form the channel adjustment regions 112 in the epitaxial layer 104. The channel adjustment regions 112 may be located above the heavily doped regions 116 and the well regions 114. In some embodiments, the third implantation process may be performed for impurity implantation by tilting the ion beam B relative to the direction of the epitaxial layer 104, and may be repeatedly performed by rotating the substrate 102 and the epitaxial layer 104, thereby forming the channel adjustment regions 112.

The first patterned hard mask 312 may be removed after the channel adjustment regions 112 are formed. For example, the first patterned hard mask 312 may be removed using an etching process or a planarization process.

The method 400 may further includes steps S228-S234 as shown in FIG. 2. That is, the method 400 may further include forming the gate dielectric layer 122 and the gate electrode 124 above the protective layer 106, and forming the source region 126A and the drain region 126B in the epitaxial layer 104, forming the metal silicide regions 130 in the protective layer 106, and forming the interconnect structure 140 above the metal silicide regions 130 and the gate electrode 124, where, for the related specific implementations, references may be made to the descriptions of steps S228 to S234 above, and the descriptions are not repeated herein.

Figure 18:
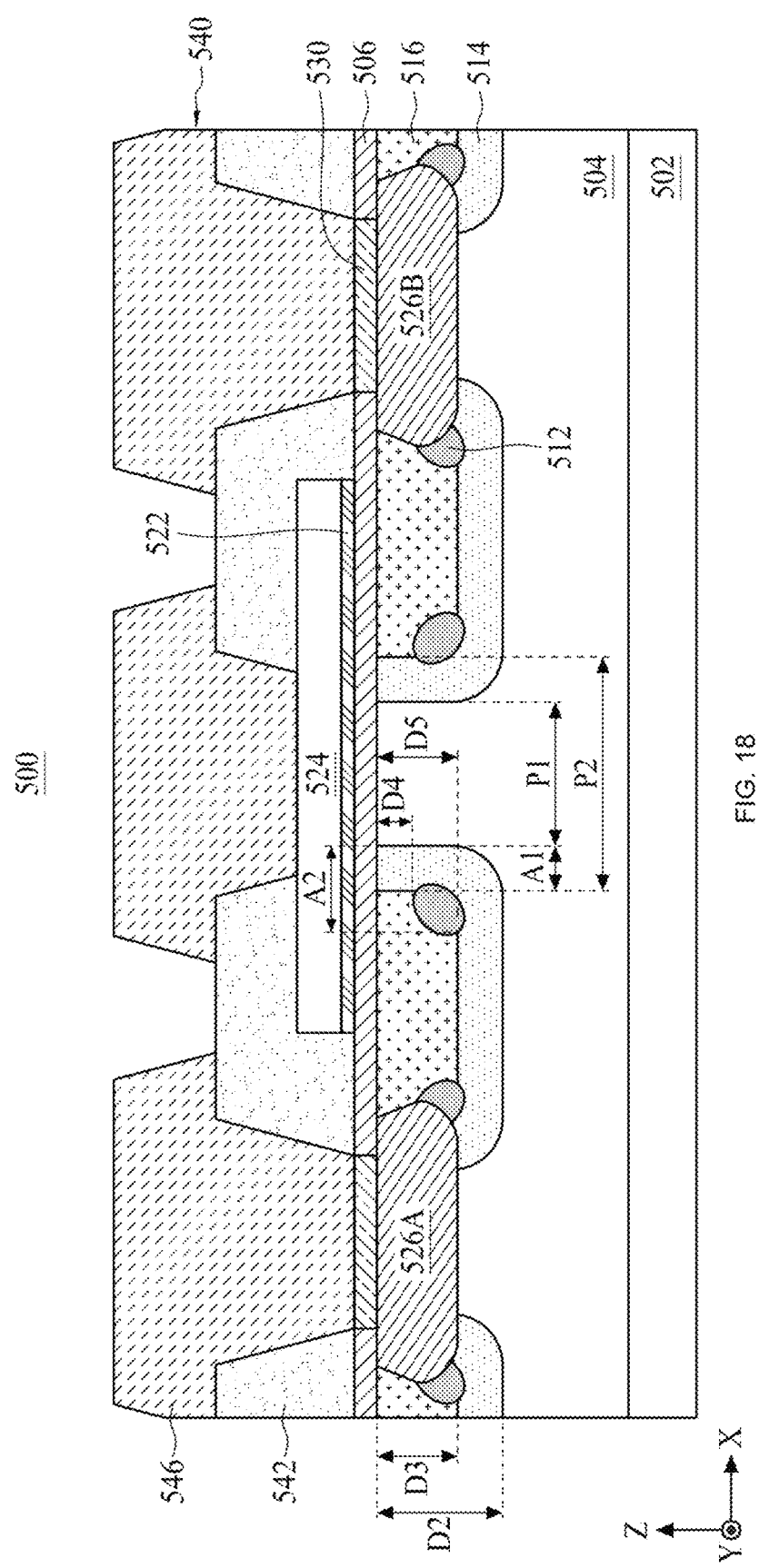
FIG. 18 is a schematic cross-sectional view of another semiconductor structure in accordance with some embodiments of the present disclosure.

FIG. 18 is a schematic cross-sectional view of an semiconductor structure 500 in accordance with some embodiments of the invention. Referring to FIG. 18, the semiconductor structure 500 may include a substrate 502, an epitaxial layer 504, a protective layer 506, a plurality of electric field adjustment regions 512, a plurality of well regions 514, a plurality of heavily doped regions 516, a gate dielectric layer 522, a gate electrode 524, a source region 526A, a drain region 526B, metal silicide regions 530 and an interconnect structure 540. In some embodiments, the electric field adjustment regions 512 may also be called a first doped region, the well regions 514 may also be called a second doped region, and the heavily doped regions 516 may also be called a third doped region.

The substrate 502 is a semiconductor substrate, such as a silicon carbide substrate. The epitaxial layer 504 is disposed above the substrate 502 and may be composed of a single layer or multiple layers of silicon carbide. The substrate 502 and epitaxial layer 504 may be doped or undoped, respectively. The electric field adjustment regions 512, the well regions 514, the heavily doped regions 516, the source region 526A and the drain region 526B may respectively be provided in the epitaxial layer 504 and formed by ion implantation. The gate dielectric layer 522 and the gate electrode 524, the metal silicide regions 530 and the interconnection structure 540 may respectively be disposed above the epitaxial layer 504.

The plurality of well regions 514 in the semiconductor structure 500 may be separated from each other in the first direction X. Each heavily doped region 516 may be surrounded by a well region 514. The well regions 514 may be separated from each other by a first pitch distance P1 along the first direction X. The heavily doped regions 516 may be separated from each other by a second pitch distance P2 along the first direction X. The second pitch distance P2 is greater than the first pitch distance P1. The well regions 514 may extend downwardly from the top surface of the epitaxial layer 504 (the surface away from the substrate 502) by a second depth D2. The heavily doped regions 516 may extend downwardly from the top surface of the epitaxial layer 504 by a third depth D3. The second depth D2 is greater than the third depth D3. The well regions 514 may include P-type impurities, and the heavily doped regions 516 may include N-type impurities. The heavily doped regions 516 may have a higher doping concentration than the well regions 514. In some embodiments, the well regions 514 and the heavily doped regions 516 are U-shaped in the cross-sectional view, and the distance from the left edge of a heavily doped region 516 to the left edge of a well region 514 surrounding the heavily doped region 516 is approximately equal to the distance from the right edge of the heavily doped region 516 to the right edge of the well region 514.

The plurality of electric field adjustment regions 512 in the semiconductor structure 500 are separated from each other in the first direction X. The electric field adjustment regions 512 may, for example, be disposed at corners of the heavily doped regions 516, and may extend into the well regions 514. In some embodiments, the electric field adjustment regions 512 may extend downwardly from a position that is a fourth depth D4 from the top surface of the epitaxial layer 504 to a position that is a fifth depth D5 from the top surface of the epitaxial layer 504. The fourth depth D4 is smaller than the third depth D3. The fifth depth D5 may be equal to or even slightly larger than the third depth D3. The electric field adjustment regions 512 may have an elliptical cross-section. In some embodiments, the distance from the top of an electric field adjustment region 512 to the edge of a well region 514 is a first distance A1, and a distance from the bottom of the electric field adjustment region 512 to the edge of the well region 512 is a second distance A2. The first distance A1 may be smaller than the second distance A2, such that the electric field adjustment area 512 is obliquely arranged. The electric field adjustment regions 512 can be used to reduce the electric field of the P-N junction formed on the surface of the heavily doped regions 516 or between the well regions 514 and the heavily doped regions 516, to prevent the semiconductor structure 500 from being broken down.

The gate dielectric layer 522 and the gate electrode 524 may be stacked on the protective layer 506, and may continuously extend from a first position that is approximately at the middle of a heavily doped region 516 to a second position that is approximately at the middle of an adjacent heavily doped region 516. The source region 526A and the drain region 526B may be provided in the epitaxial layer 504 at opposite ends of the gate electrode 524. The source region 526A and the drain region 526B may, for example, extend downwardly from the top surface of the epitaxial layer 504 to a depth that is equal to or slightly less than the third depth D3. In some embodiments, the source region 526A may partially overlap portions of the electric field adjustment regions 512, the well regions 514, and the heavily doped regions 516 located at the left side of the gate electrode 524. The drain region 526B may partially overlap portions of the electric field adjustment regions 512, the well regions 514 and the heavily doped regions 516 located at the right side of the gate electrode 524.

The metal silicide regions 530 may be formed in the protective layer 506 and may contact the source region 526A and the drain region 526B. In some embodiments, the metal silicide region 530 may be formed in regions where the source region 526A and the drain region 526B do not overlap the well regions 514 and the heavily doped regions 516. The metal silicide regions 530 may be used primarily to reduce the contact resistance between the source region 526A and the interconnect structure 540, and between the drain region 526B and the interconnect structure 540.

The interconnect structure 540 may be disposed above the protective layer 506, the gate electrode 524 and the metal silicide regions 530, and may include an interlayer dielectric layer 542 and a plurality of conductive features 546. The conductive feature 546 may be physically and electrically connected to the gate electrode 524 and the metal silicide regions 530. The interlayer dielectric layer 542 may cover the protective layer 506, the metal silicide regions 530 and the gate electrode 524, and surround at least a portion of the conductive features 546.

Figure 19:
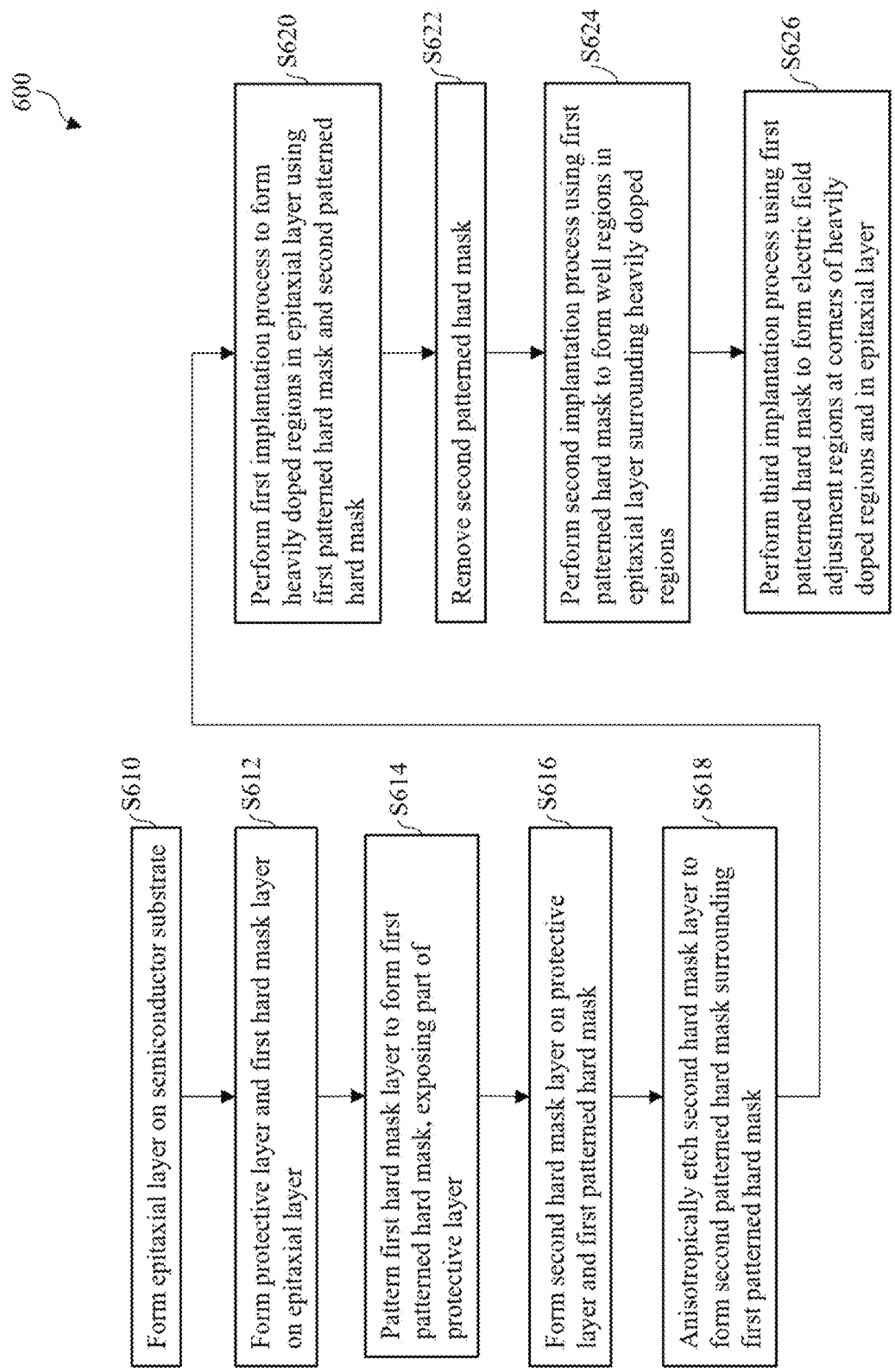
FIG. 19 of a flowchart of another method of fabricating a semiconductor structure in accordance with some embodiments of the present disclosure.

FIG. 19 is a flowchart of an example method 600 of fabricating the semiconductor structure 500 in accordance with some embodiments of the present disclosure. The method 600 is an example only, and is not intended to limit the disclosure beyond what is expressly recited in the claims. Additional steps may be provided before, between, and after the method 600, and some of the steps described may be moved, replaced, or omitted for additional embodiments of method 600. The method 600 will be described below in conjunction with further figures showing schematic cross-sectional views during various intermediate steps of the method 600.

Referring to FIG. 19, the method 600 begins in step S610, where an epitaxial layer is formed over a semiconductor substrate. The method 600 continues to step S612, where a protective layer and a first hard mask layer are formed above the epitaxial layer. The method 600 continues to step S614, where the first hard mask layer is patterned, forming a first patterned hard mask to expose a portion of the protective layer. The method 600 continues to step S616, where a second hard mask layer is formed above the protective layer and the first patterned hard mask. The method 600 continues to step S618 where the second hard mask layer is anisotropically etched to form a second patterned hard mask surrounding the first patterned hard mask. The method 600 continues to step S620, where a first implantation process is performed through the second patterned hard mask to form a first doped region in the epitaxial layer. The method 600 continues to step S622, where the second hard mask pattern is removed. The method 600 continues to step S624, where a second implantation process is performed through the first patterned hard mask to form a well region surrounding the heavily doped region in the epitaxial layer. The method 600 continues to step S626, where a third implantation process is performed through the first patterned hard mask to form an electric field adjustment region at the corners of the heavily doped region. The method 600 will be described below in conjunction with other figures showing schematic cross-sectional views of the semiconductor structure 500 during intermediate steps of method 600.

The steps of S610, S612, S614 in FIG. 19 are respectively the same as the steps S210, S212, and S214 in FIG. 2. Descriptions about the related specific implementations can be obtained in conjunction with FIG. 3 to FIG. 4 above respectively, and will not be repeated here.

Figure 20:
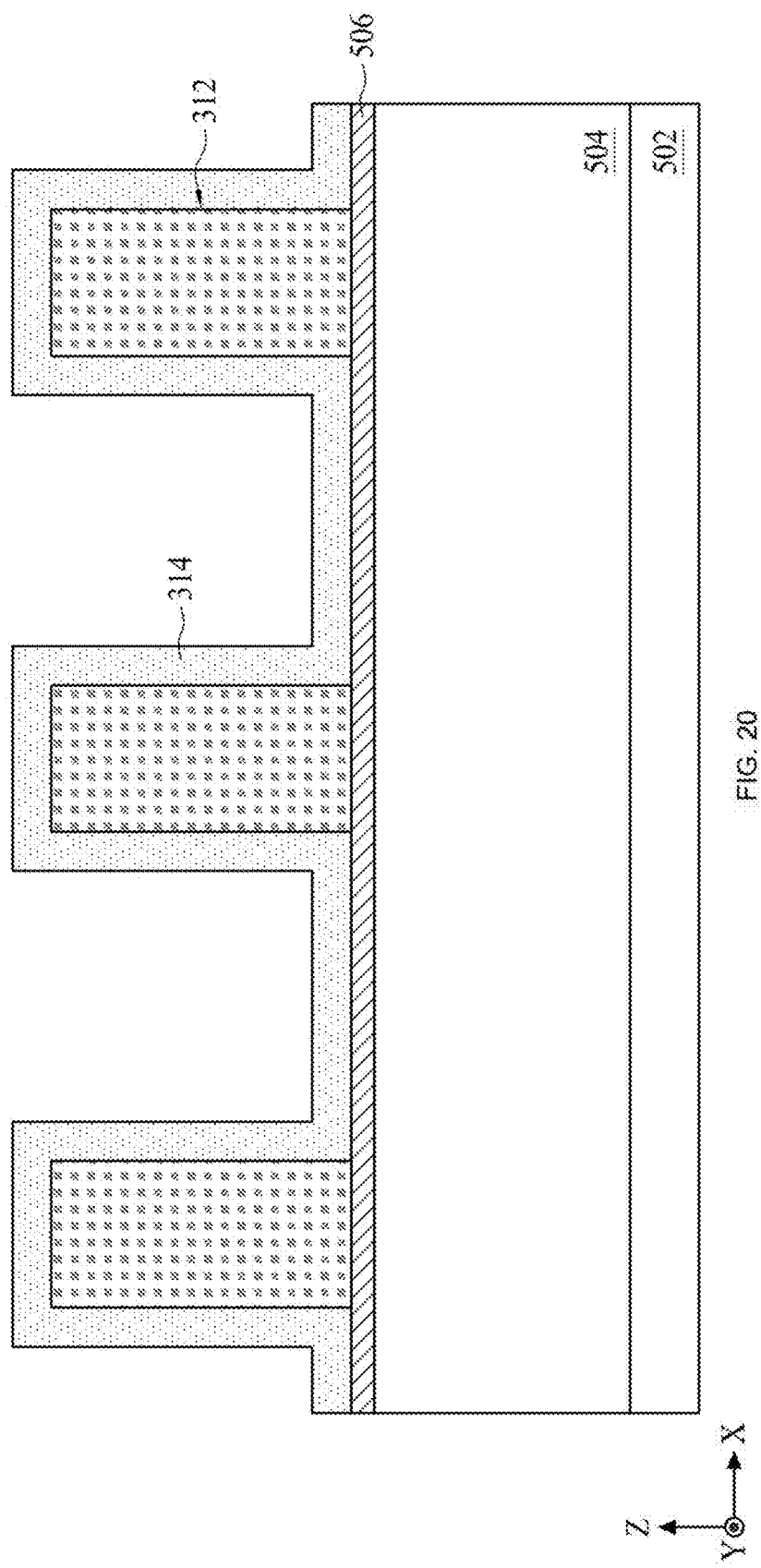
FIG. 20 to FIG. 24 are schematic cross-sectional views illustrating various intermediate steps in a fabrication process of a semiconductor structure according to some embodiments of the present disclosure.

Referring to FIGS. 19 and 20, the method 600 proceeds to step S616 to form the second hard mask layer 314 above the protective layer 506 and the first patterned hard mask 312. The thickness of the second hard mask layer 314 is less than the thickness of the first patterned hard mask 312. The second hard mask layer 314 is substantially conformal to the shapes of the protective layer 506 and the first patterned hard mask 312.

Figure 21:
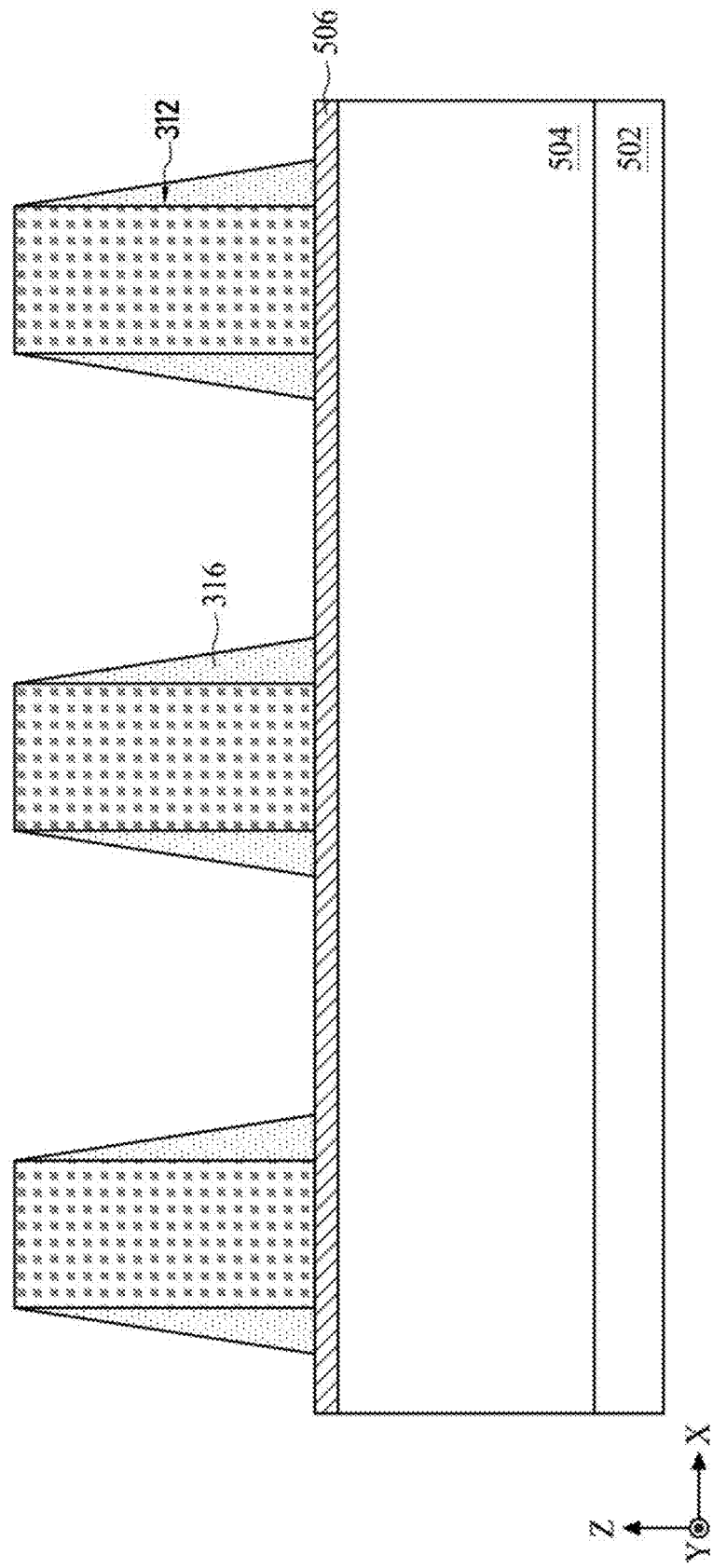

Referring to FIGS. 19 and 21, in step S618, the second hard mask layer 314 is anisotropically etched to form a second patterned hard mask 316 surrounding the first patterned hard mask 312. The anisotropic etching can remove the second hard mask layer 314 disposed on the top surface of the protective layer 506 and the top surface of the first patterned hard mask 312, leaving portions of the second hard mask layer 314 that are disposed on the sides of the first patterned hard mask 312, as the second patterned hard mask 316.

Figure 22:
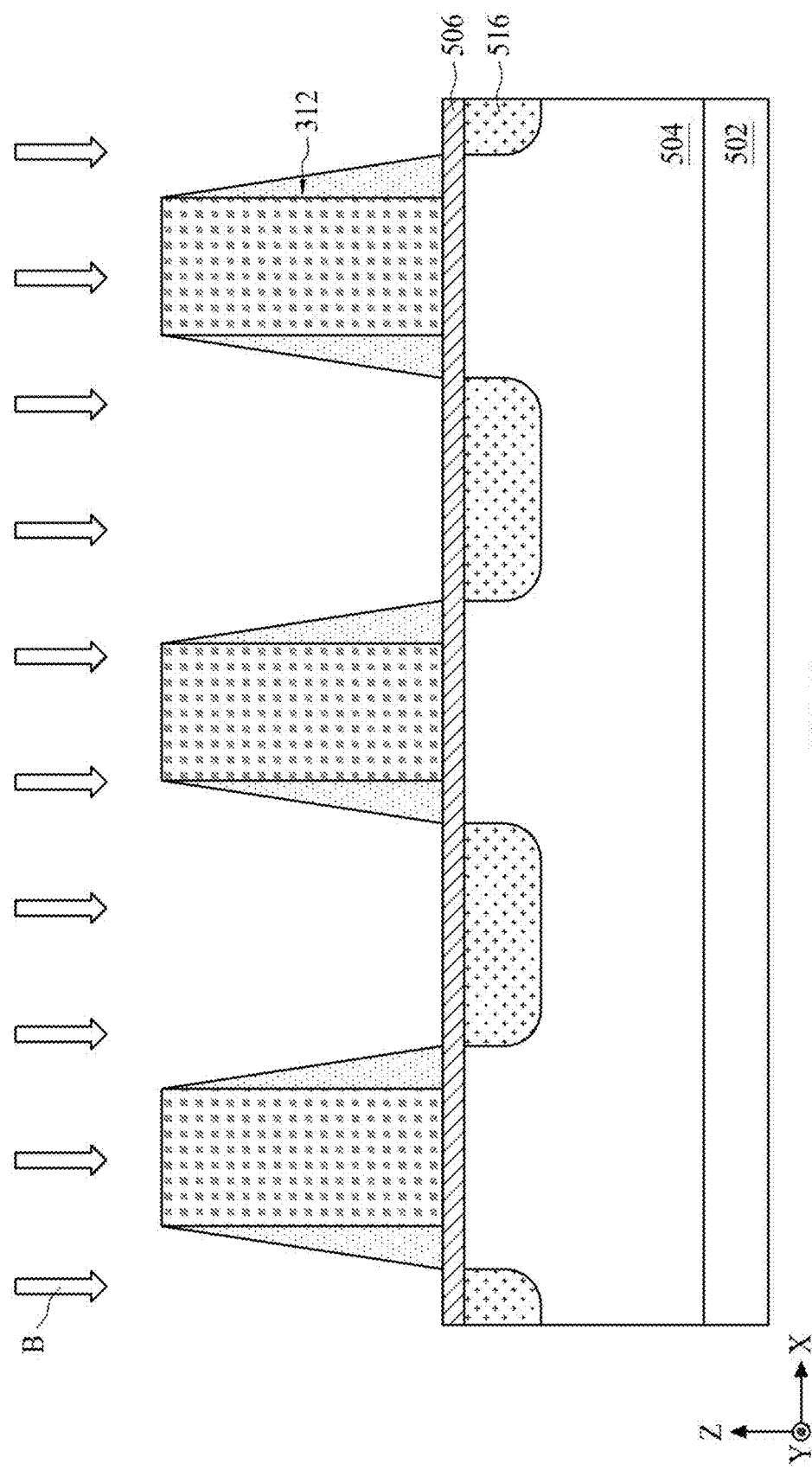

Referring to FIGS. 19 and 22, in steps S620, in a first implantation process, N-type impurities are implanted into the epitaxial layer 504 using the first patterned hard mask 312 and the second patterned hard mask 316 as shielding layers, forming the plurality of heavily doped regions 516. In some embodiments, the implantation tilt angle θ for implanting the impurities is approximately 0 degree, such that the impurities are implanted approximately vertically into the epitaxial layer 504.

The method 600 continues to step S622 to remove the second patterned hard mask 316. In some embodiments, the second patterned hard mask 316 may be removed using a suitable process such as one or more wet etching processes.

Figure 23:
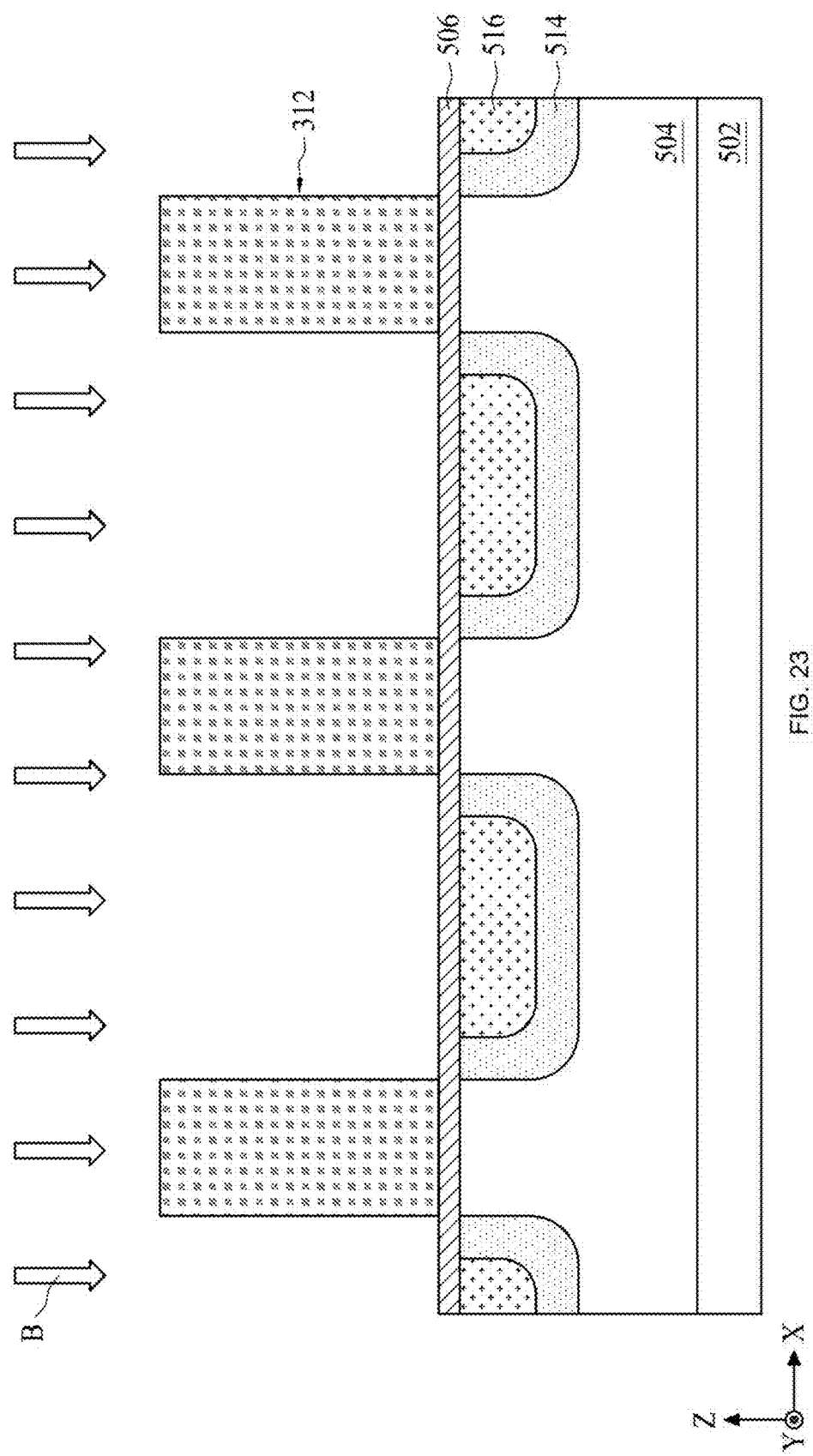

Referring to FIG. 19 and FIG. 23, in step S624, a second implantation process is performed using the first patterned hard mask 320 as a shielding layer to introduce P-type impurities into the epitaxial layer 504, thereby forming the well regions 514. Each well region 514 may surround a heavily doped region 516. In some embodiments, the heavily doped regions 516 may be located above the well regions 514, and the heavily doped regions 516 and the well regions 514 may respectively contact the protective layer 506. In some embodiments, the second conductivity type is P-type. In some embodiments, the second implant process implants impurities into the epitaxial layer 504 substantially vertically.

Figure 24:
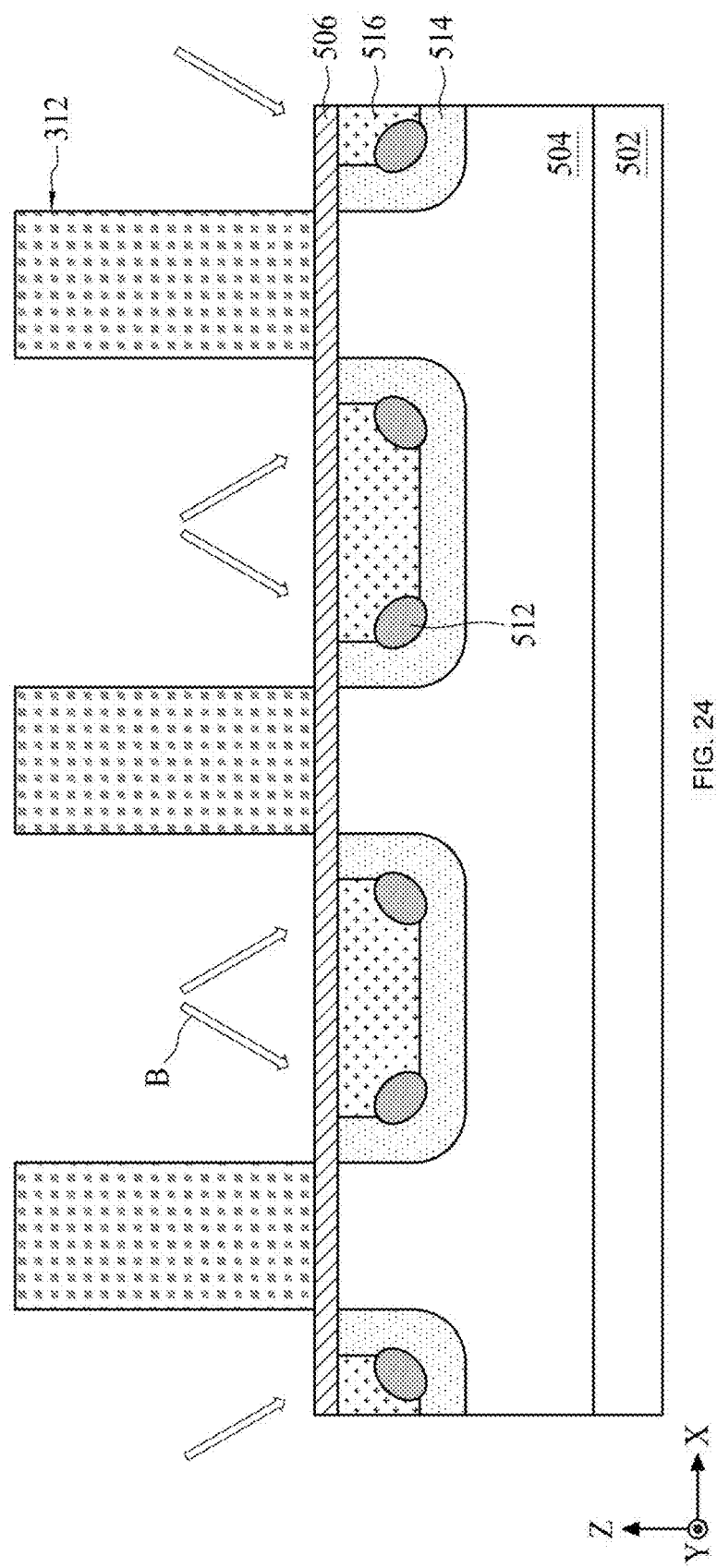

Referring to FIG. 18 and FIG. 24, in step S626, a third implantation process may be performed using the first patterned hard mask 320 as a shielding layer to form the electric field adjustment regions 512 at the corners of the heavily doped regions 516. In some embodiments, the impurity implantation may be performed by tilting the ion beam B relative to the direction of the epitaxial layer 504, and may be repeatedly performed by rotating the substrate 502 and the epitaxial layer 504, thereby forming the plurality of electric field adjustment regions 512 that are separated from each other in the first direction X, which change the electric field distribution of the semiconductor structure 500, and therefore improve the breakdown performance of the semiconductor structure 500. The implantation dose of the third implantation process may be from about $1\times10^{13}$ cm$^{-2}$ to about $1\times10^{15}$ cm$^{-2}$. In some embodiments, the impurity atoms may be selected from the nitrogen family, the boron family, or boron difluoride. The third implantation process may be performed at room temperature, or the third implantation process may be a hot implantation process.

Subsequently, the first patterned hard mask 312 may be removed. The method 600 may further include steps S228 to S234 as shown in FIG. 2, which steps may be used to form the gate dielectric layer 522, the gate electrode 524, the source region 526A, and the drain region 526B, the metal silicide regions 530 and the interconnection structure 540 as shown in FIG. 18. For the specific implementation processes, please refer to the above descriptions about the steps S228 to S234, which will not be described again here.

Figure 25:
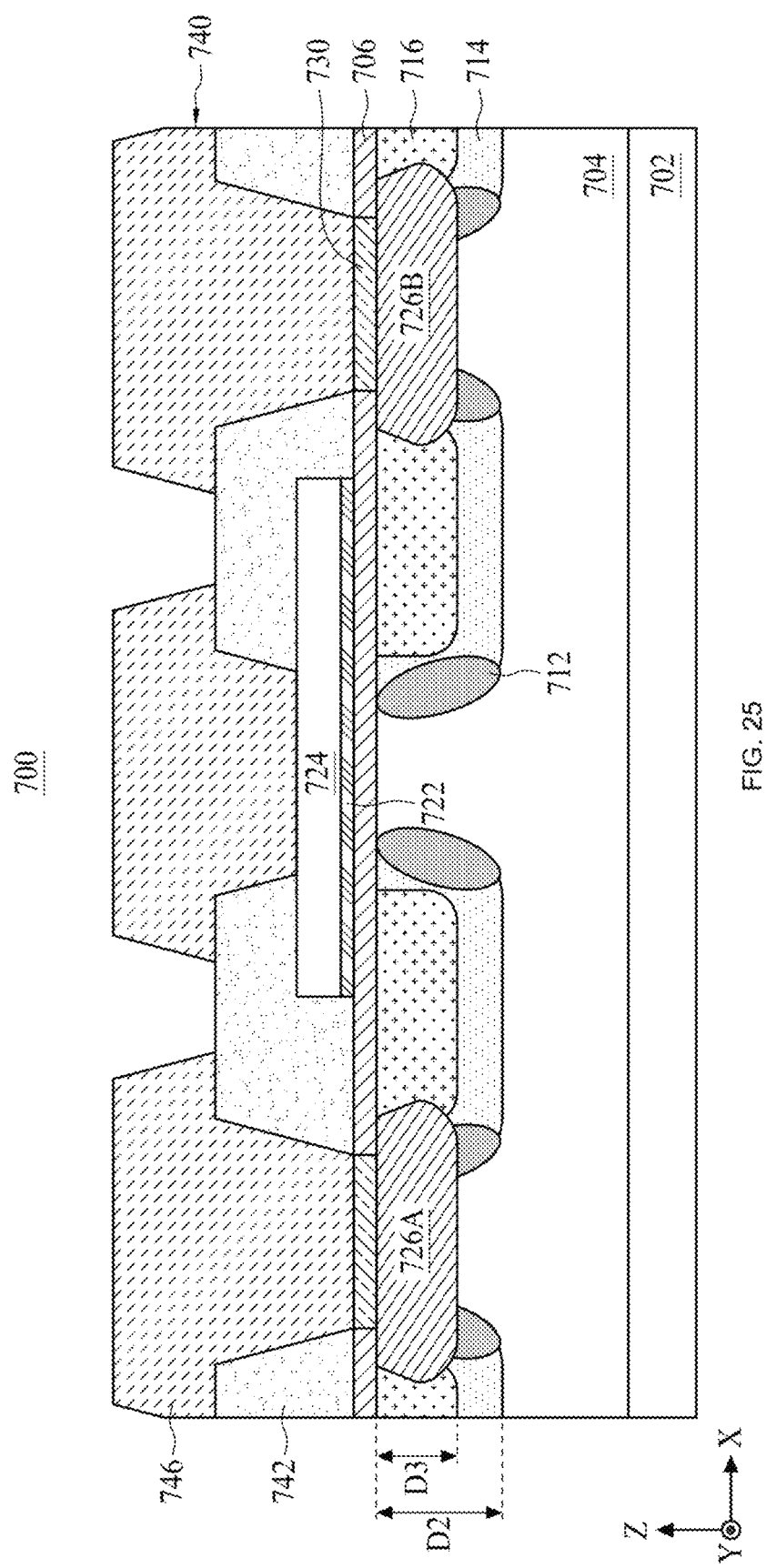
FIG. 25 is a schematic cross-sectional view of another semiconductor structure in accordance with some embodiments of the present disclosure.

FIG. 25 is a schematic cross-sectional view of an example semiconductor structure 700 in accordance with some embodiments of the present disclosure. Referring to FIG. 25, the semiconductor structure 700 may include a substrate 702, an epitaxial layer 704, a protective layer 706, a plurality of hot carrier adjustment regions 712, a plurality of well regions 714, a plurality of heavily doped regions 716, a gate dielectric layer 722, a gate electrode 724, a source region 726A, a drain region 726B, metal silicide regions 730, and an interconnect structure 740. In some embodiments, the heavily doped regions 716 may also be called a first doped region, the well regions 714 may also be called a second doped region, and the hot carrier adjustment regions 712 may also be called a third doped region.

The substrate 702 is a semiconductor substrate, and the epitaxial layer 704 is disposed on the substrate 702. The substrate 702 and the epitaxial layer 704 may include silicon carbide. The hot carrier adjustment regions 712, the well regions 714, the heavily doped regions 716, the source region 726A and the drain region 726B may be respectively provided in the epitaxial layer 704. The protective layer 706, the gate dielectric layer 722, the gate electrode 724 the metal silicide regions 730 and the interconnection structure 740 may be respectively disposed above the epitaxial layer 704.

The plurality of well regions 714 in the semiconductor structure 700 are separated from each other in the first direction X. Each heavily doped region 716 may be surrounded by one well region 714. The well regions 714 may include P-type impurities, and the heavily doped regions 716 may include N-type impurities. The heavily doped regions 716 may have a higher doping concentration than the well regions 114.

The well regions 714 may extend downwardly from the top surface of the epitaxial layer 704 (the surface away from the substrate 702) by a second depth D2. The heavily doped regions 716 may extend downwardly from the top surface of the epitaxial layer 704 by a third depth D3. The second depth D2 may be greater than the third depth D3. The hot carrier adjustment regions 712 may, for example, be disposed at the sidewalls of the well region 714 and extend to the undoped portions of the epitaxial layer 704. As shown in FIG. 25, the hot carrier adjustment regions 712 do not extend to the heavily doped regions 716. The hot carrier adjustment regions 712 may extend downwardly from the top surface of the epitaxial layer 704 by the second depth D2, or by a depth slightly less than the second depth D2 (no less than the third depth D3), so that almost the entire sidewalls the well regions 714 may be covered by the hot carrier adjustment regions 712.

The well regions 714 and the heavily doped regions 716 may be U-shaped when viewed in the cross-sectional view (in the X-Z direction), and the hot carrier adjustment regions 712 may be in the shape of ovals in the cross-sections. The long axis of the ovals may extend generally along the sidewalls of the well regions 714, which increases the length of the sidewalls of the well regions 714 that are covered by the hot carrier adjustment regions 712, so as to achieve the function of reducing hot carrier injection. In some embodiments, a hot carrier adjustment regions 712 disposed on the right side of a well region 714 may be inclined from upper right to lower left, and a hot carrier adjustment region 712 disposed on the left side of the well region 714 may be inclined from upper left to lower right.

The gate dielectric layer 722 and the gate electrode 724 may be stacked on the protective layer 706, and may continuously extend from a first position that is approximately at the middle of a heavily doped region 716 to a second position that is approximately at the middle position of an adjacent heavily doped region 716. The source region 726A and the drain region 726B may be provided in the epitaxial layer 704 at opposite ends of the gate electrode 724. In some embodiments, the source region 726A may partially overlap portions of the hot carrier adjustment regions 712, the well regions 714, and the heavily doped regions 716 that are located to the left of the gate electrode 724. The drain region 726B may partially overlap portions of the hot carrier adjustment regions 712, the well regions 714 and the heavily doped regions 716 that are located to the right of the gate electrode 724.

The metal silicide regions 730 may be formed in the protective layer 706 and may contact the source region 726A and the drain region 726B. In some embodiments, the metal silicide regions 730 may be formed in regions of the source region 726A and the drain region 726B that do not overlap the hot carrier adjustment regions 712, the well regions 714, and the heavily doped regions 716. The metal silicide regions 730 may be used to reduce the contact resistances between the source region 726A and the interconnection structure 740, and between the drain region 726B and the interconnection structure 740.

The interconnect structure 740 may be disposed above protective layer 706, the gate electrode 724, and the metal silicide regions 730, and may include the interlayer dielectric layer 742 and a plurality of conductive features 746. The conductive features 746 may be physically and electrically connected to the gate electrode 724 and the metal silicide regions 730. The interlayer dielectric layer 742 may cover the protective layer 706, the metal silicide regions 730 and the gate electrode 724, and surround at least a lower portion of the conductive features 746.

Figure 26:
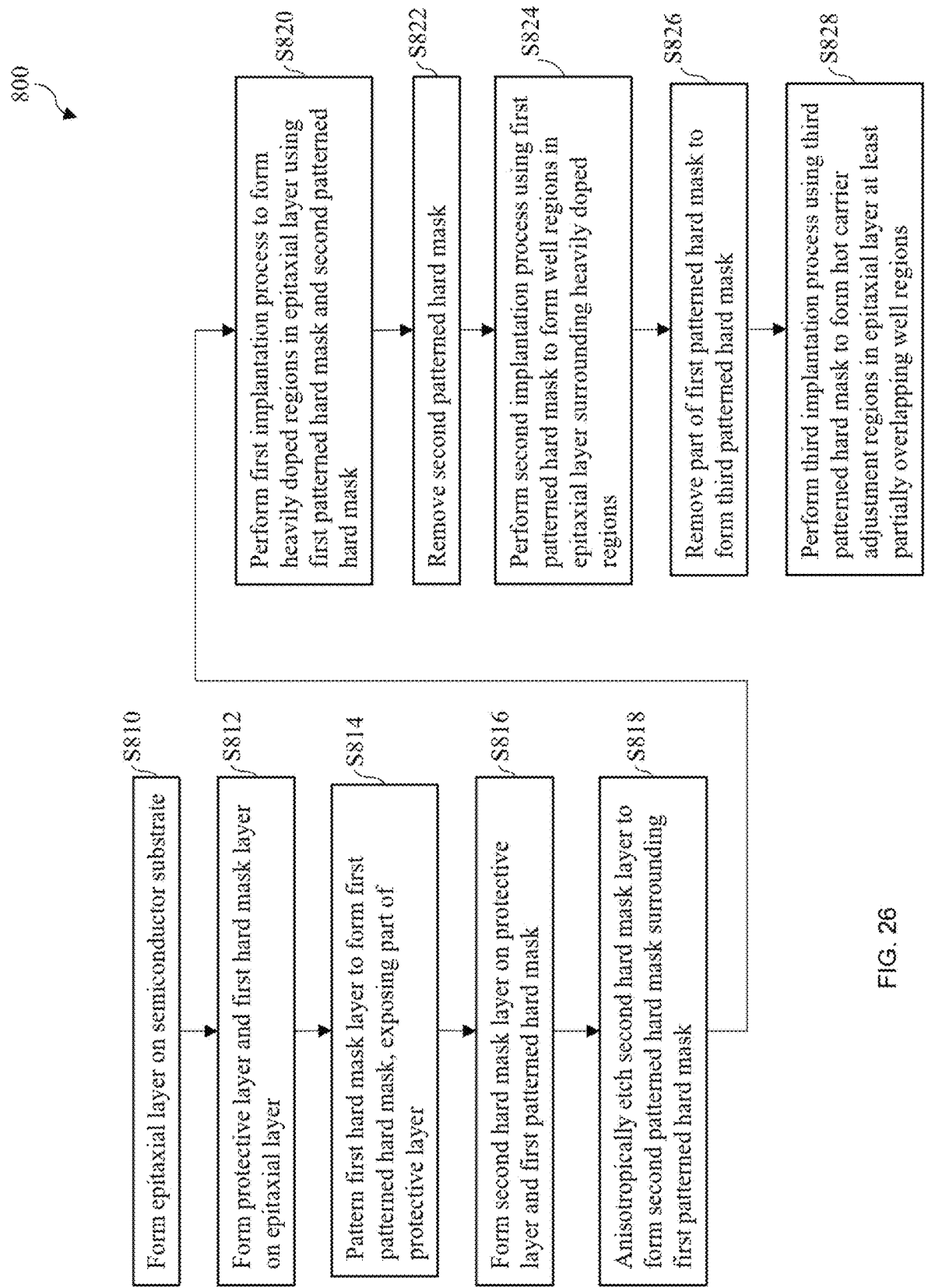
FIG. 26 is a flowchart of another method of fabricating a semiconductor structure in accordance with some embodiments of the present disclosure.

FIG. 26 is a flowchart of an example method 800 of fabricating the semiconductor structure 700 in accordance with some embodiments of the present disclosure. The method 800 is an example only, and is not intended to limit the disclosure beyond the scope expressly recited in the claims. Additional steps may be provided before, between, and after the method 800, and some of the steps described may be moved, replaced, or omitted for providing additional embodiments of the method 800. The method 800 will be described below in conjunction with further figures showing schematic cross-sectional views during various intermediate steps of the method 800.

Steps S810, S812, and S814 in FIG. 26 are respectively the same as the steps S210, S212, and S214 in FIG. 2. For the related specific implementations, reference can be made to the descriptions with respect to FIGS. 3 to 4, respectively, which will not be described again here.

Figure 27:
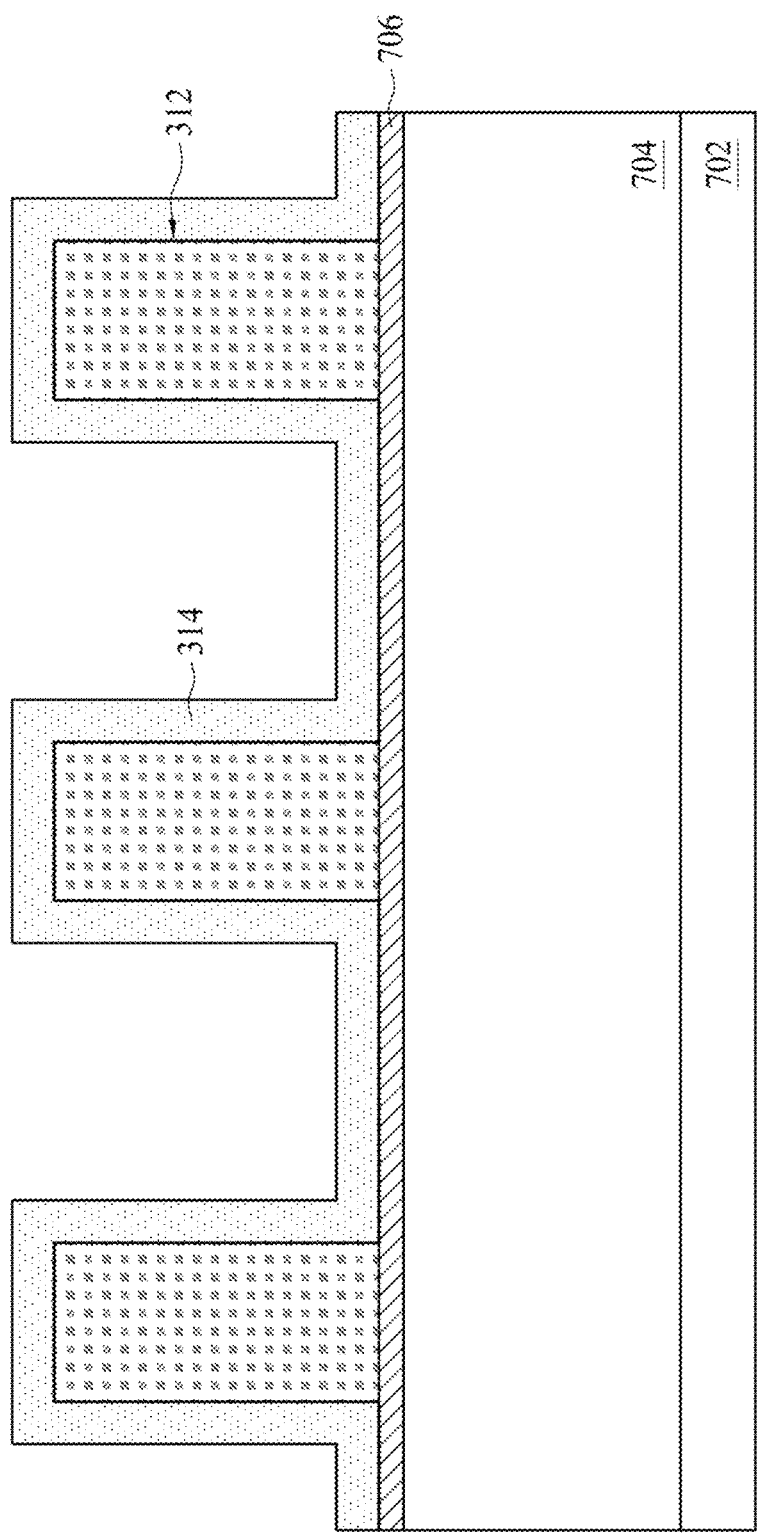
FIG. 27 to FIG. 31 are schematic cross-sectional views illustrating various intermediate steps in a fabrication process of a semiconductor structure according to some embodiments of the present disclosure.

Referring to FIGS. 26 and 27, the method 800 proceeds to step S816 to form the second hard mask layer 314 on the protective layer 706 and the first patterned hard mask 312. The second hard mask layer 314 may have a generally uniform thickness and may conform to the shapes of the protective layer 706 and the first hard patterned mask 312.

Figure 28:
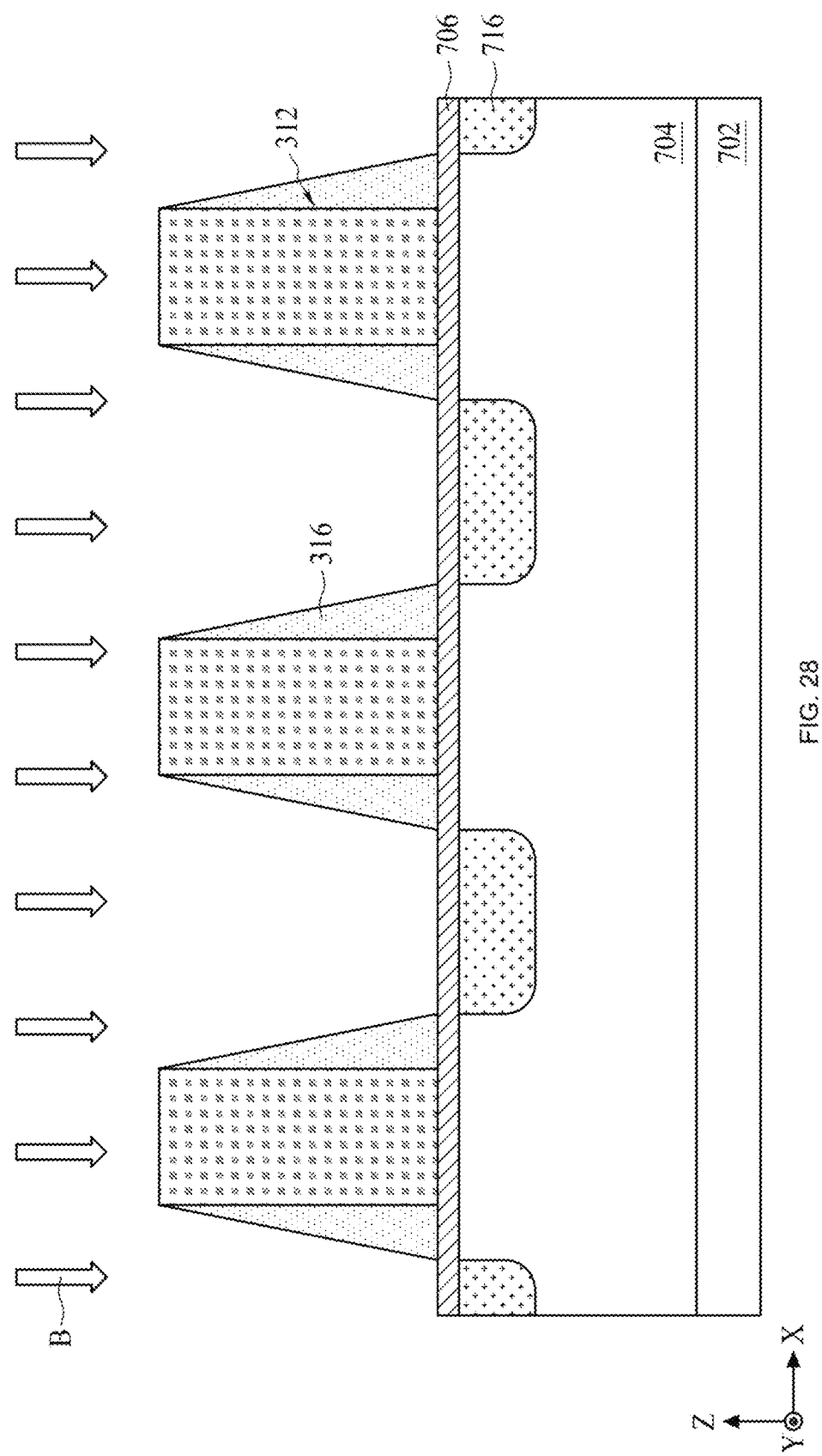

Referring to FIGS. 26 and 28, in step S818, the second hard mask layer 314 may be anisotropically etched to form the second patterned hard mask 316 surrounding the first patterned hard mask 312. The anisotropic etch can remove the horizontal portions of the second hard mask layer 314 and leave the vertical portions of the second hard mask layer 314 surrounding the sides of the first patterned hard mask 312.

Next, the method 800 proceeds to step S820, using the first patterned hard mask 312 and the second patterned hard mask 316 as the shielding layers, a first implantation process may be performed to implant N-type impurities in the epitaxial layer 704, forming the plurality of heavily doped regions 716 that are spaced apart from each other by a predetermined distance and arranged in parallel. After completing the first implantation process, the second patterned hard mask 316 may be removed through one or more etching processes (step S822).

Figure 29:
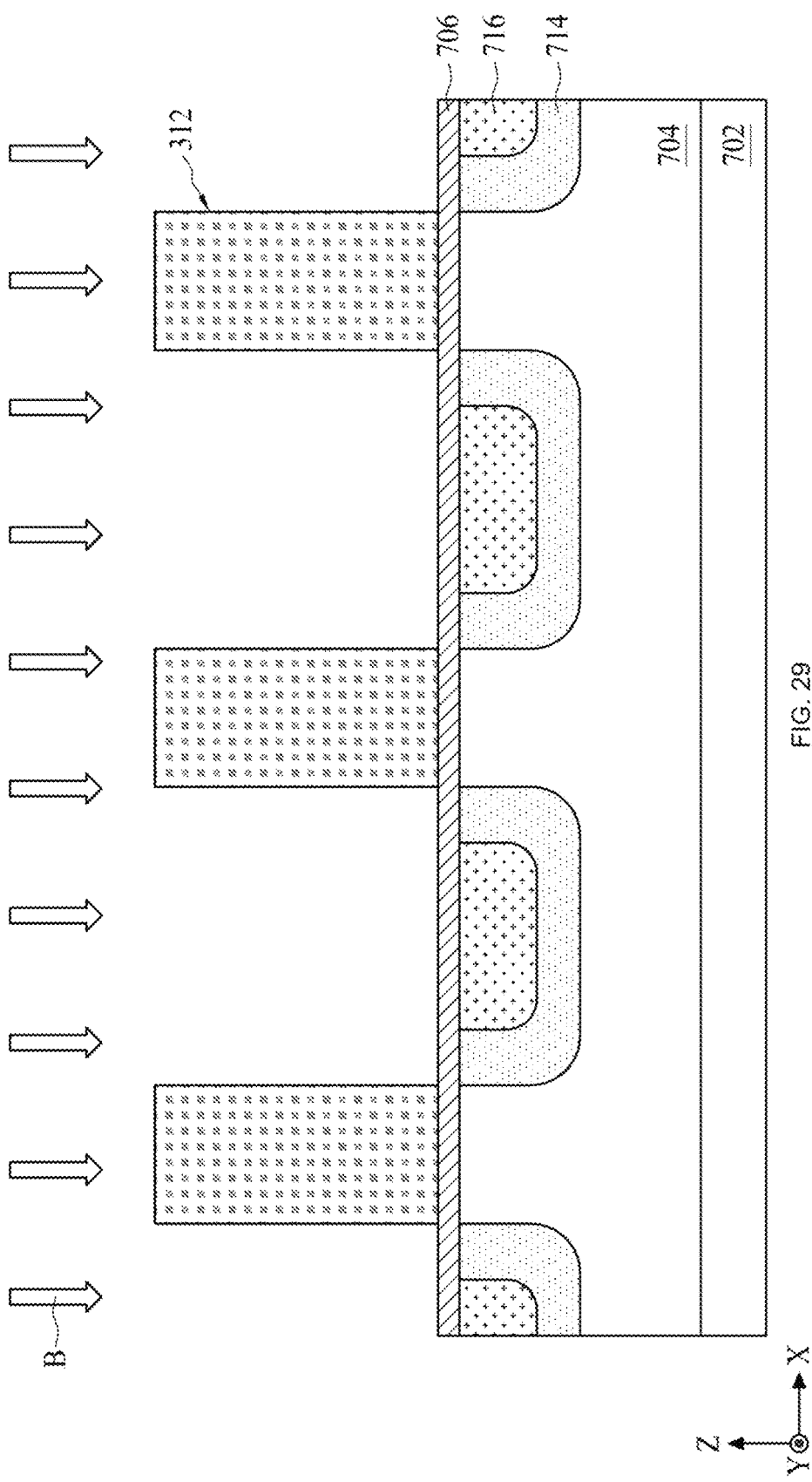

Referring to FIGS. 26 and 29, in step S824, a second implantation process may be performed using the first patterned hard mask 312 as a shielding layer to form the plurality of well regions 714 in the epitaxial layer 706. In some embodiments, the heavily doped regions 716 are located above the well regions 714. The well regions 714 and the heavily doped regions 716 may respectively contact the protective layer 706. The second implantation process is used to inject P-type impurities into the epitaxial layer 706, thereby forming P-shaped well regions surrounding the heavily doped regions 716. In some embodiments, the first implantation process and the second implantation process respectively inject impurities into the epitaxial layer 704 in a direction generally perpendicular to the top surface of the epitaxial layer 704.

Figure 30:
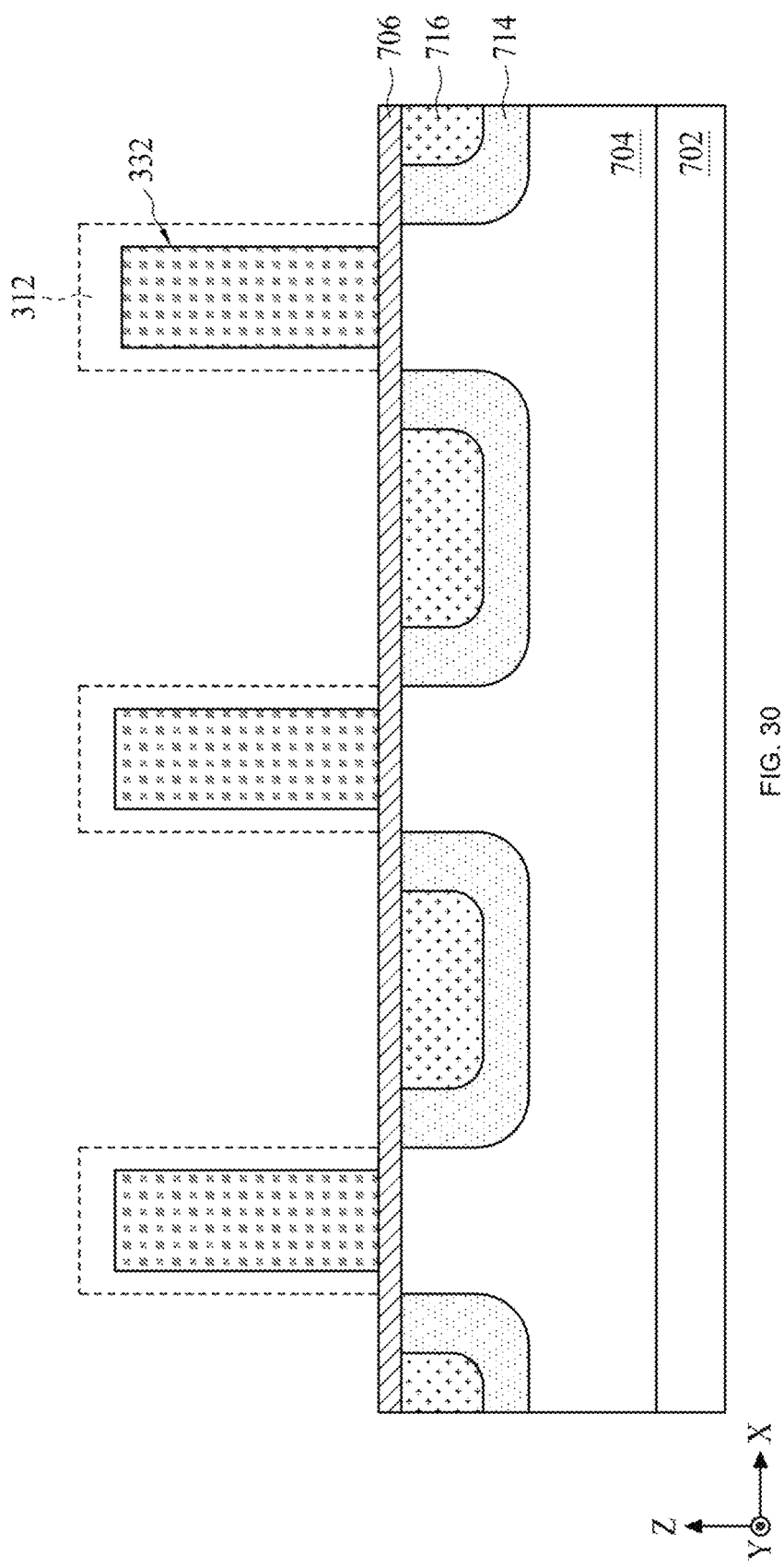

Referring to FIG. 26 and FIG. 30, in step S826, part of the first patterned hard mask 312 may be removed to form a third patterned hard mask 332. The third patterned hard mask 332 may be formed by performing a trimming process to reduce the width and height of the first patterned hard mask 312. In some embodiments, the trimming process may include a dry etching process or a wet etching process.

Figure 31:
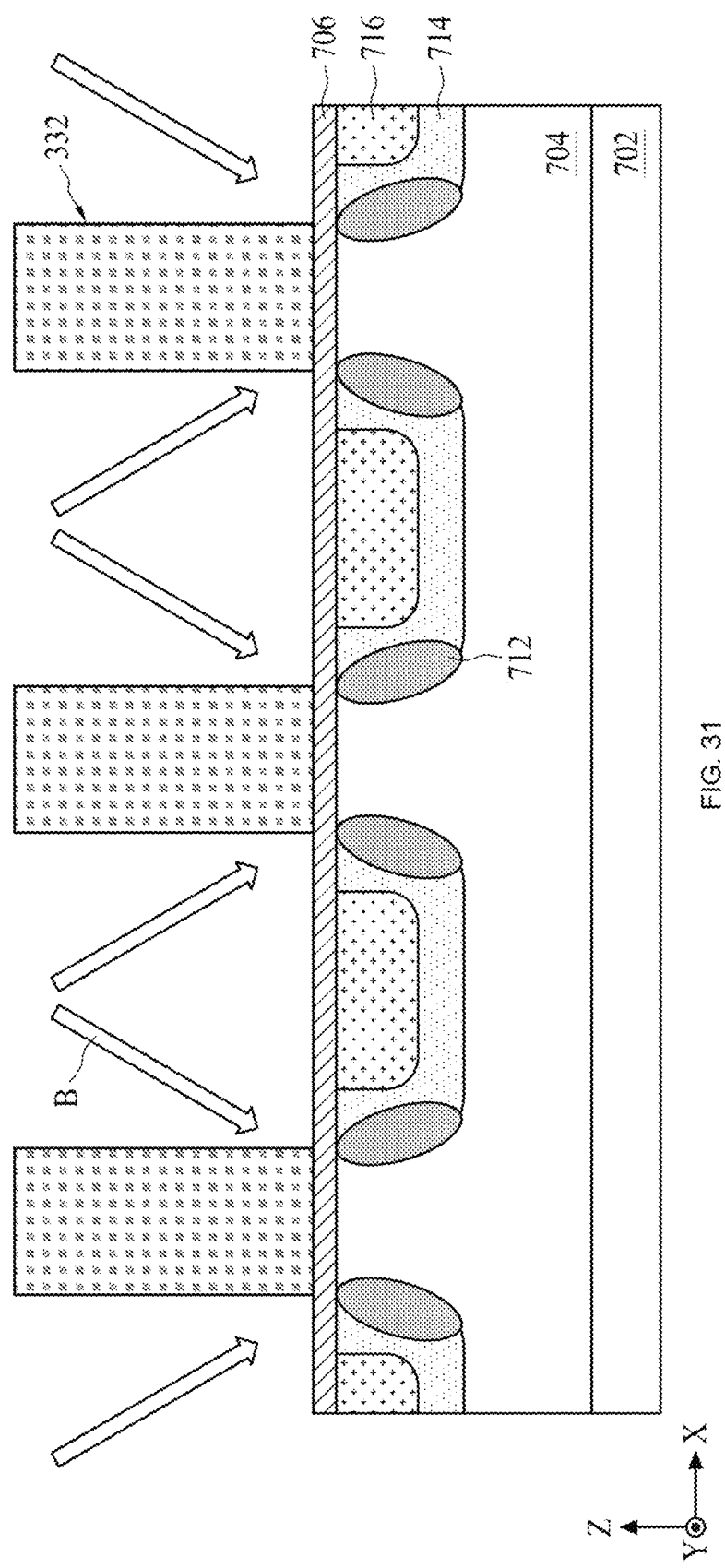

Referring to FIG. 26 and FIG. 31, in step S828, a third implantation process may be performed using the third patterned hard mask 332 as a shielding layer to form, in the epitaxial layer 704, the hot carrier adjustment regions 712 that at least partially overlap the sidewalls of the well regions 714. In some embodiments, the impurity implantation may be performed by tilting the ion beam B relative to the direction of the epitaxial layer 704, and may be repeatedly performed by rotating the substrate 702 and the epitaxial layer 704, thereby forming the plurality of hot carrier adjustment regions 712 that are spaced apart from each other in the first direction X, which mitigates the problem about hot carrier injection of the semiconductor structure 700. The implantation dose of the third implantation process may be from about $1 \times 10^{13}$ cm$^{-2}$ to about $1 \times 10^{15}$ cm$^{-2}$. In some embodiments, the impurity atoms may be selected from the nitrogen family, the boron family, or boron difluoride. The third implantation process may be performed at room temperature, or the third implantation process may be a hot implantation process.

Afterwards, the third patterned hard mask 332 may be removed. In some embodiments, the third patterned hard mask 332 may be removed by, for example, a wet etching process or a planarization process. The method 800 may further include the steps S228 to S234 as shown in FIG. 2, which may be used to form the gate dielectric layer 722, the gate electrode 724, the source region 726A, the drain region 726B, the metal silicide regions 730 and the interconnection structure 740 as shown in FIG. 25. For the related specific implementation processes, please refer to the above descriptions of the steps S228 to S234, which will not be described again here.

Figure 32:
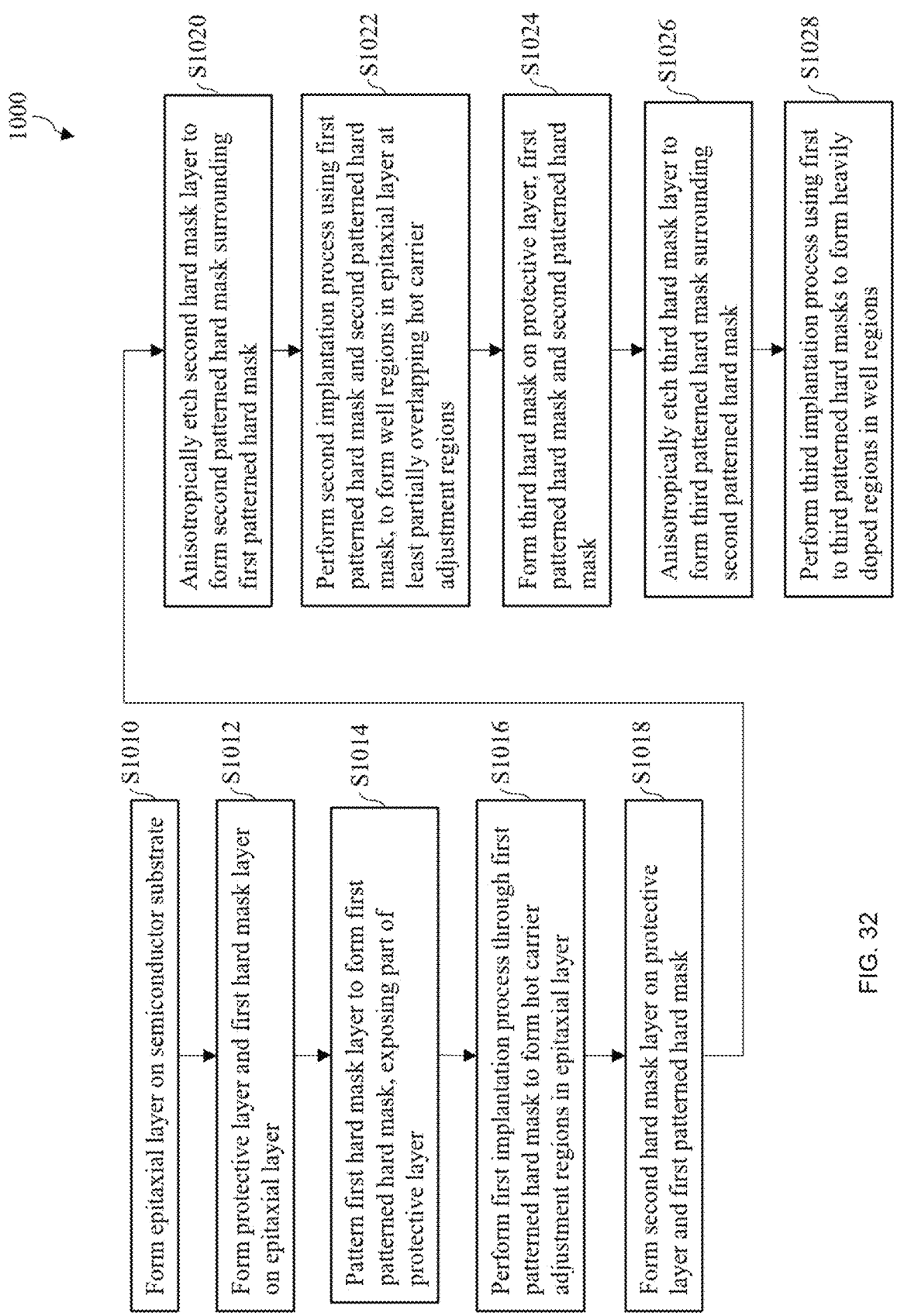
FIG. 32 is a flowchart of another method of fabricating a semiconductor structure in accordance with some embodiments of the present disclosure.

FIG. 32 is a flowchart of an example method 1000 of fabricating the semiconductor structure 700 in accordance with some embodiments of the present disclosure. The method 1000 is an example only, and is not intended to limit the disclosure beyond the scope expressly recited in the claims. Additional steps may be provided before, between, and after the method 1000, and some of the steps described may be moved, replaced, or omitted for providing additional embodiments of the method 1000. The method 1000 will be described below in conjunction with further figures showing schematic cross-sectional views during various intermediate steps of the method 1000.

Steps S1010, S1012, and S1014 in FIG. 32 are respectively the same as the steps S210, S212, and S214 in FIG. 2. For the related specific implementations, reference can be made to the descriptions with respect to FIGS. 3 to 4, respectively, which will not be described again here.

Figure 33:
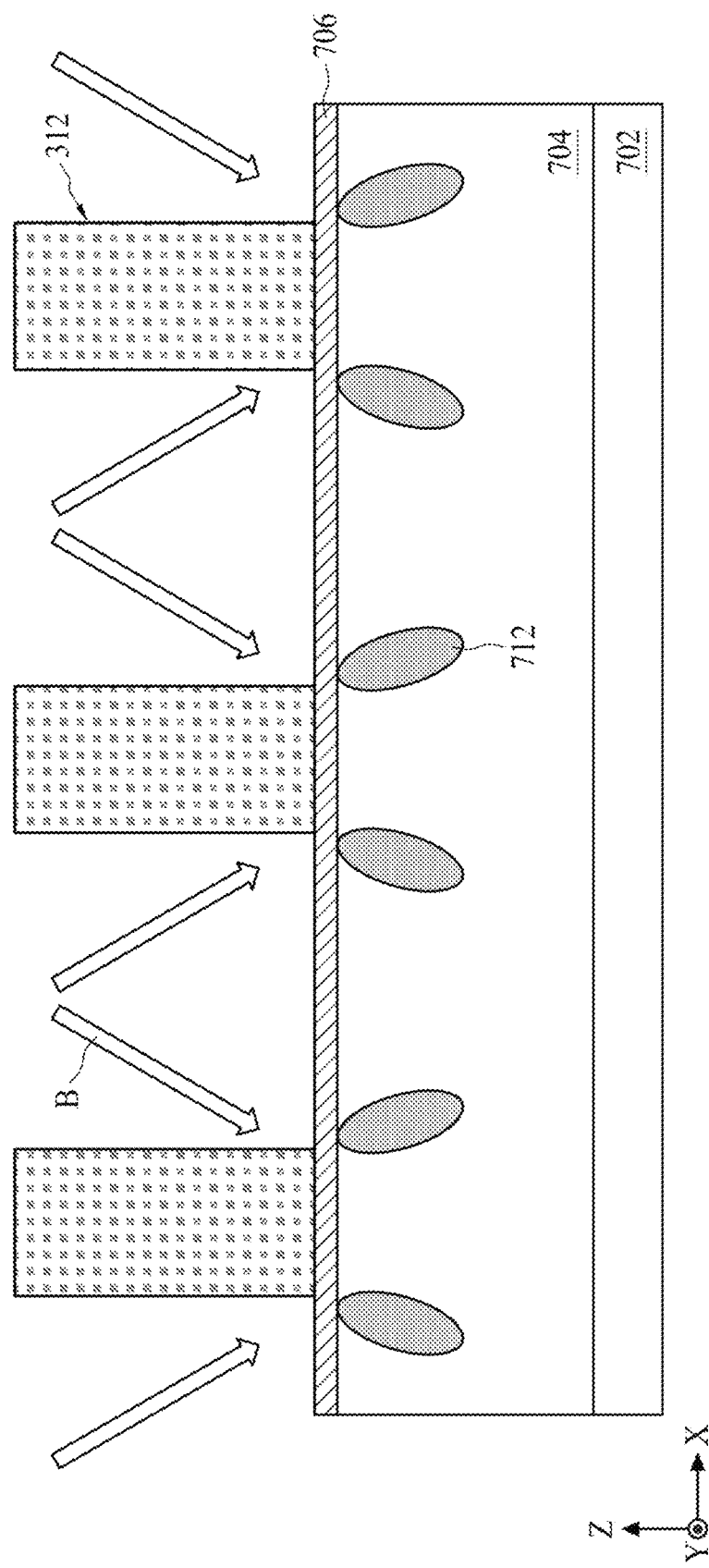
FIG. 33 to FIG. 39 are schematic cross-sectional views of various intermediate steps in a fabrication process of a semiconductor structure according to some embodiments of the present disclosure.

Referring to FIG. 32 and FIG. 33, in step S1016, using the first patterned hard mask 312 as a shielding layer, a first implantation process may be performed to form the plurality of hot carrier adjustment regions 712 in the epitaxial layer 704. The first implantation process is used to implant specific impurity atoms into positions at both sides of the bottom of the first patterned hard mask 312 in an ion acceleration manner. In some embodiments, the impurity atoms may be selected from the nitrogen family, the boron family, or boron difluoride. The first implantation process may be performed at room temperature, or the first implantation process may be a hot implantation process.

Figure 34:
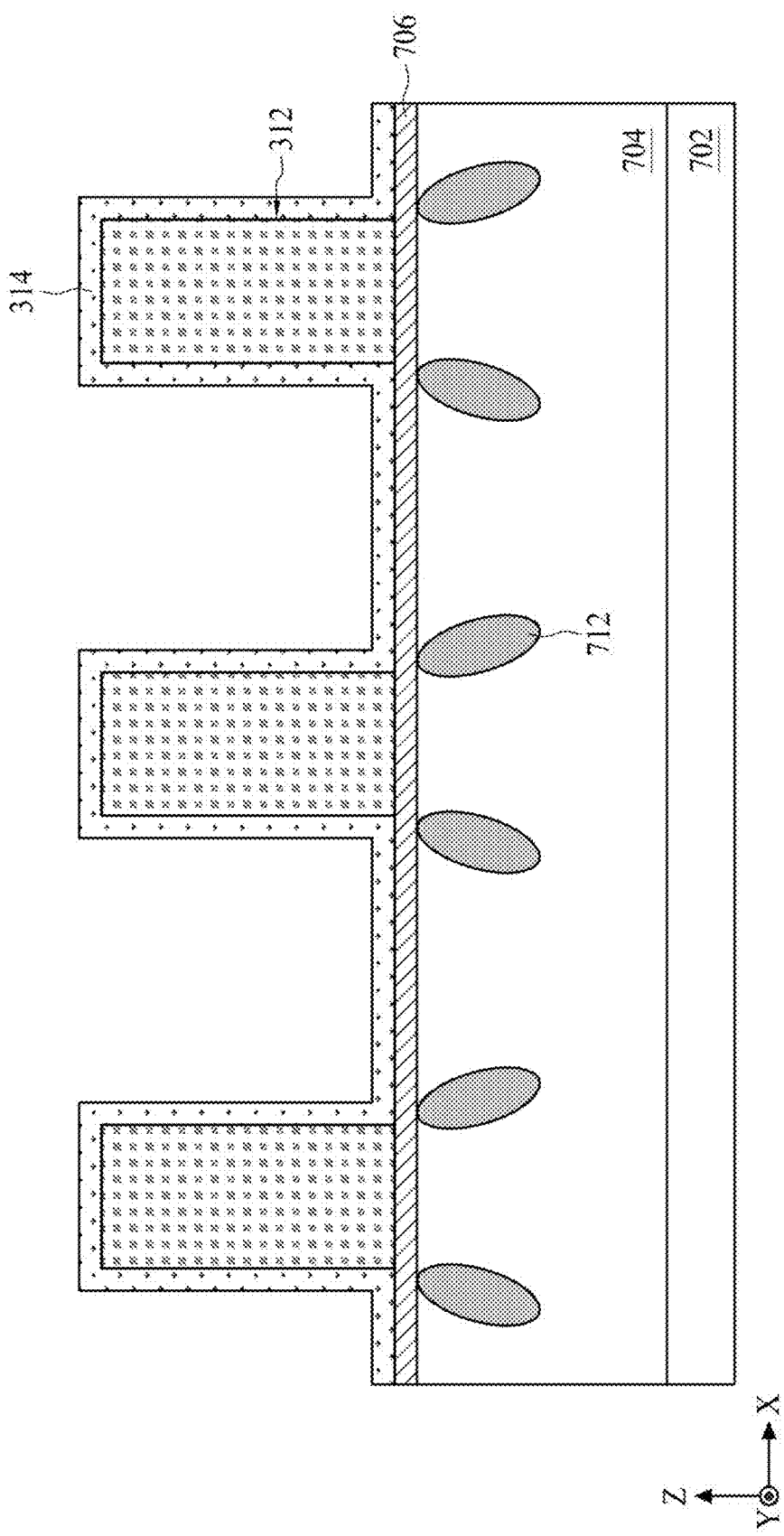

Referring to FIG. 32 and FIG. 34, the method 1000 proceeds to step S1018 to form the second hard mask layer 314 above the protective layer 706 and the first patterned hard mask 312. The thickness of the second hard mask layer 314 is less than the thickness of the first hard mask layer 312, and the second hard mask layer 314 is substantially conformal to the shapes of the protective layer 706 and the first patterned hard mask 312.

Figure 35:
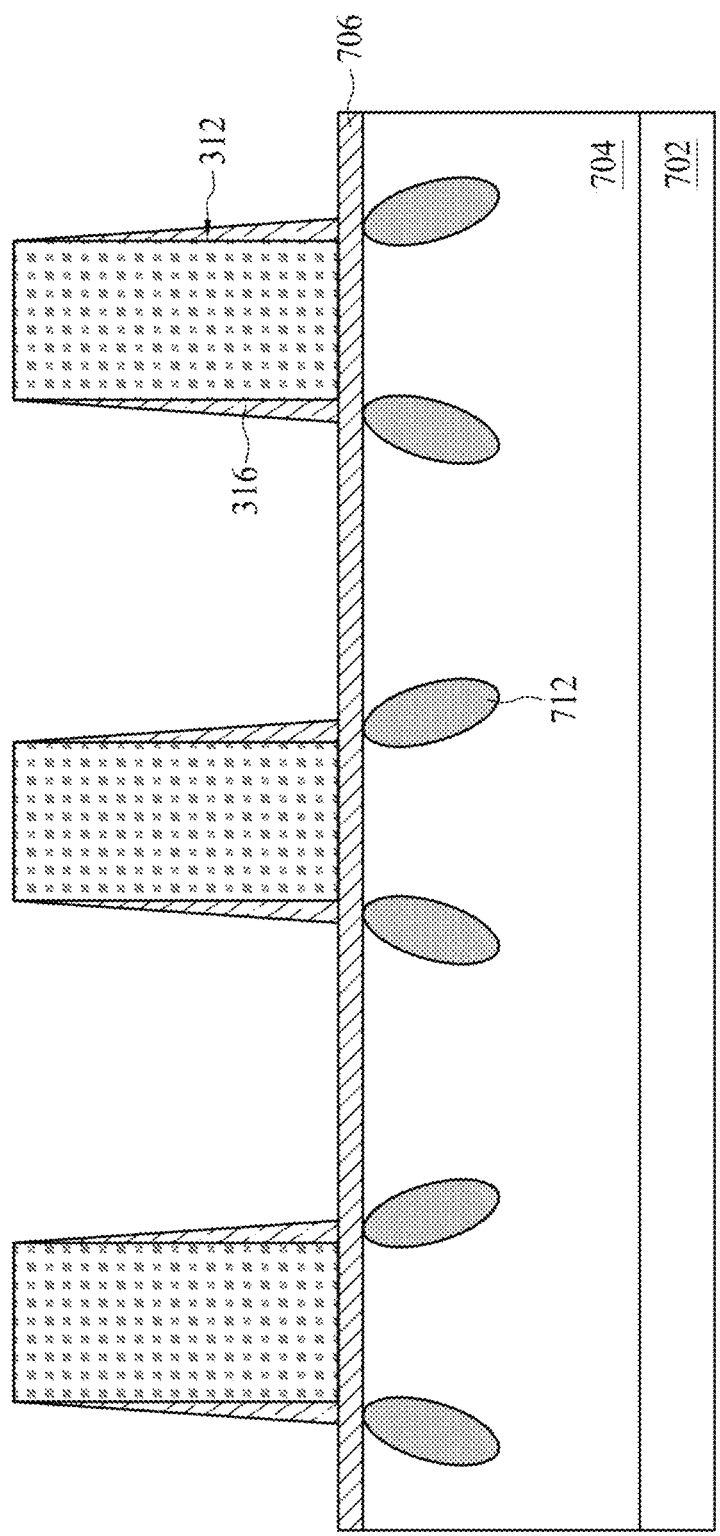

Referring to FIG. 32 and FIG. 35, in step S1020, the second hard mask layer 314 may be anisotropically etched to form the second patterned hard mask 316 surrounding the first patterned hard mask 312. The anisotropic etching can remove portions of the second hard mask layer 314 that are disposed on the top surface of the protective layer 706 and on the top surface of the first patterned hard mask 312, leaving behind the portions of the second hard mask layer 314 that are on the sidewalls of the first patterned hard mask 312, as the second patterned hard mask 316.

Figure 36:
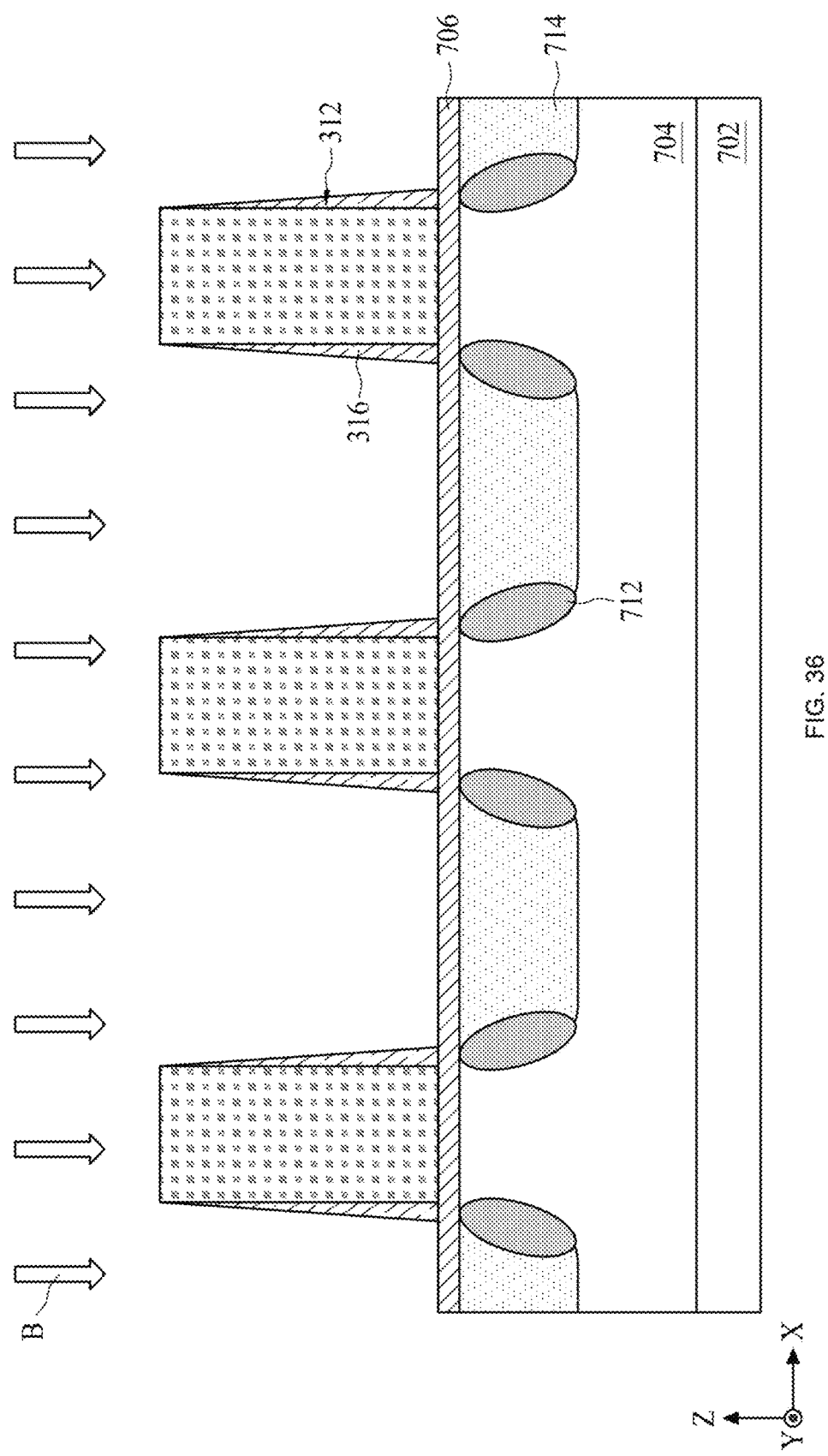

Referring to FIGS. 32 and 36, in step S1022, the first patterned hard mask 312 and the second patterned hard mask 316 are used as shielding layers to perform a second implantation process to form the well regions 714 in the epitaxial layer 704. The second implantation process implants P-type impurities into the epitaxial layer 704, thereby forming the P-type well regions 714. In some embodiments, the second implant process implants impurities into the epitaxial layer 704 at an implantation tilt angle θ of approximately 0 degree.

Figure 37:
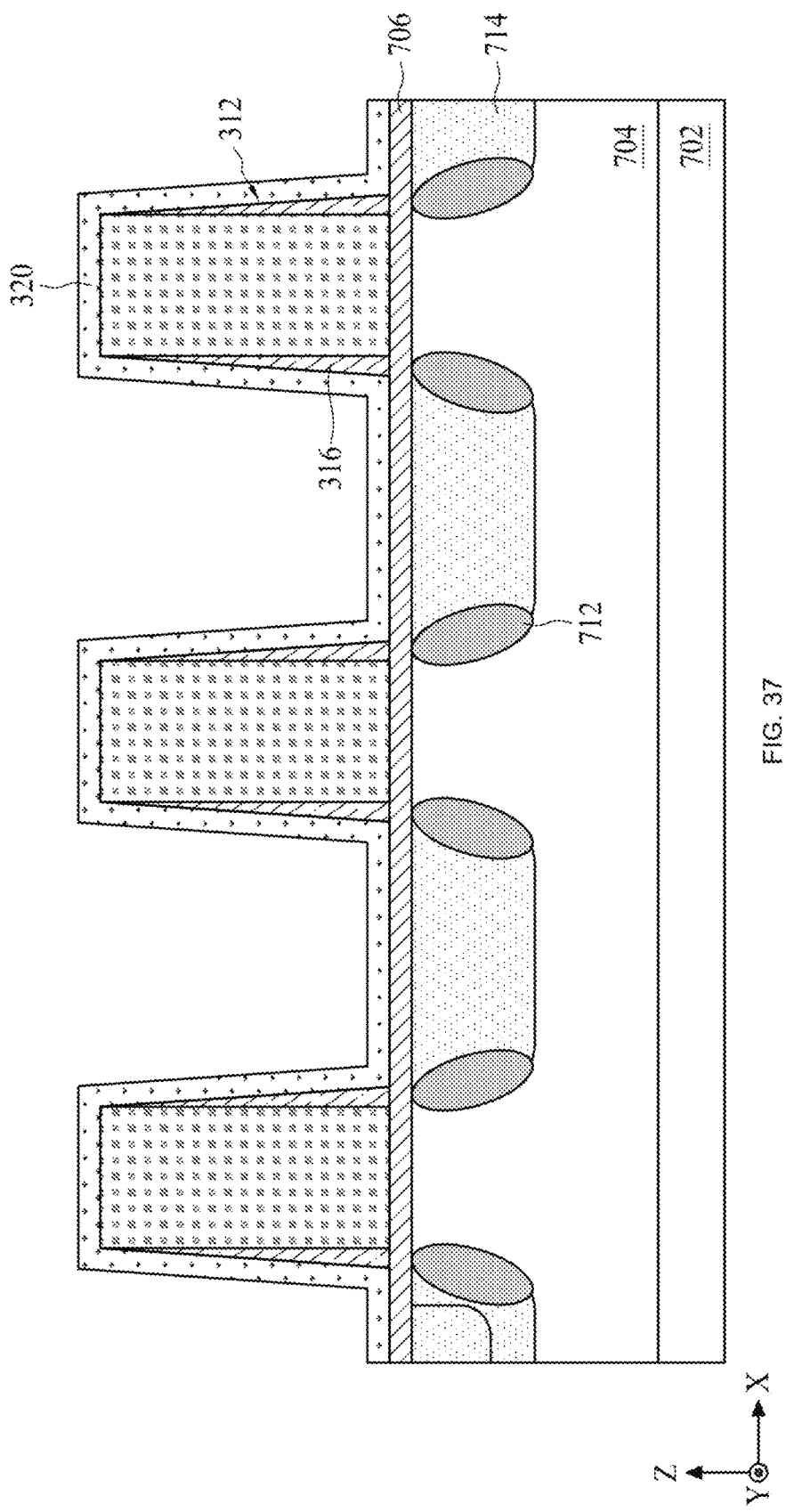

Refer to FIG. 32 and FIG. 37. The method 1000 proceeds to step S1024, to form a third hard mask layer 320 above the protective layer 706, the first patterned hard mask 312 and the second patterned hard mask 316. The thickness of the third hard mask layer 320 is less than the thickness of the first patterned hard mask layer 310, and the third hard mask layer 320 is substantially conformal to the shapes of the protective layer 706, the first patterned hard mask 310 and the second patterned hard mask 314.

Figure 38:
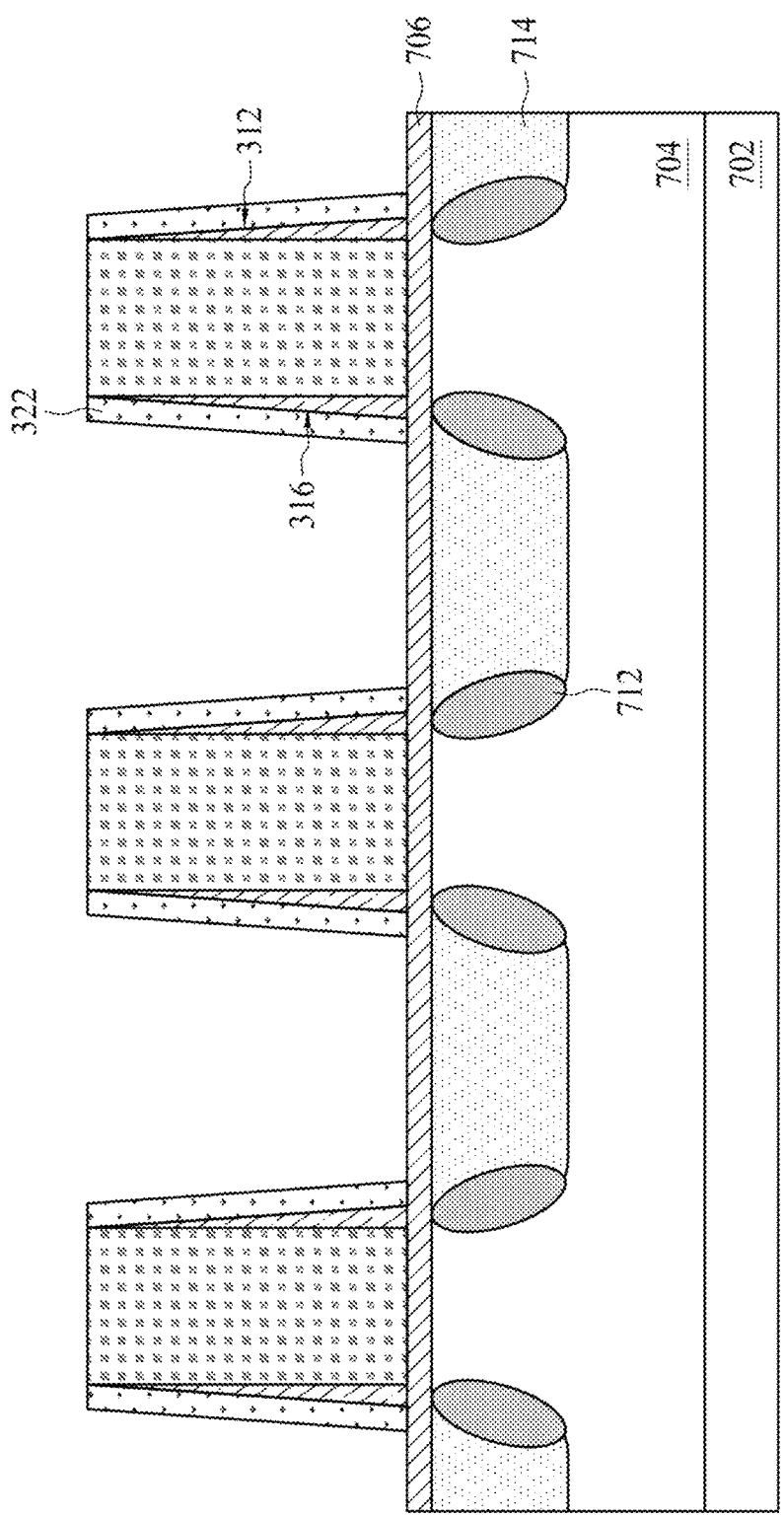

Referring to FIGS. 32 and 38, in step S1026, the third hard mask layer 320 may be anisotropically etched to form a third patterned hard mask 322 surrounding the second patterned hard mask 316. The anisotropic etching can remove portions of the third hard mask layer 320 that are disposed on the top surface of the protective layer 706, on the top surface of the first patterned hard mask 312 and on the top surface of the second patterned hard mask 316, leaving the portions of the third hard mask layer 320 that are located on the sidewalls of the second patterned hard mask 316, as the third patterned hard mask 322.

Figure 39:
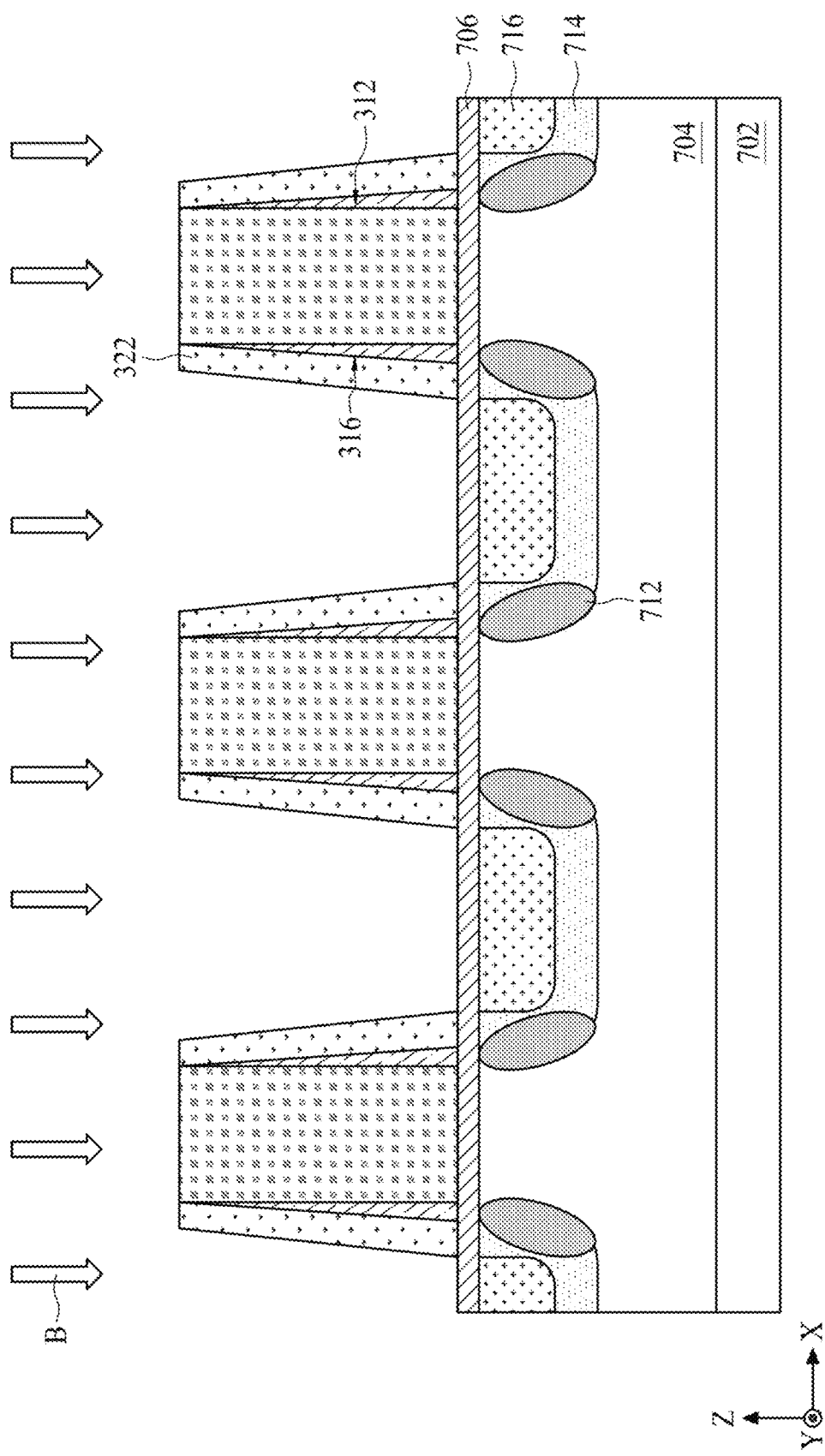

Referring to FIGS. 32 and 39, in step S1028, a third implantation process may be performed using the first patterned hard mask 312, the second patterned hard mask 316, and the third patterned hard mask 322, to form the heavily doped regions 716 in the well regions 714. The third implantation process may be used to inject N-type impurities into the epitaxial layer 704, thereby forming the N-type heavily doped regions 716. The heavily doped regions 716 may partially overlap the well regions 714. In some embodiments, the third implant process may perform impurity implantation by positioning the ion beam B in a direction approximately perpendicular to the top surface of the epitaxial layer 704.

Afterwards, the first patterned hard mask 312, the second patterned hard mask 316 and the third patterned hard mask 332 may be removed. In some embodiments, the first patterned hard mask 312, the second patterned hard mask 316 and the third patterned hard mask 330 may be removed by use of, for example, a wet etching process or a planarization process. The method 1000 may further include steps S228 to S234 as shown in FIG. 2, which may be used to form the gate dielectric layer 722, the gate electrode 724, the source region 726A, the drain region 726B, the metal silicide regions 730 and the interconnection structure 740 as shown in FIG. 25. For the related specific implementation process, reference may be made to the above description about the steps S228 to S234, which will not be described again here.

Figure 40:
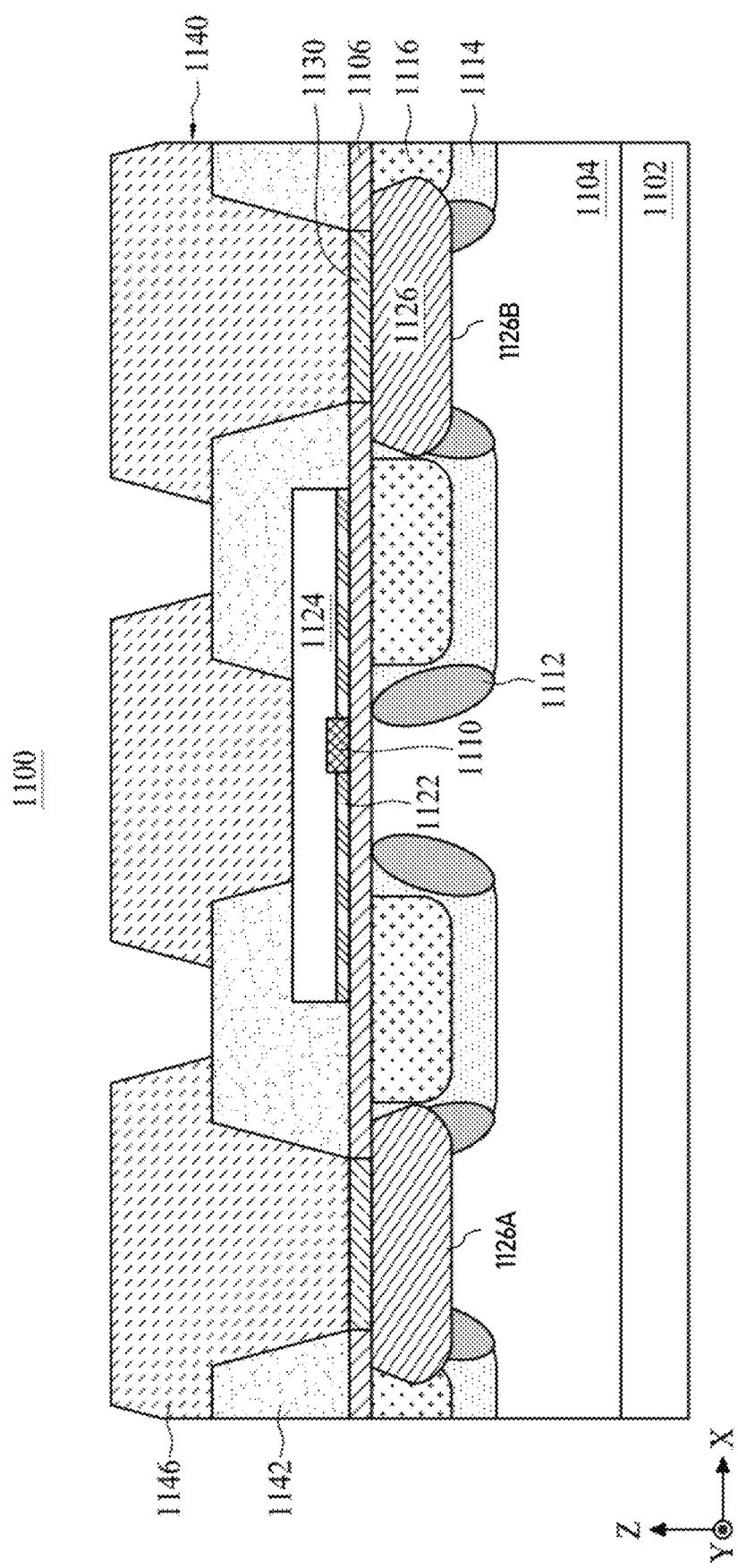
FIG. 40 is a schematic cross-sectional view of another semiconductor structure in accordance with some embodiments of the present disclosure.

FIG. 40 is a schematic cross-sectional view of an example semiconductor structure 1100 in accordance with some embodiments of the present disclosure. Referring to FIG. 40, the semiconductor structure 1100 may include a substrate 1102, an epitaxial layer 1104, a protective layer 1106, a buried oxide (BOX) layer 1110, a plurality of hot carrier adjustment regions 1112, a plurality of well regions 1114, a plurality of heavily doped regions 1116, a gate dielectric layer 1122, a gate electrode 1124, a source region 1126A and a drain region 1126B (marked by 1126 in FIG. 40), metal silicide regions 1130 and an interconnect structure 1140. In some embodiments, the heavily doped regions 1116 may also be called a first doped region, the well regions 1114 may also be called a second doped region, and the hot carrier adjustment regions 1112 may also be called a third doped region.

The substrate 1102 is a semiconductor substrate, and the epitaxial layer 1104 is disposed on the substrate 1102. The substrate 1102 and the epitaxial layer 1104 may include silicon carbide. The hot carrier adjustment regions 1112, the well regions 1114, the heavily doped regions 1116, the source region 1126A and the drain region 1126B may respectively be provided in the epitaxial layer 1104. The protective layer 1106, the buried oxide layer 1110, the gate dielectric layer 1122, the gate electrode 1124, the metal silicide regions 1130 and the interconnect structure 1140 may respectively be disposed above the epitaxial layer 1104.

The plurality of well regions 1114 in the semiconductor structure 1100 may be separated from each other in the first direction X. Each heavily doped region 1116 may be surrounded by one well region 1114. The well regions 1114 may include P-type impurities, and the heavily doped region 1116 may include N-type impurities. Each hot carrier adjustment region 1112 may, for example, extend along the sidewall of a corresponding well region 1114. A portion of each hot carrier adjustment region 1112 may overlap an undoped portion of the epitaxial layer 1104.

The gate dielectric layer 1122 and the gate electrode 1124 may be sequentially disposed on the protective layer 1106, and may continuously extend from a first position that is at approximately the middle of a heavily doped region 1116 to a second position that is at approximately the middle of an adjacent heavily doped region 1116. The buried oxide layer 1110 may extend through the gate dielectric layer 1122 and contacts the protective layer 1106. In some embodiments, the buried oxide layer 1110 may be disposed above a position in the epitaxial layer 1104 where no well region 1114 is present. The buried oxide layer 1110 may extend into the gate electrode 1124. The thickness of the buried oxide layer 1110 may range from about 10 angstroms to about 20,000 angstroms, and the width of the buried oxide layer 1110 may range from about 500 angstroms to about 4,000 angstroms.

The source regions 1126A and the drain region 1126B are provided in the epitaxial layer 1104 at opposite ends of the gate electrode 1124. In some embodiments, the source region 1126A may partially overlap the hot carrier adjustment regions 1112, the well regions 1114, and the heavily doped regions 1116 that are located to the left side of the gate electrode 1124, and the drain region 1126B may partially overlap the hot carrier adjustment regions 1112, the hot carrier adjustment regions 1112, the well regions 1114 and the heavily doped region 1116 that are located to the right side of the electrode 1124 overlap. The metal silicide regions 1130 may be formed in the protective layer 1106, and may contact the source region 1126A and the drain region 1126B.

The interconnect structure 1140 may be disposed above the protective layer 1106, the gate electrode 1124 and the metal silicide regions 1130, and may include an interlayer dielectric layer 1142 and a plurality of conductive features 1146. Conductive features 1146 may be physically and electrically connected to the gate electrode 1124 and the metal silicide regions 1130. The interlayer dielectric layer 1142 covers the protective layer 1106, the metal silicide regions 1130 and the gate electrode 1124, and surrounds at least lower portions of the conductive features 1146.

Figure 41:
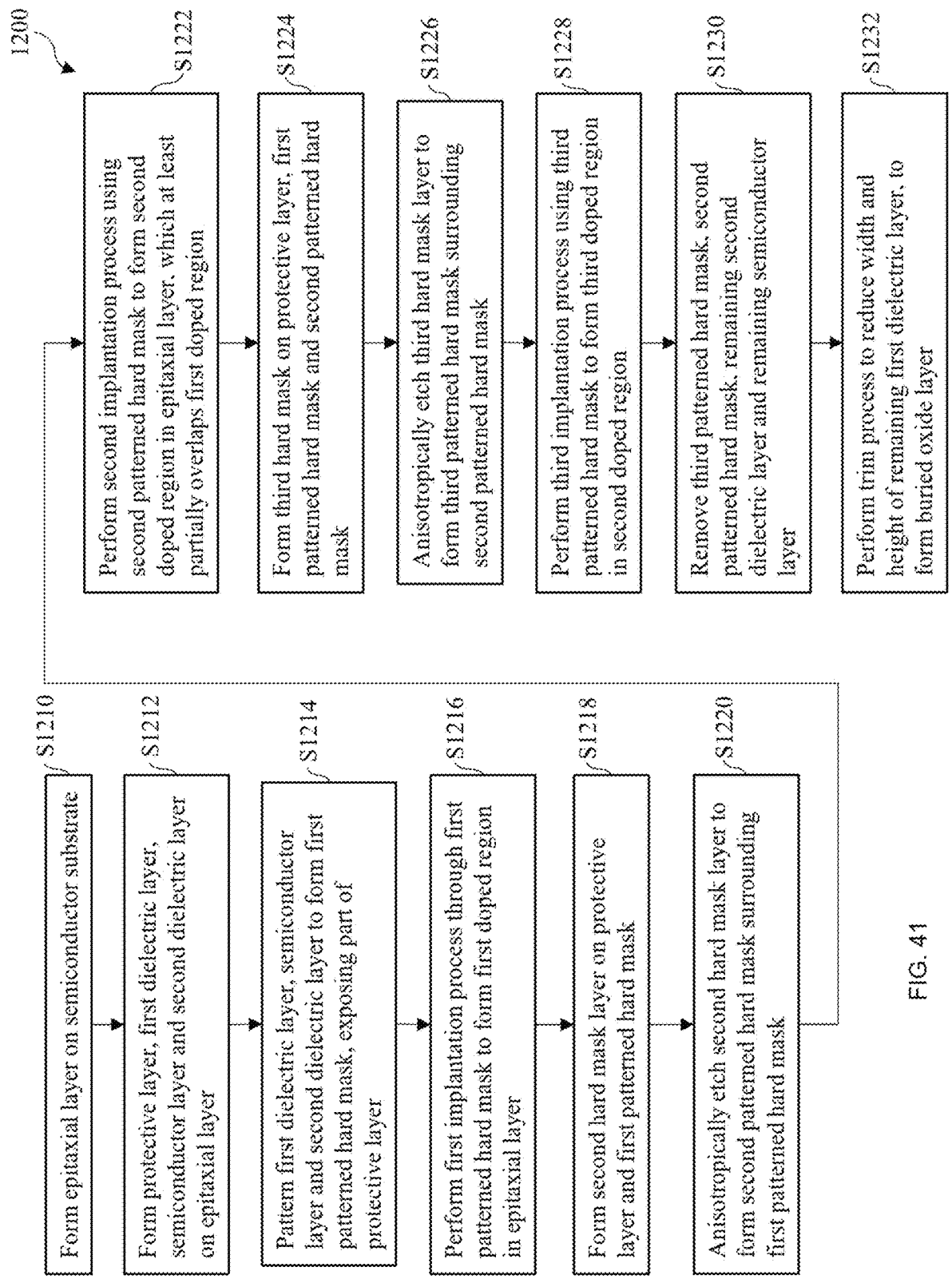
FIG. 41 is a flowchart of another method of fabricating a semiconductor structure according to some embodiments of the present disclosure.

FIG. 41 is a flowchart of an example method 1200 of fabricating the semiconductor structure 1100 in accordance with some embodiments of the present disclosure. The method 1200 is an example only, and is not intended to limit the disclosure beyond the scope expressly recited in the claims. Additional steps may be provided before, between, and after the method 1200, and some of the steps described may be moved, replaced, or omitted for providing additional embodiments of the method 1200. The method 1200 will be described below in conjunction with further figures showing schematic cross-sectional views during various intermediate steps of the method 1200.

Figure 42:
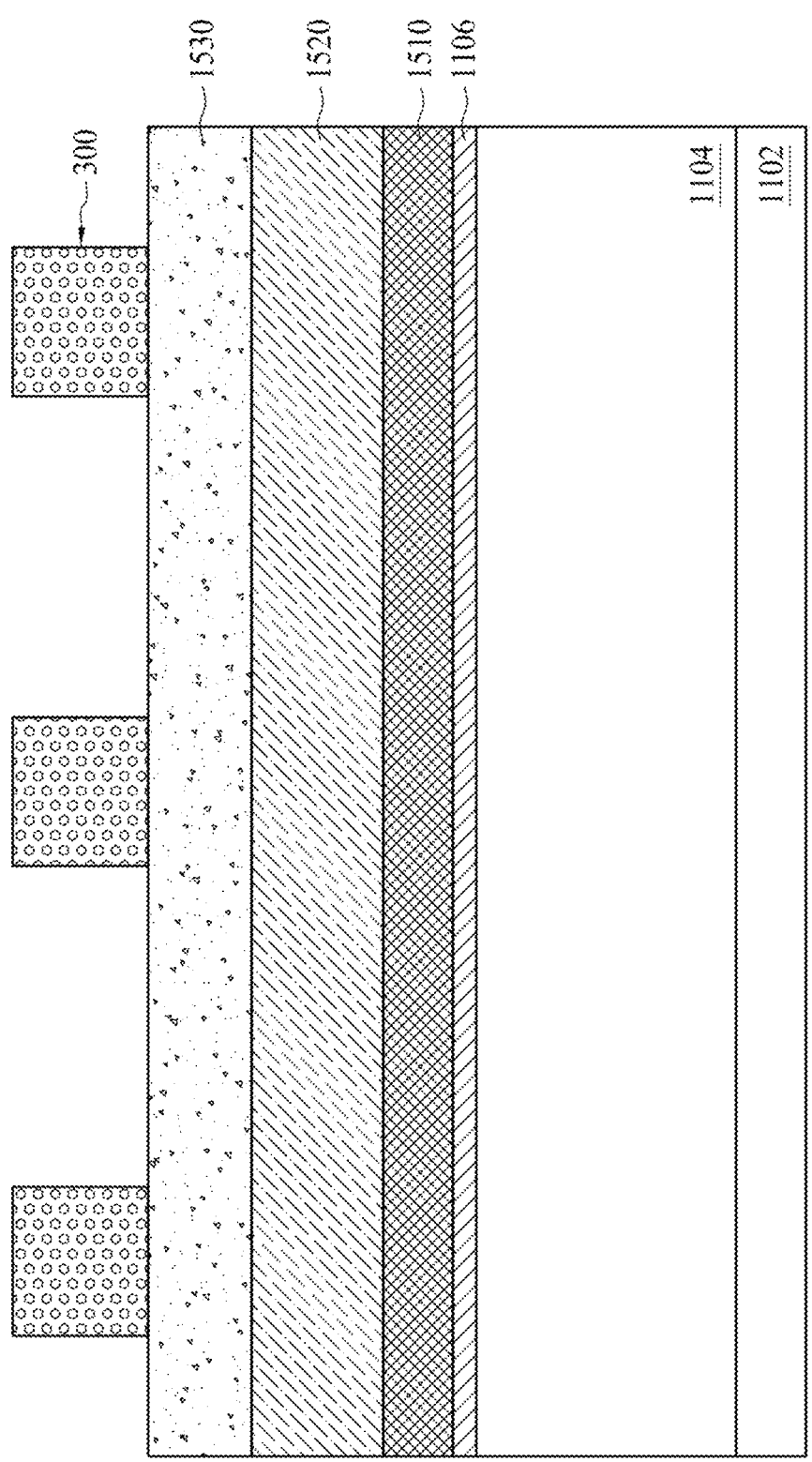
FIG. 42 to FIG. 52 are schematic cross-sectional views of various intermediate steps in a fabrication process of a semiconductor structure according to some embodiments of the present disclosure.

Referring to FIGS. 41 and 42, in step S1210, the epitaxial layer 1104 is formed on the semiconductor substrate 1102. The substrate 1102 and the epitaxial layer 1104 may include semiconductor materials, such as silicon carbide. The epitaxial layer 1104 may be formed using a suitable process.

In step S1212, the protective layer 1106, a first dielectric layer 1510, a semiconductor layer 1520 and a second dielectric layer 1530 are formed on or above the epitaxial layer 1104. The protective layer 1106 may be a dielectric layer. The protective layer 1106 may be made of a low-k dielectric material. The semiconductor layer 1520 may include polysilicon. The melting point of the first dielectric layer 1510 may be higher than the melting point of the second dielectric layer 1530. In some embodiments, the first dielectric layer 1510 may include high temperature resistant dielectric materials, such as silicon nitride, hafnium dioxide, zirconium dioxide, aluminum oxide, and so on. The second dielectric layer 1530 may include silicon dioxide. The first dielectric layer 1510, the semiconductor layer 1520, and the second dielectric layer 1530 each have a thickness between about 500 angstroms and about 30,000 angstroms.

A patterned photoresist layer 300 may be formed on the second dielectric layer 1530. The patterned photoresist layer 300 exposes some portions of the second dielectric layer 1530.

Figure 43:
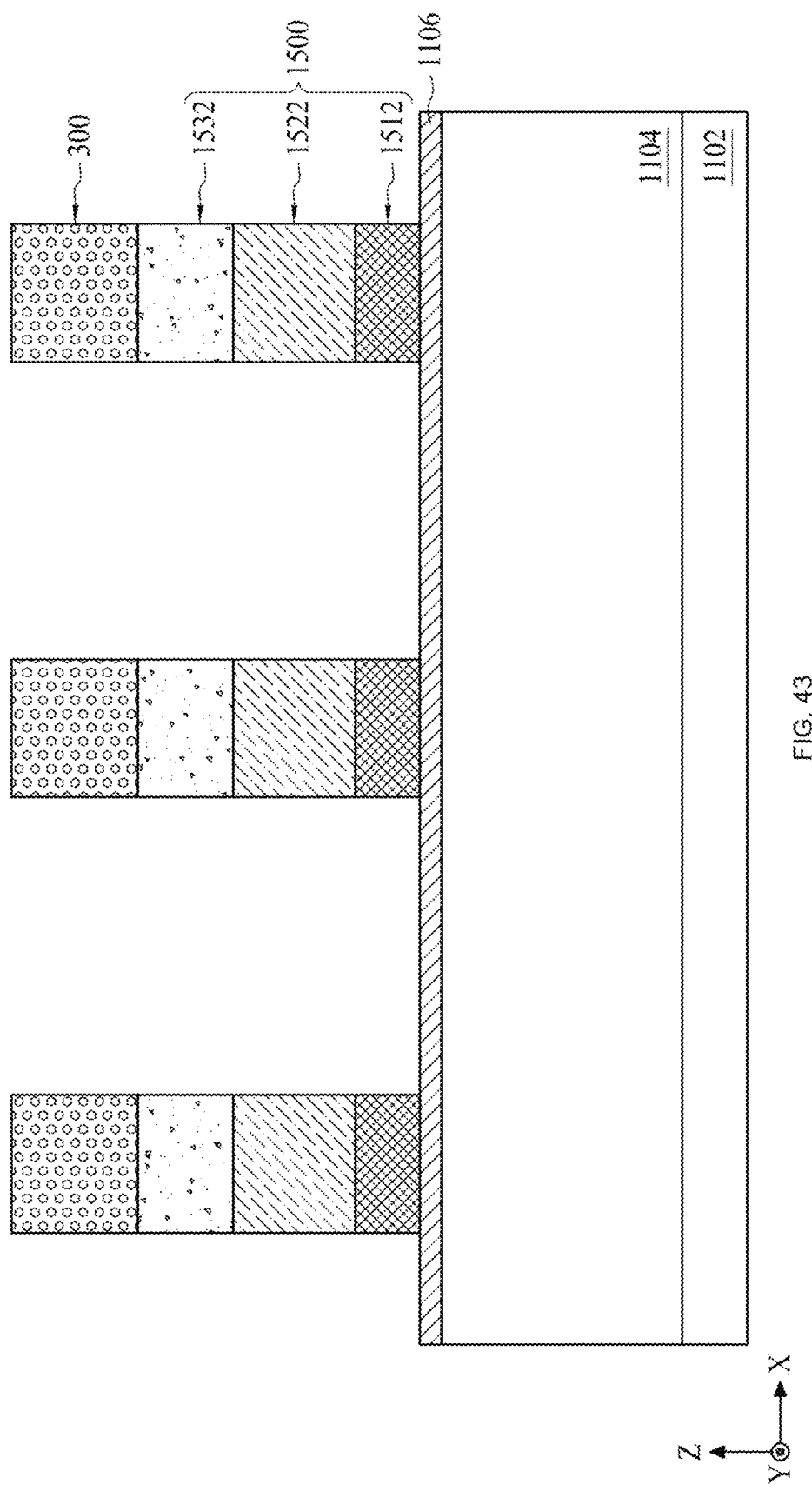

Referring to FIGS. 41 to 43, in step S1214, an etching process may be performed using the patterned photoresist layer 300 as an etching mask to remove portions of the first dielectric layer 1510, the semiconductor layer 1520 and the second dielectric layer 1530 that are not covered by the patterned photoresist layer 300, thereby forming a first patterned hard mask 1500. The first patterned hard mask 1500 is composed of a remaining portion 1512 of the first dielectric layer 1510, a remaining portion 1522 of the semiconductor layer 1520, and a remaining portion 1532 of the second dielectric layer 1530 after the etching process is completed. In some embodiments, one or more etching processes may be performed to sequentially remove portions of the second dielectric layer 1530, the semiconductor layer 1520 and the first dielectric layer 1510 that expose the patterned photoresist layer 300 until the protection layer 1106 is reached and exposed. The etching processes may include performing a wet etching process, a dry etching process, another suitable etching process, or any combination of the foregoing processes. The patterned photoresist layer 300 may then be removed, for example, in an ashing or stripping process.

Figure 44:
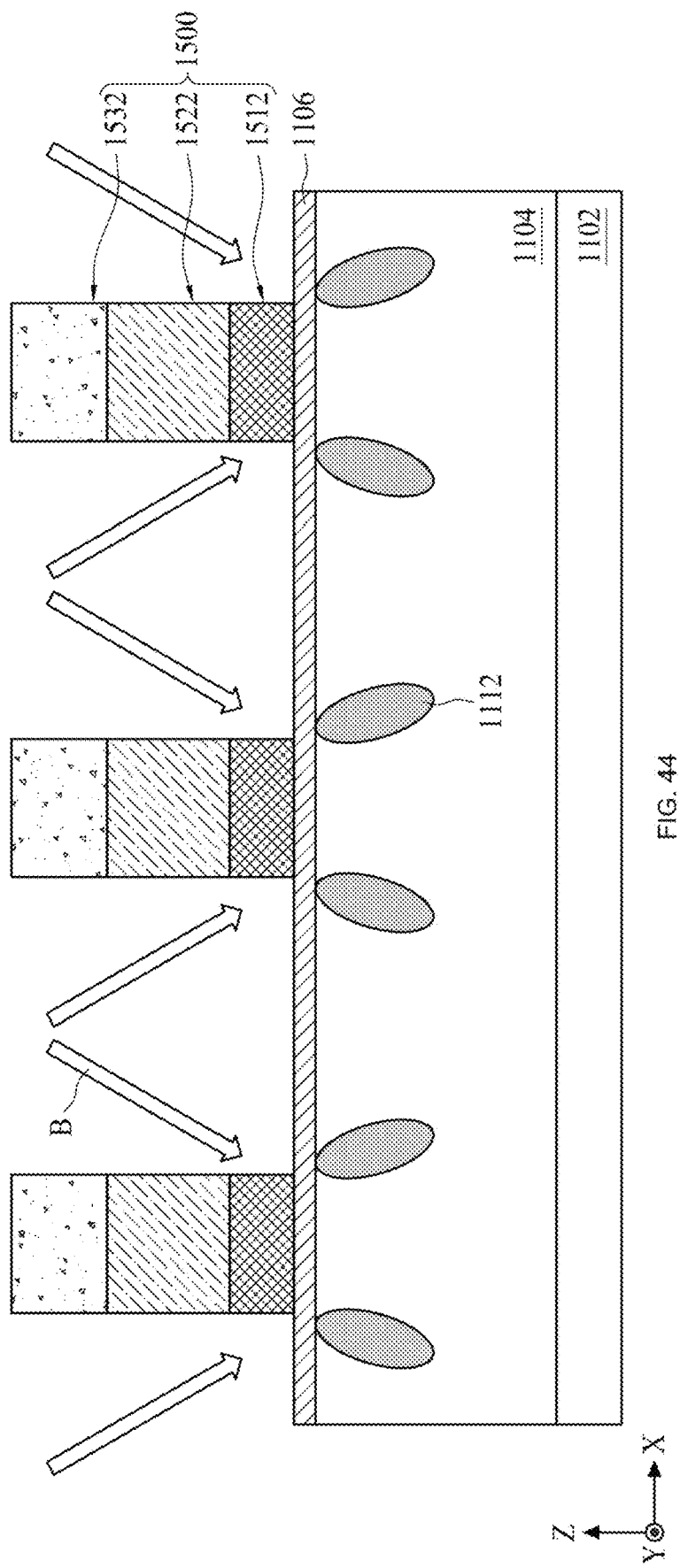

Referring to FIGS. 41 and 44, in step S1216, a first implantation process may be performed using the first patterned hard mask 1500 as a shield the layer, to form the plurality of hot carrier adjustment regions 1112 in the epitaxial layer 1104. The first implantation process is used to implant, in an ion acceleration manner, specific impurity atoms at positions on two sides of the bottom of each portion of the first patterned hard mask 1500. In some embodiments, the impurity atoms may be selected from the nitrogen family, the boron family, or boron difluoride. The first implantation process may be performed at room temperature, or the first implantation process may be a hot implantation process.

Figure 45:
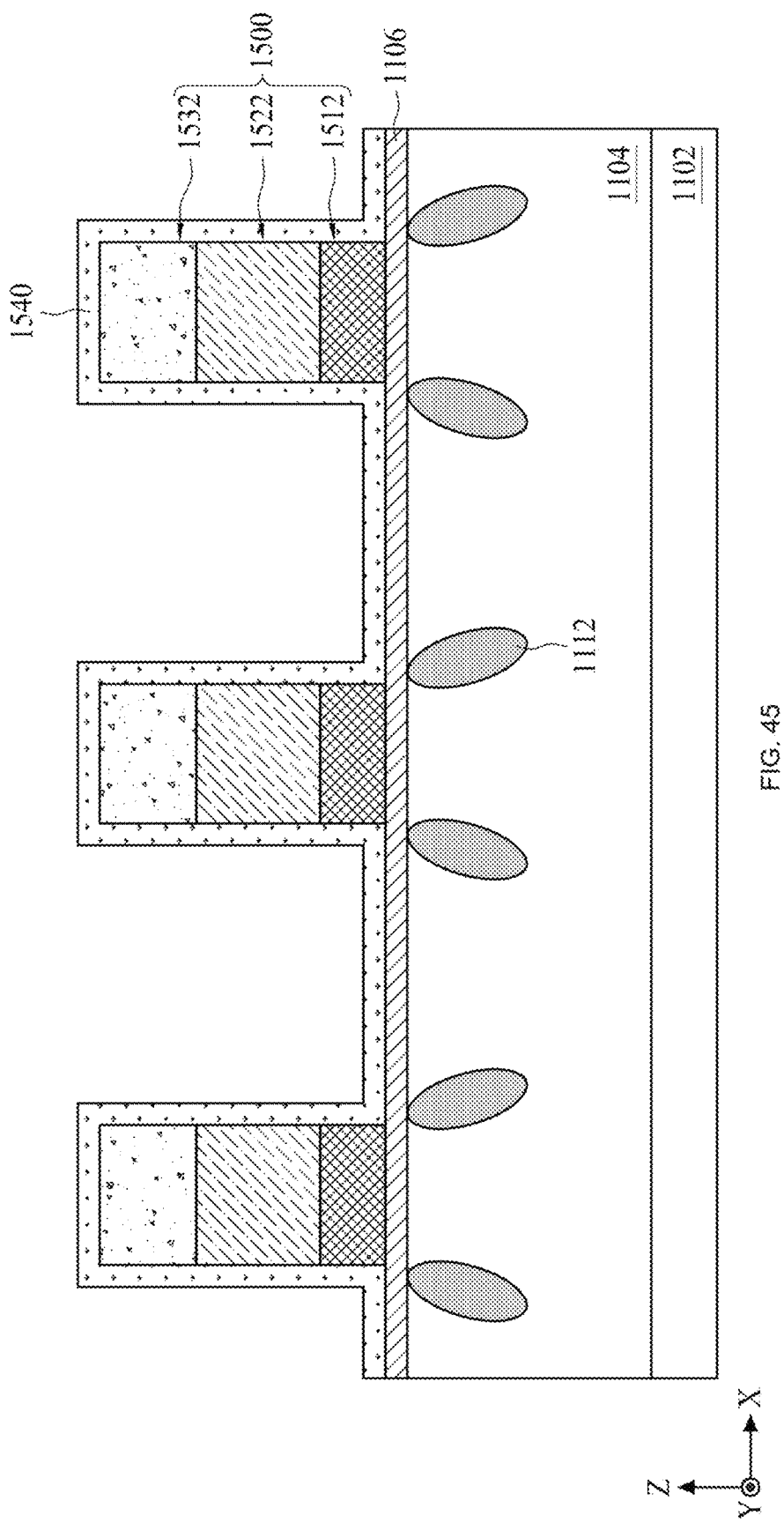

Referring to FIG. 41 and FIG. 45, in step S1218, a second hard mask layer 1540 may be formed above the protective layer 1106 and the first patterned hard mask 1500. The thickness of the second hard mask layer 1540 may be less than the thickness of the first hard mask layer 1500. The second hard mask layer 1540 may be substantially conformal to the shapes of the protective layer 1106 and the first patterned hard mask 1500.

Figure 46:
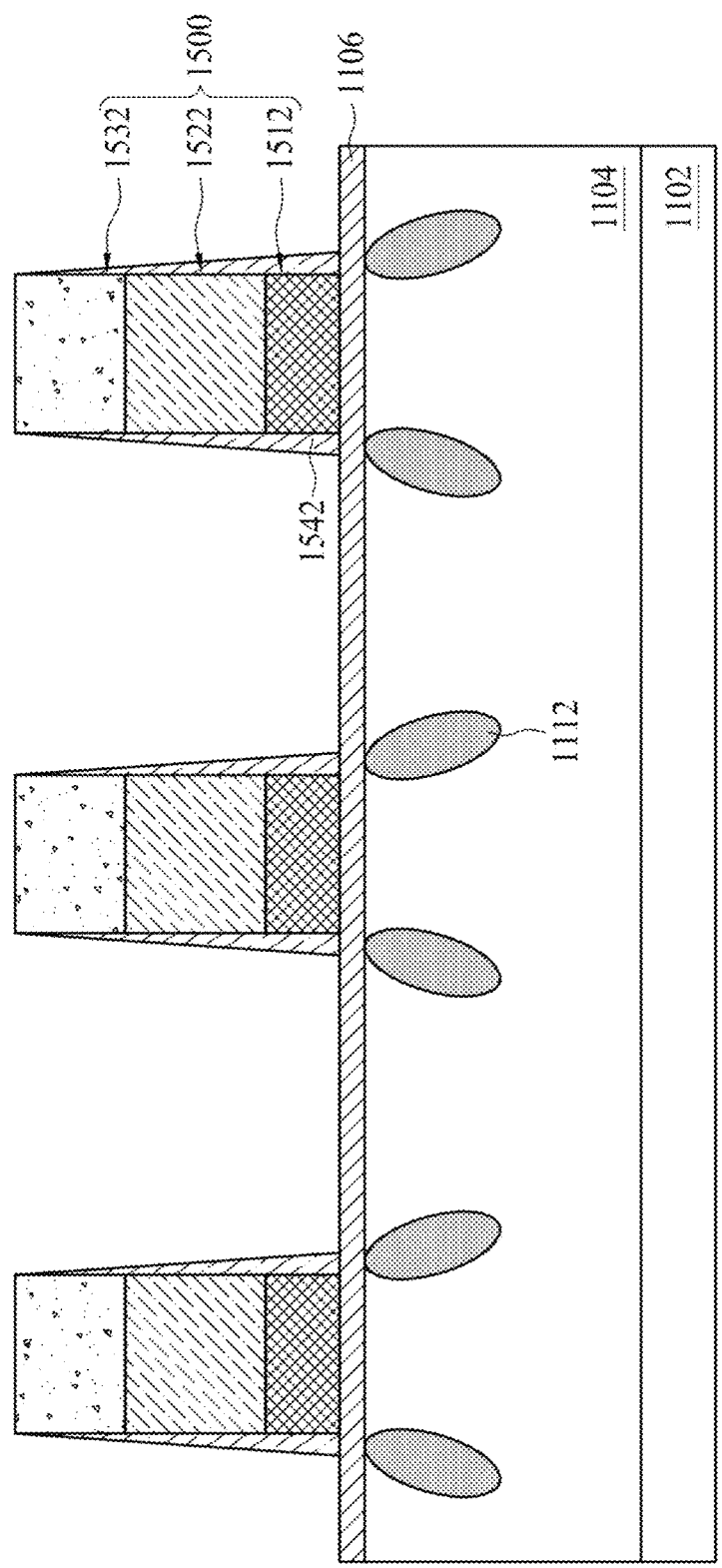

Referring to FIGS. 41 and 46, in step S1220, the second hard mask layer 1540 may be anisotropically etched to form a second patterned hard mask 1542 surrounding the first patterned hard mask 1500. The anisotropic etching may remove portions of the second hard mask layer 1540 that are disposed on the top surface of the protective layer 1106 and the top surface of the first patterned hard mask 1500, leaving the second hard mask layer 1540 that are located on the sides of the first patterned hard mask 1500, as the second patterned hard mask 1542. In some embodiments, the width of the second patterned hard mask 1542 is between about 500 angstroms and about 10,000 angstroms.

Figure 47:
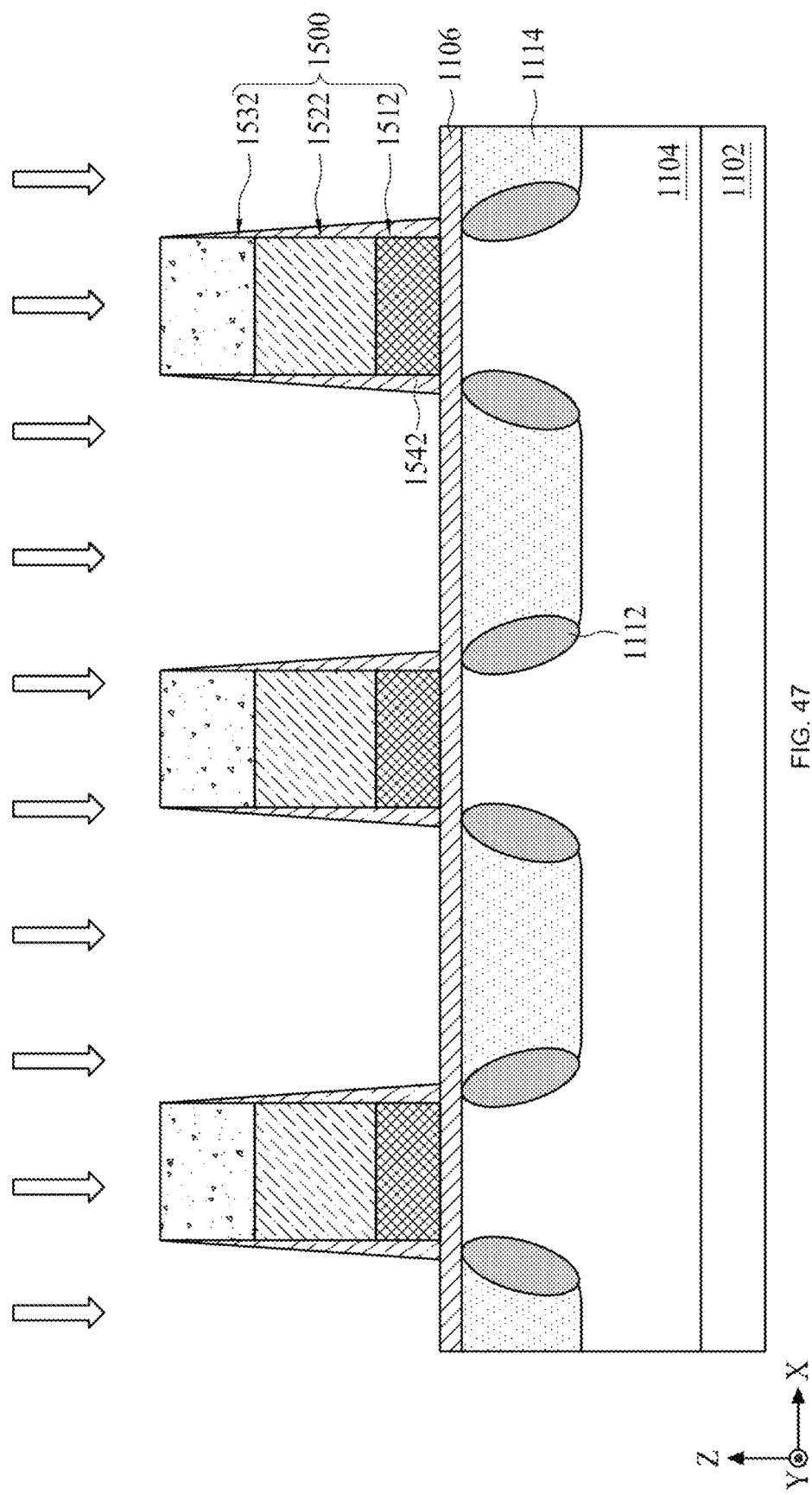

Referring to FIGS. 41 and 47, in step S1222, using the first patterned hard mask 1500 and the second patterned hard mask 1542 as shielding layers, a second implantation process may be performed to form the well regions 1114 in the epitaxial layer 1104. The second implantation process implants P-type impurities into the epitaxial layer 1104, thereby forming the P-type well regions 1114. In some embodiments, the second implant process implants impurities into the epitaxial layer 1104 through an implantation tilt angle θ of approximately 0 degree.

Figure 48:
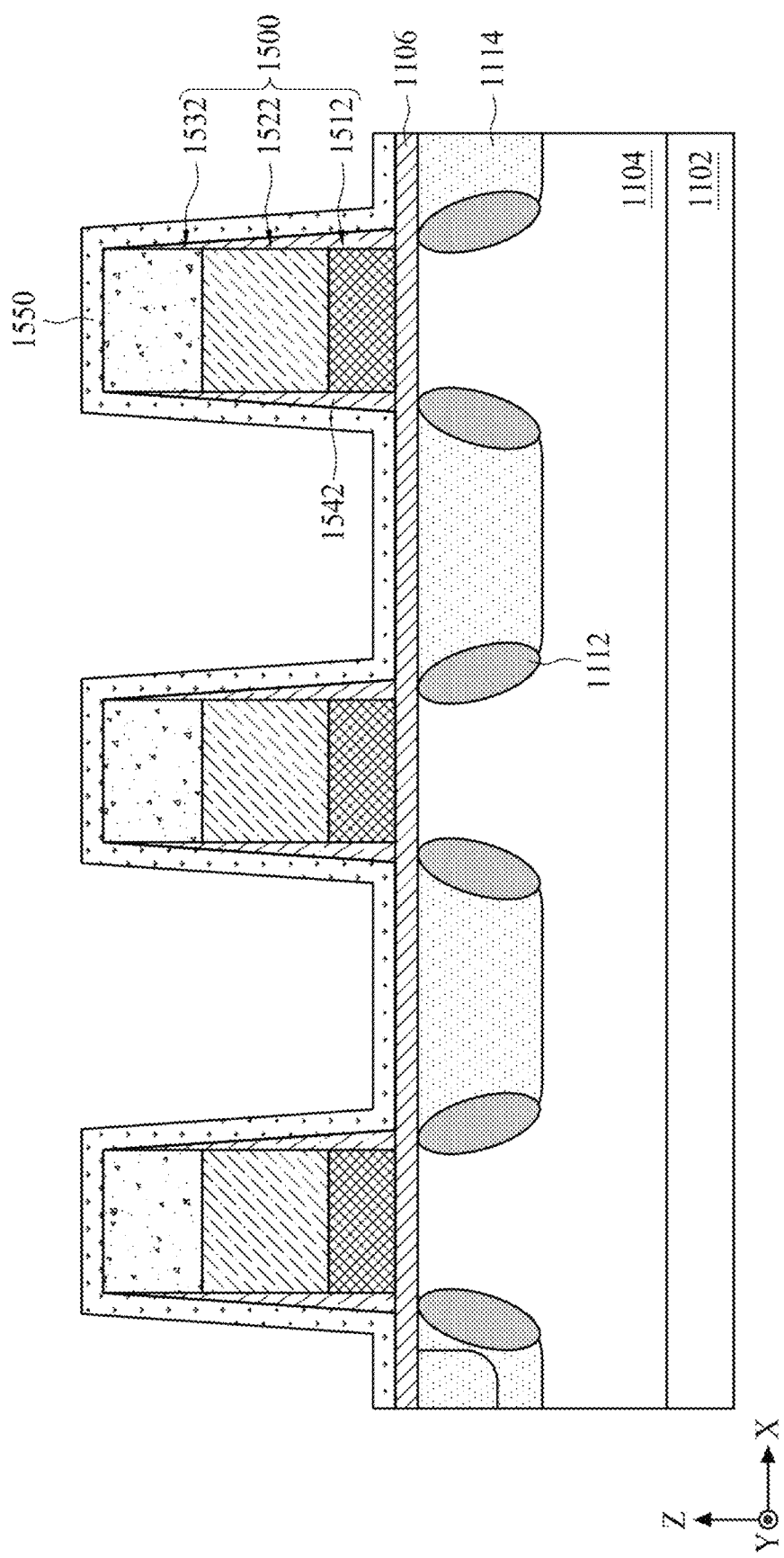

Referring to FIG. 41 and FIG. 48, in step S1224, a third hard mask layer 1550 may be formed above the protective layer 1106, the first patterned hard mask 1500 and the second patterned hard mask 1542. The third hard mask layer 1550 has substantially the same thickness as the protective layer 1106, and the thickness of the third hard mask layer 1550 is smaller than the thickness of the first patterned hard mask 1500. In some embodiments, the third hard mask layer 1550 may substantially be conformal to the shapes of protective layer 1106, the first patterned hard mask 1500, and the second patterned hard mask 1542.

Figure 49:
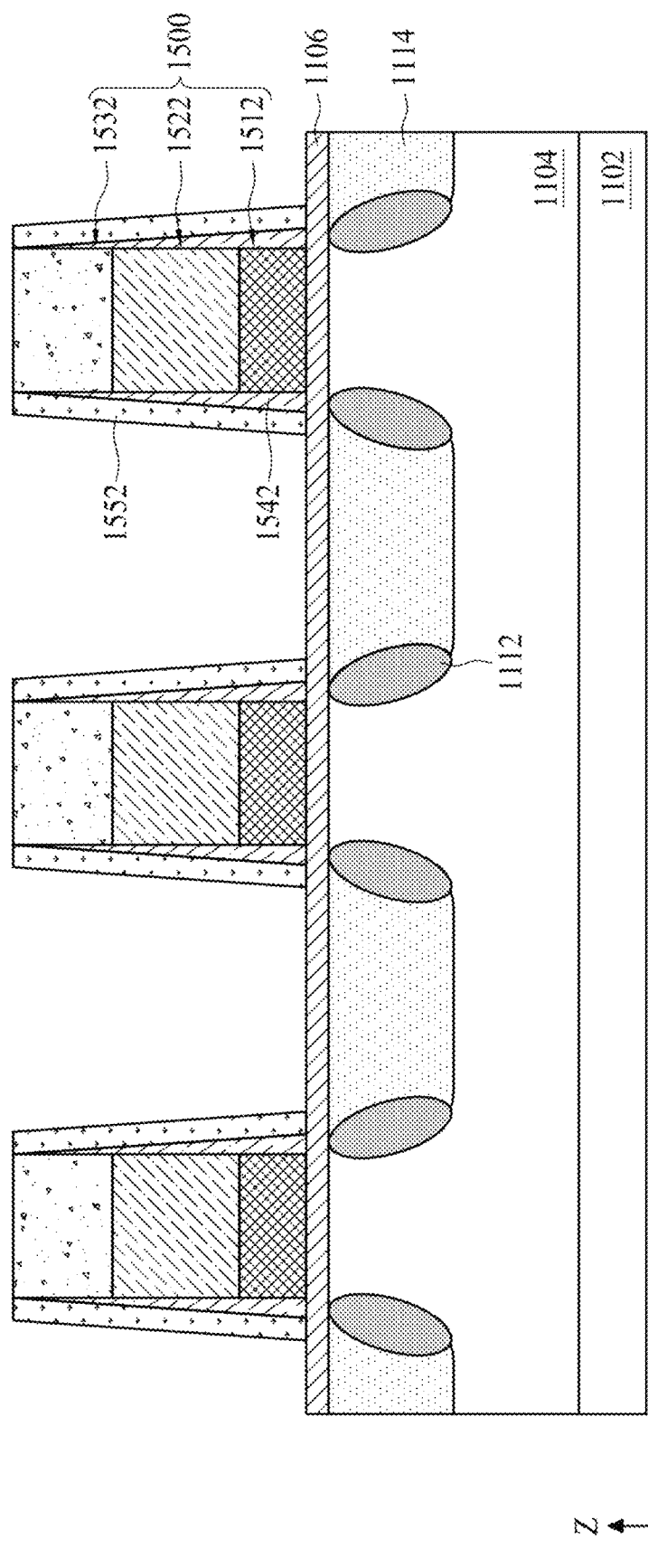

Referring to FIGS. 41 and 49, in step S1226, the third hard mask layer 1550 may be anisotropically etched to form a third patterned hard mask 1552 surrounding the second patterned hard mask 1542. The anisotropic etching may remove the portions of the third hard mask layer 1550 that are disposed on the top surface of the protective layer 706, the top surface of the first patterned hard mask 1500, and the top surface of the second patterned hard mask 1542, and the portions of the third hard mask layer 1550 remained on the sides of the second patterned hard mask 1542 are left as the third patterned hard mask 1552.

Figure 50:
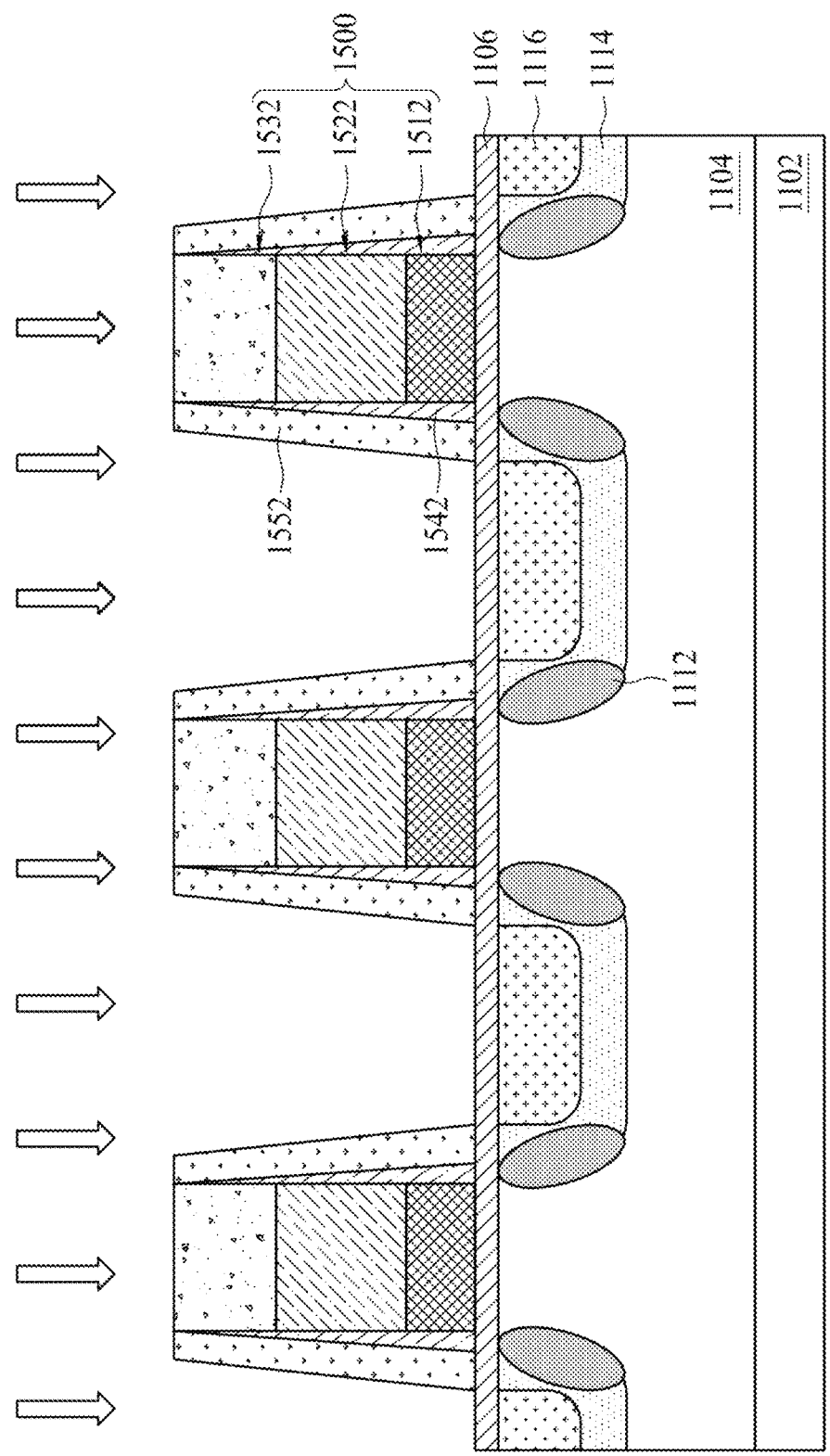

Referring to FIGS. 41 and 50, in step S1228, a third implantation process may be performed using the first patterned hard mask 1500, the second patterned hard mask 1540, and the third patterned hard mask 1552 to form the heavily doped regions 1116 in the well regions 1114. In some embodiments, the third implantation process may be used to implant N-type impurities into the epitaxial layer 1104. The heavily doped regions 1116 may partially overlap the well regions 1112. In some embodiments, the third implant process performs impurity implantation by arranging the ion beam B in a direction approximately perpendicular to the top surface of the epitaxial layer 1104.

Figure 51:
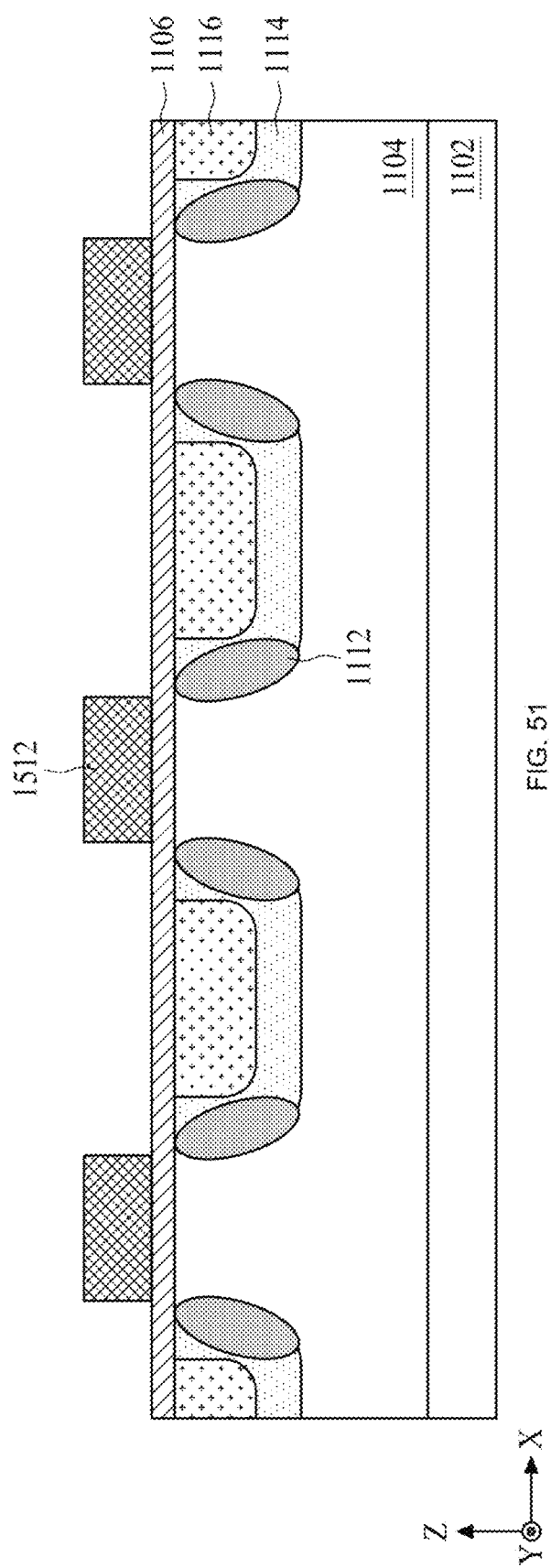

Referring to FIGS. 41 and 51, in step S1230, the third patterned hard mask 1552, the second patterned hard mask 1542, the remaining portion 1532 of the second dielectric layer 1530 and the remaining portion 1522 of the semiconductor layer 1520 are removed. In some embodiments, the third patterned hard mask 1552, the second patterned hard mask 1542, the remaining portion 1532 of the second dielectric layer 153, and the remaining portion 1522 of the semiconductor layer 1520 may be removed by using an etching process or a planarization process, and the remaining first dielectric layer 1512 is exposed.

Figure 52:
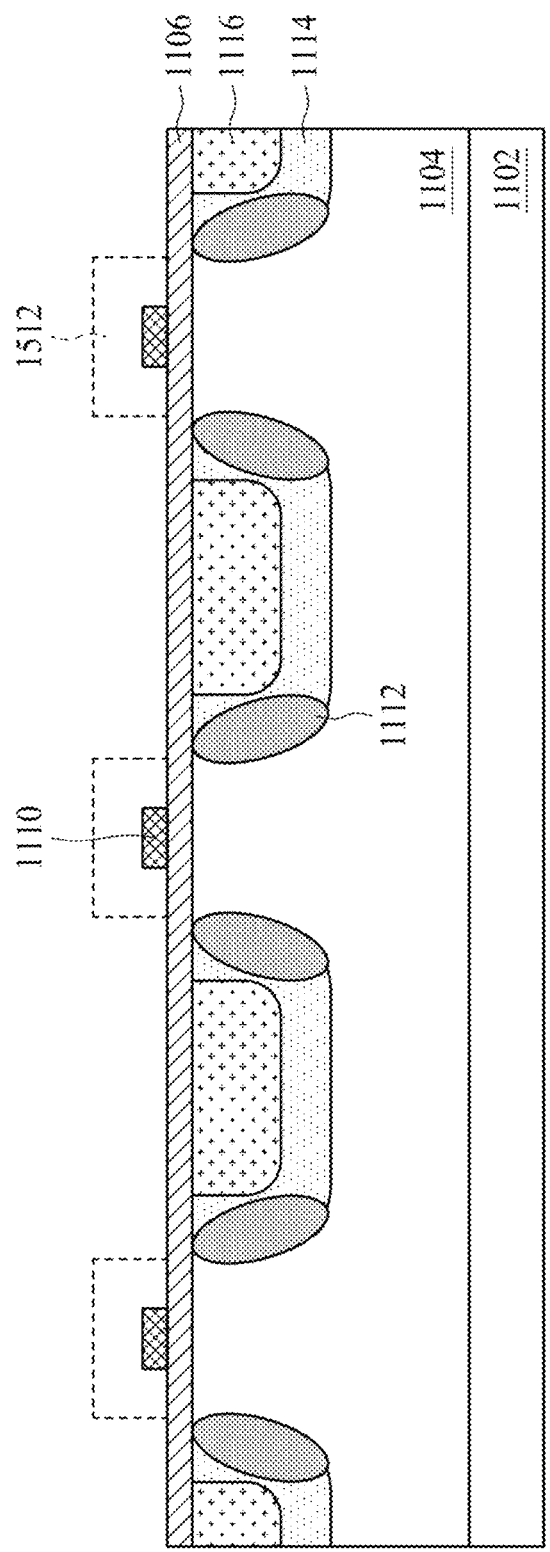

Referring to FIGS. 41 and 52, in step S1232, a trimming process may be performed to reduce the width and height of the remaining first dielectric layer 1512, thereby forming the buried oxide layer 1110. In some embodiments, the trimming process may include a dry etching process or a wet etching process.

Figure 53:
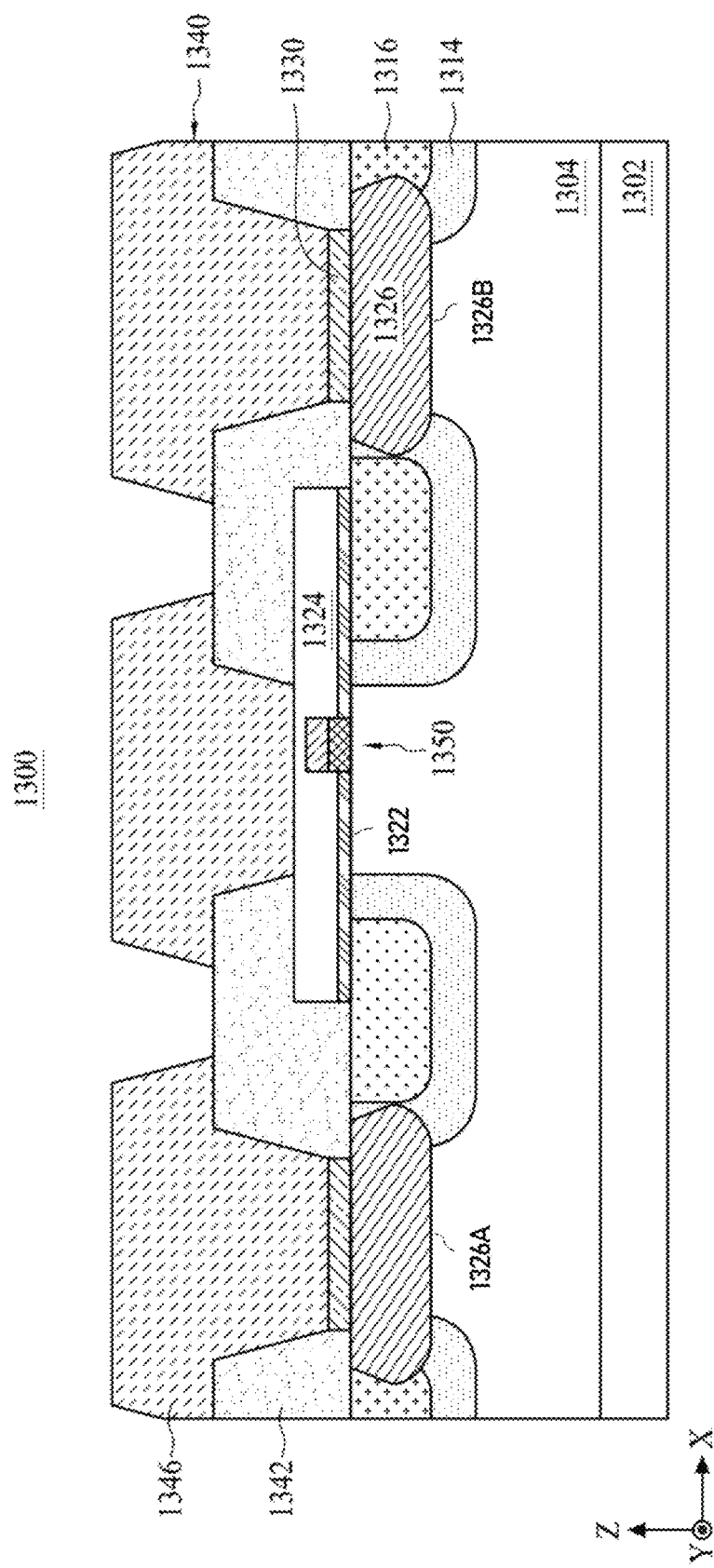
FIG. 53 is a schematic cross-sectional view of another semiconductor structure in accordance with some embodiments of the present disclosure.

FIG. 53 is a schematic cross-sectional view of an example semiconductor structure 1300 in accordance with some embodiments of the present disclosure. Referring to FIG. 53, the semiconductor structure 1300 may include a substrate 1302, an epitaxial layer 1304, well regions 1314, heavily doped regions 1316, a gate dielectric layer 1322, a gate electrode 1324, a source region 1326A, a drain region 1326B, metal silicide regions 1330, an interconnect structure 1340 and a buried oxide layer 1350. In some embodiments, the well regions 1314 may also be called a first doped region, and the heavily doped regions 1316 may also be called a second doped region.

The substrate 1302 is a semiconductor substrate, and the epitaxial layer 1304 is disposed above the substrate 1302. The substrate 1302 and the epitaxial layer 1304 may include silicon carbide. The source region 1326A and the drain region 1326B may respectively be disposed in the epitaxial layer 1304. The gate dielectric layer 1322, the gate electrode 1324, the metal silicide regions 1330, the interconnection structure 1140 and the buried oxide layer 1350 may respectively be disposed above the epitaxial layer 1304.

The plurality of well regions 1314 in the semiconductor structure 1300 may be separated from each other in the first direction X. Each heavily doped region 1316 may be surrounded by one well region 1314. The well regions 1314 may include P-type impurities, and the heavily doped regions 1316 may include N-type impurities. The buried oxide layer 1350 may be disposed on the epitaxial layer 1304 where the well regions 1314 are not provided. The gate dielectric layer 1322 may be disposed on the epitaxial layer 1304, and may continuously extend from approximately respective middle positions of two heavily doped regions 1316 on both sides of the buried oxide layer 1350 to the sidewalls of buried oxide layer 1350. The gate electrode 1324 covers the buried oxide layer 1350 and the gate dielectric layer 1322. In some embodiments, the gate electrode 1324 may continuously extend from approximately a middle position of a heavily doped region 1316 to approximately a middle position of an adjacent heavily doped region 1316. The width of the buried oxide layer 1350 may range from about 500 Angstroms to about 4000 Angstroms.

The source region 1326A and the drain region 1326B may be disposed in the epitaxial layer 1304 to the opposite ends of the gate electrode 1324. In some embodiments, the source region 1326A may partially overlap portions of the well regions 1314 and the heavily doped regions 1316 that are located to the left side of the gate electrode 1324, and the drain region 1326B may partially overlap portions of the well regions 1314 and the heavily doped regions 1316 that are located to the right side of the gate electrode 1324. The metal silicide regions 1330 may be formed above positions where the source region 1326A and the drain region 1326B do not overlap the well regions 1314 and the heavily doped regions 1316.

The interconnect structure 1340 may be disposed above the epitaxial layer 1304, the gate electrode 1324, and the metal silicide regions 1330, and may include an interlayer dielectric layer 1342 and a plurality of conductive features 1346. The conductive features 1346 may physically and electrically be connected to the gate electrode 1324 and the metal silicide regions 1330. The interlayer dielectric layer 1342 may covers the epitaxial layer 1304, the metal silicide regions 1330 and the gate electrode 1324, and surrounds at least lower portions of conductive features 1346.

Figure 54:
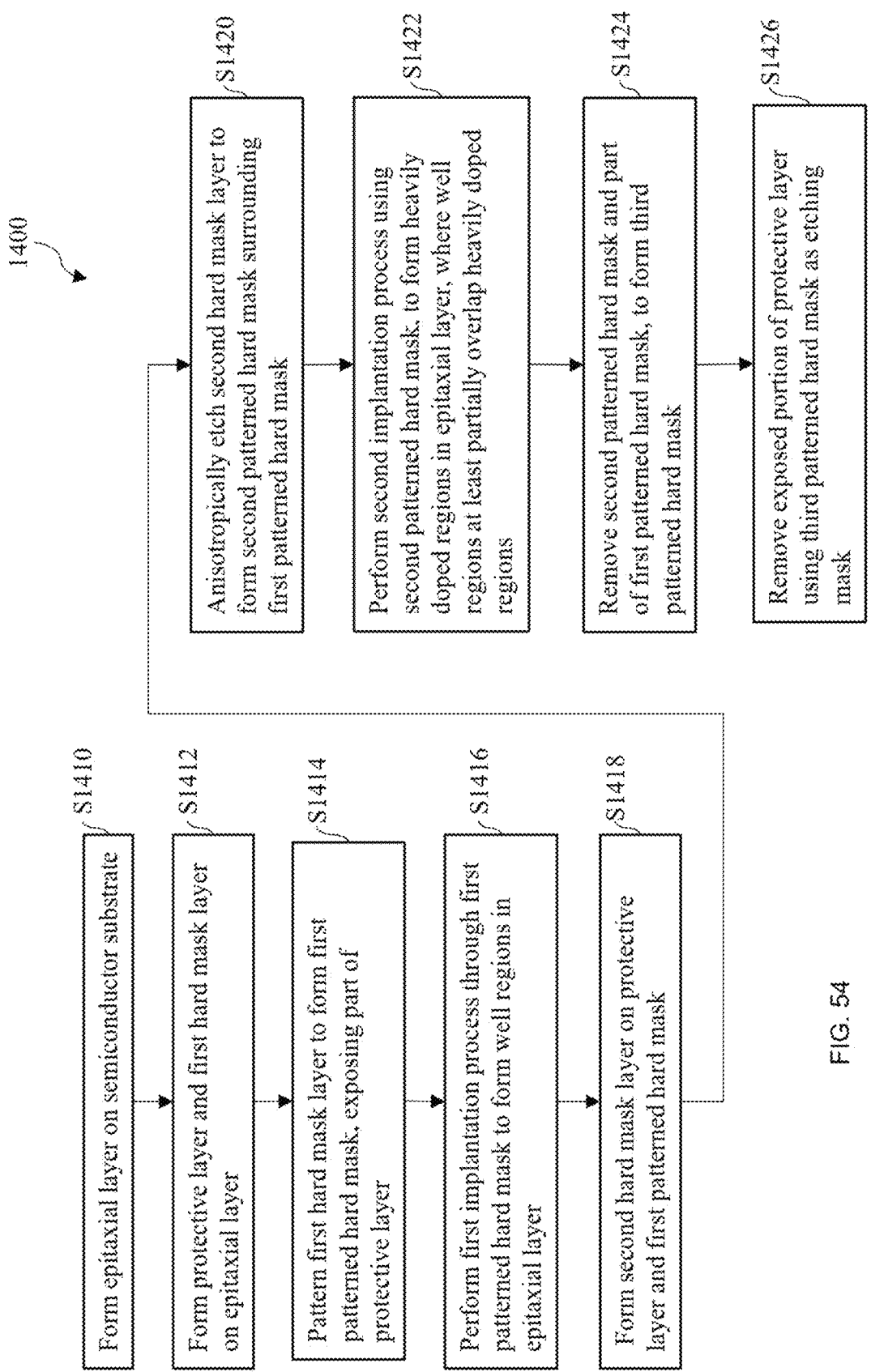
FIG. 54 is a flowchart of another method of manufacturing a semiconductor structure according to some embodiments of the present disclosure.

FIG. 54 is a flowchart of an example method 1400 of fabricating the semiconductor structure 1300 in accordance with some embodiments of the present disclosure. The method 1400 is an example only, and is not intended to limit the disclosure beyond the scope expressly recited in the claims. Additional steps may be provided before, between, and after the method 1400, and some of the steps described may be moved, replaced, or omitted providing additional embodiments of method 1400. The method 1400 will be described below in conjunction with further figures showing schematic cross-sectional views during various intermediate steps of the method 1400.

Steps S1410, S1412, and S1414 in FIG. 54 are respectively the same as steps S210, S212, and S214 in FIG. 2. Descriptions of the related specific implementation can be obtained from those provided above with respect to FIGS. 3 to 4, respectively, and will not be described again here.

Figure 55:
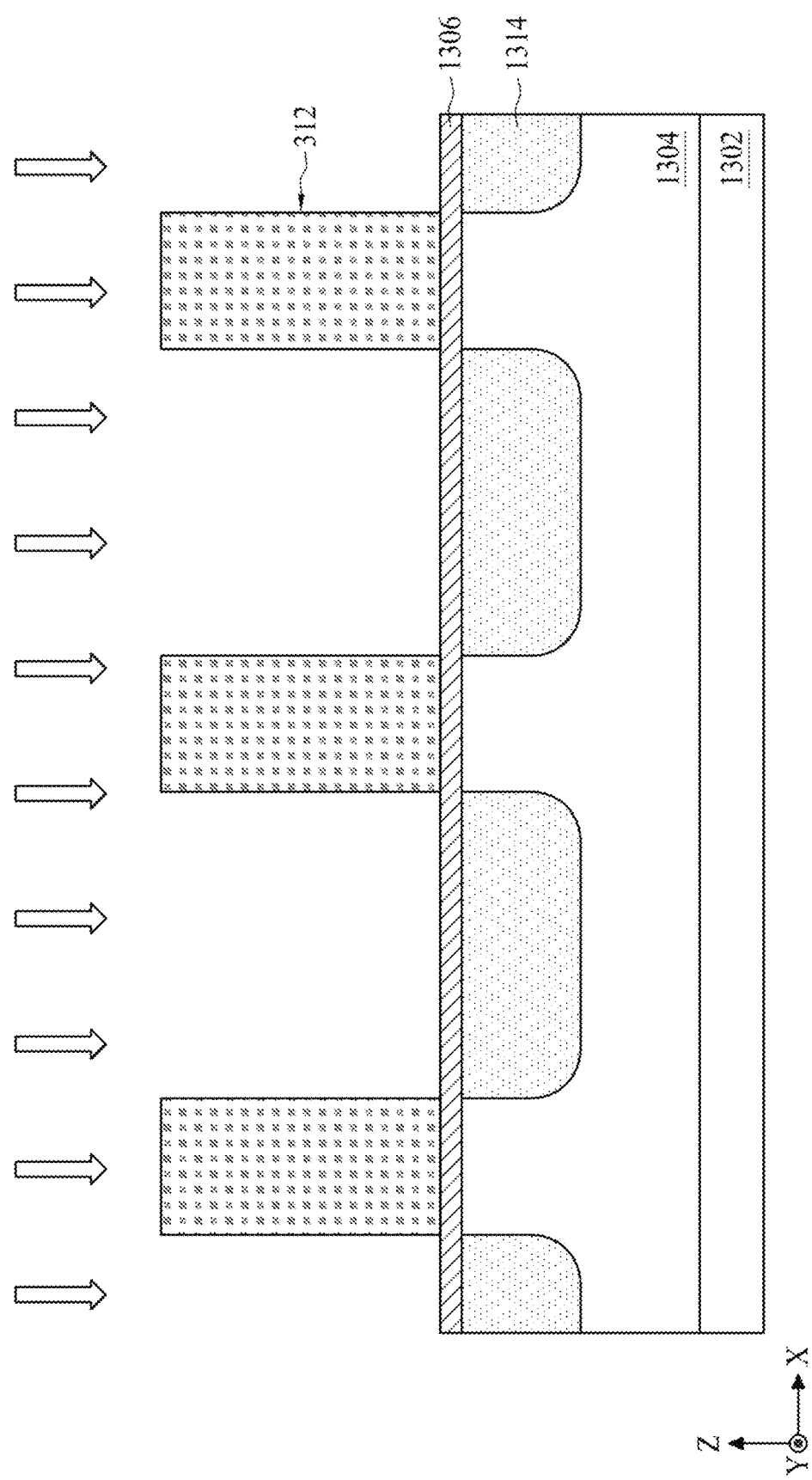
FIG. 55 to FIG. 60 are schematic cross-sectional views of various intermediate steps in a fabrication process of a semiconductor structure according to some embodiments of the present disclosure.

Referring to FIGS. 54 and 55, in step S1416, a first implantation process may be performed using the first patterned hard mask 312 as a shielding layer to form a first doped region 1314 in the epitaxial layer 1304. For example, the first implantation process may implant P-type impurities into the epitaxial layer 1304 in a manner substantially perpendicular to the top surface of the epitaxial layer 1304.

Figure 56:
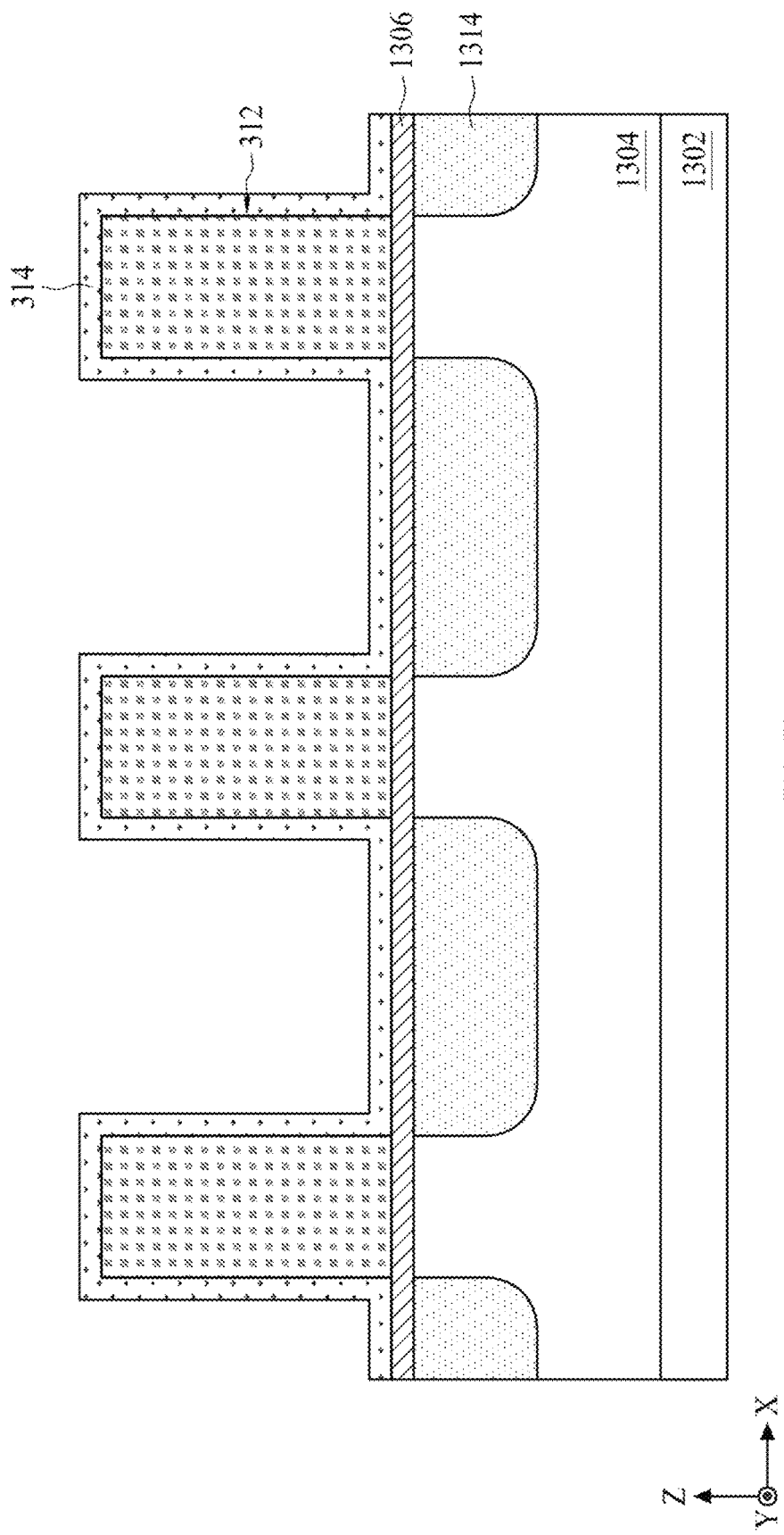

Referring to FIG. 54 and FIG. 56, in step S1418, a second hard mask layer 314 is formed above on protective layer 1306 and the first patterned hard mask 312. In some embodiments, the second hard mask layer 314 may be formed along the surface topology of the protective layer 1306 and the first patterned hard mask 312, and may have a generally uniform thickness. The second hard mask layer 314 may substantially be conformal to the shapes of protective layer 1306 and the first patterned hard mask 312.

Figure 57:
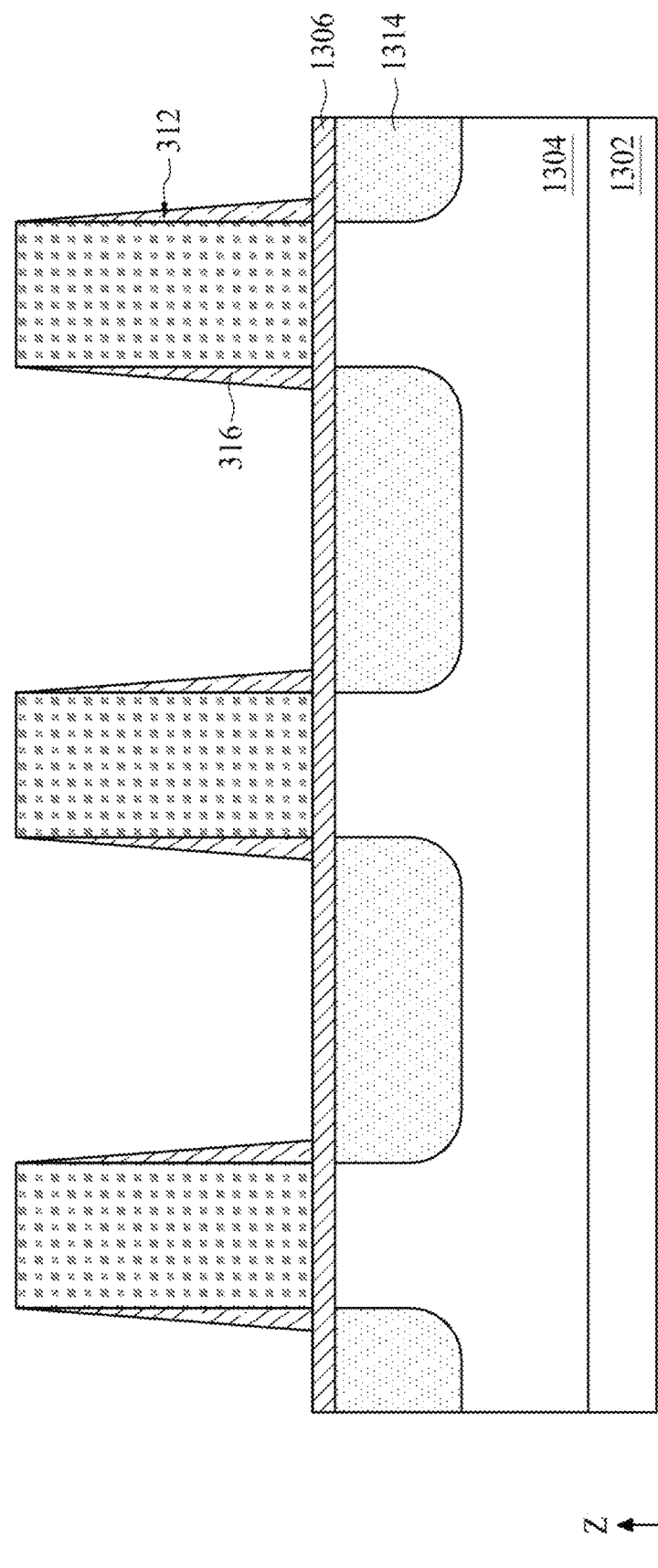

Referring to FIGS. 54 and 57, in step S1420, the second hard mask layer 314 may be anisotropically etched to form a second patterned hard mask 316 surrounding the first patterned hard mask 312. The anisotropic etching can remove the horizontal portion of the second hard mask layer 314 (i.e., the portion of the second hard mask layer 314 that is disposed on the top surface of the protective layer 1306 and the top surface of the first patterned hard mask 312), and the vertical portion of the second hard mask layer 314 (and the portion of the second hard mask layer 314 that is disposed on the sides of the first patterned hard mask 312) remains as the second patterned hard mask 316.

Figure 58:
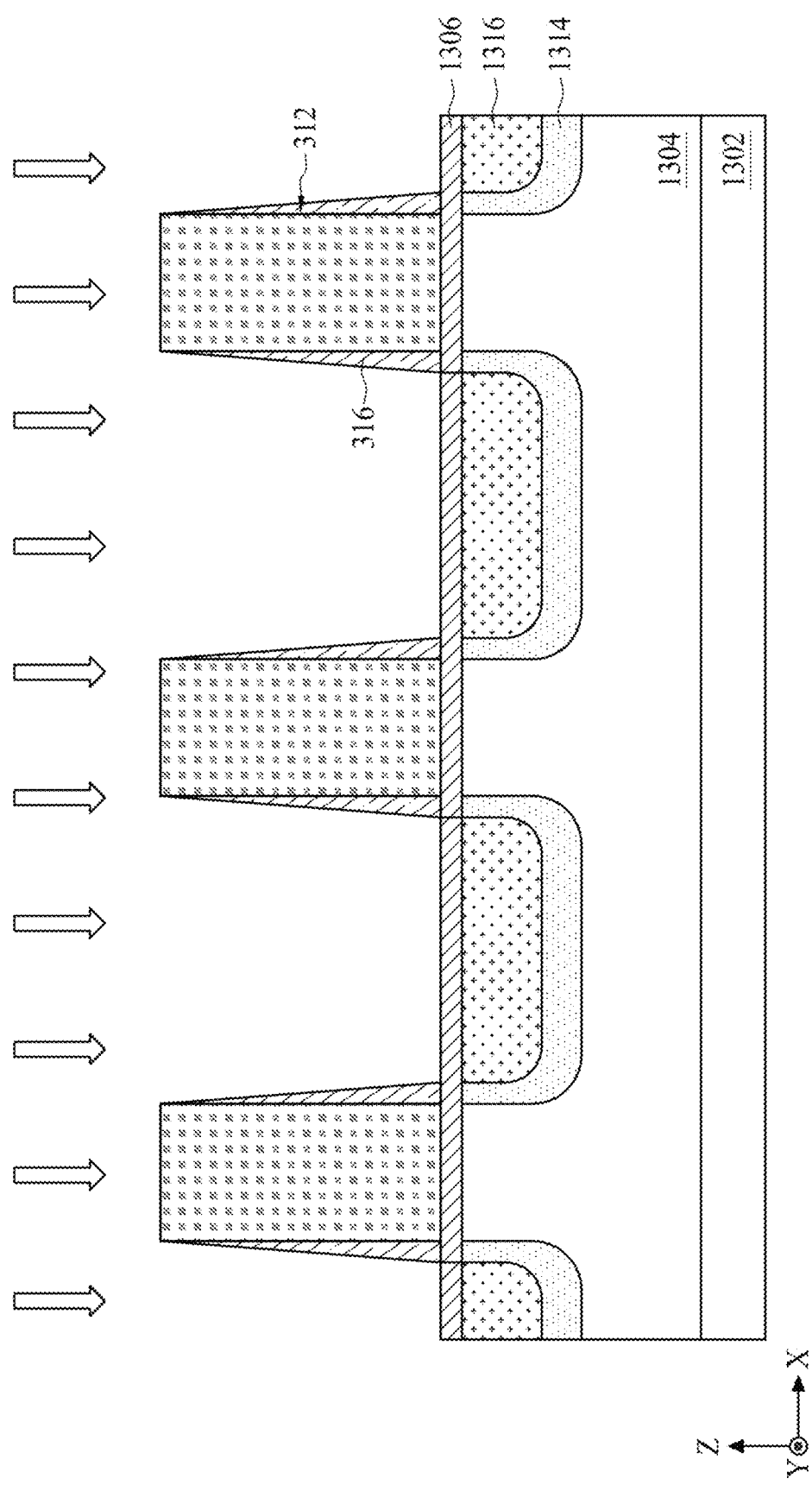

Referring to FIGS. 54 and 58, in step S1422, a second implantation process is performed using the second patterned hard mask 316 as a shielding layer to form the heavily doped regions 1316 in the epitaxial layer 1304. The second implantation process may, for example, be used to implant N-type impurities into the epitaxial layer 1304 substantially vertically. In some embodiments, the heavily doped regions 1306 have a higher doping concentration than the well regions 1304.

Figure 59:
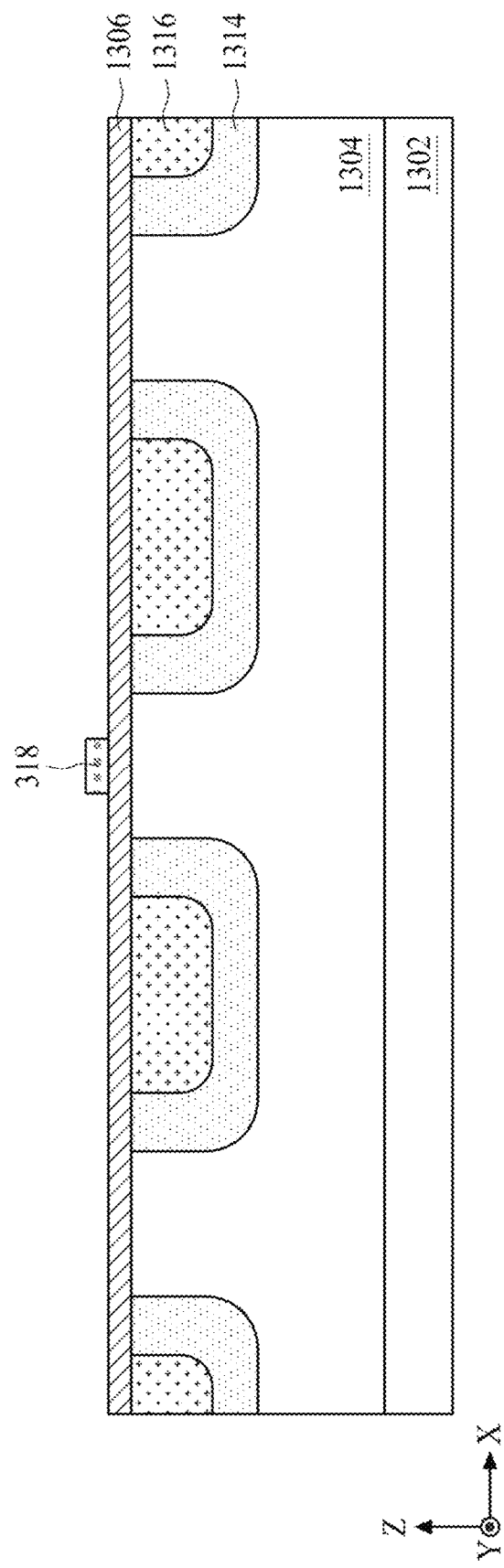

Referring to FIG. 54 and FIG. 59, in step S1424, the second patterned hard mask 316 and part of the first patterned hard mask 312 may be removed. In some embodiments, the second patterned hard mask 316 and most of the first patterned hard mask 312 may be removed through one or more etching processes, thereby forming a third patterned hard mask 318.

Figure 60:
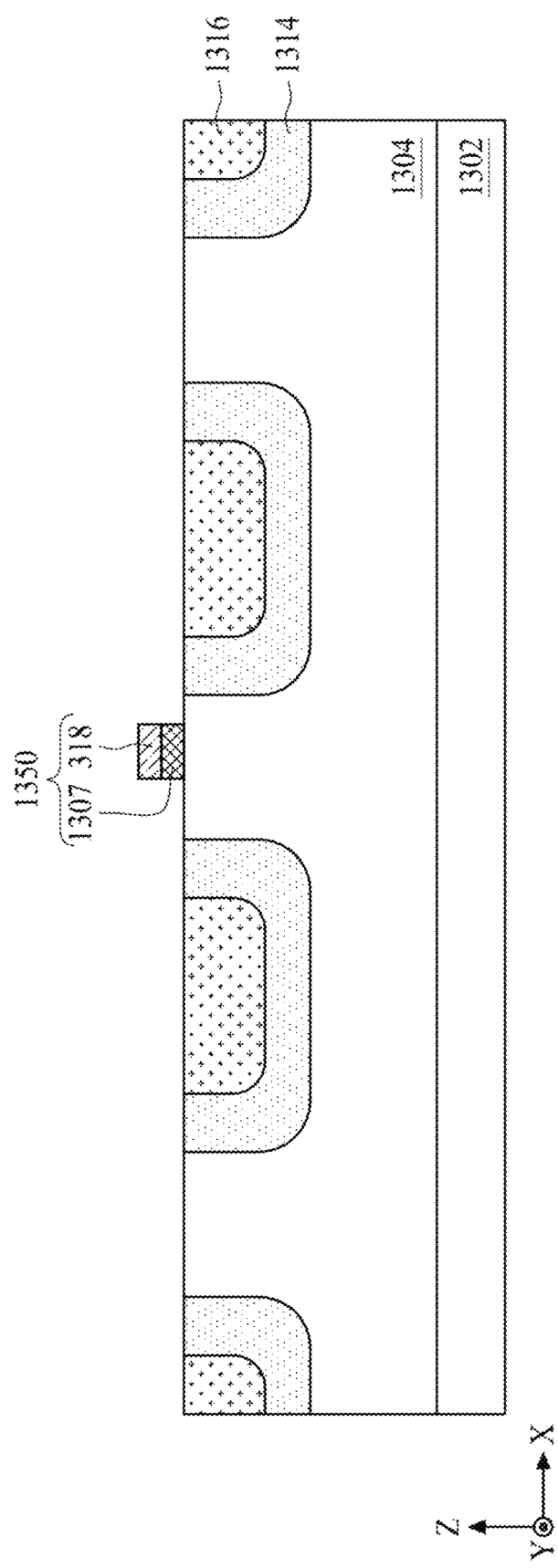

Referring to FIGS. 54 and 60, in steps S1426, the third patterned hard mask 318 may be used as an etching mask to remove the exposed portion of the protective layer 1306. The remaining portion 1307 of the protective layer 1306 and the third patterned hard mask 318 jointly form the buried oxide layer 1350.

The method 1400 may further include the steps S228-S234 as shown in FIG. 2, which steps may be used to form the gate dielectric layer 1322, the gate electrode 1324, the source region 1326A, and the drain region 1326B, the metal silicide regions 1330 and the interconnection structure 1340 as shown in FIG. 53. For the related specific implementation processes, reference may be made to the above descriptions of the S228 to S234, which will not be described again here.

Further embodiments are provided in the following.

Embodiment 1: A method for manufacturing a semiconductor structure, comprising: forming an epitaxial layer on a semiconductor substrate; forming a first patterned hard mask above the epitaxial layer; performing a first implantation process through the first patterned hard mask to form a first doped region in the epitaxial layer; performing a second implantation process through the first patterned hard mask to form a second doped region in the epitaxial layer, the first doped region at least partially overlapping the second doped region; forming a second patterned hard mask surrounding the first patterned hard mask and covering at least a portion of the first doped region; and performing a third implantation process through the first patterned hard mask and the second patterned hard mask to form a third doped region in the epitaxial layer.

Embodiment 2: The method of Embodiment 1, wherein the first doped region is arranged at a corner of the third doped region.

Embodiment 3: The method of Embodiment 1, wherein the epitaxial layer includes a first surface and a second surface opposite to the first surface, the first surface is in contact with the semiconductor substrate, and the first doped region is in contact with the second surface.

Embodiment 4: The method of Embodiment 3, wherein the first doped region partially overlaps the third doped region.

Embodiment 5: The method of Embodiment 1, wherein the third doped region is located in the second doped region and is surrounded by the second doped region.

Embodiment 6: The method of any one of Embodiments 1-5, wherein the first implantation process comprises implantation to the epitaxial layer with an implantation angle less than or equal to 45 degrees.

Embodiment 7: The method of any one of Embodiments 1-5, wherein the first implantation process is performed at room temperature or is a hot implantation process.

Embodiment 8: The method of any one of Embodiments 1-5, wherein the second doped region has a first conductivity type, the third doped region has a second conductivity type that is different from the first conductivity type, and a doping concentration of the second doping region is lower than that of the third doped region.

Embodiment 9: The method of any one of Embodiments 1-5, wherein an implantation dose of the first implantation process is from about $1\times10^{13}$ cm$^{-2}$ to about $1\times10^{15}$ cm$^{-2}$.

Embodiment 10: The method of any one of Embodiments 1-5, wherein performing the third implantation process comprises: before the first implantation process and the second implantation process are performed, performing the third implantation process, and after the completion of the third implant process, removing the second patterned hard mask.

Embodiment 11: A method for manufacturing a semiconductor structure, comprising: sequentially forming an epitaxial layer and a first patterned hard mask on a semiconductor substrate; performing a first implantation process through the first patterned hard mask to form a first doped region in the epitaxial layer; forming a second patterned hard mask surrounding the first patterned hard mask; performing a second implantation process through the first patterned hard mask and the second patterned hard mask to form a second doped region in the epitaxial layer, the first doped region at least partially overlap the second doped regions; forming a third patterned hard mask surrounding the second patterned hard mask; and performing a third implantation process through the first patterned hard mask, the second patterned hard mask and the third patterned hard mask, to form a third doped region in the epitaxial layer.

Embodiment 12: The method of Embodiment 11, wherein the first doped region is arranged at a sidewall of the second doped region.

Embodiment 13: The method of Embodiment 11, wherein the third doped region is located in the second doped region and is surrounded by the second doped region.

Embodiment 14: The method of any one of Embodiments 11-13, wherein the first implantation process implants to the epitaxial layer with an implantation angle less than or equal to 45 degrees, and the first implantation process is performed at room temperature or is a hot implantation process.

Embodiment 15: The method of any one of Embodiments 11-13, wherein forming the first patterned hard mask includes: forming a protective layer on the epitaxial layer; forming a first dielectric layer on the protective layer; forming a semiconductor layer on the first dielectric layer; forming a second dielectric layer on the semiconductor layer, wherein a melting point of the first dielectric layer is higher than a melting point of the second dielectric layer; and patterning the second dielectric layer, the semiconductor layer and the first dielectric layer to form the first patterned hard mask, wherein the first patterned hard mask exposes a portion of the protective layer.

Embodiment 16: The method of Embodiment 15, wherein the first dielectric layer is selected from the group consisting of silicon nitride ($Si_3N_4$), hafnium oxide ($HfO_2$), zirconium oxide ($ZrO_2$), and aluminum oxide ($Al_2O_3$), and the second dielectric layer includes silicon dioxide ($SiO_2$).

Embodiment 17: The method of Embodiment 15, wherein each of the first dielectric layer, the semiconductor layer and the second dielectric layer has a thickness between about 500 angstroms and about 30,000 angstroms, and a width of the second patterned hard mask is between about 500 angstroms and about 10,000 angstroms.

Embodiment 18: The method of Embodiment 15, further comprising: removing the third patterned hard mask, the second patterned hard mask, the second dielectric layer, the semiconductor layer, a portion of the first dielectric layer and a portion of the protective layer; wherein a remaining portion of the first dielectric layer and a remaining portion of the protective layer form a buried oxide (BOX) layer; and the first doped region, the second doped region and the third doped region are all exposed out of covering of the buried oxide layer.

Embodiment 19: The method of Embodiment 18, wherein a width of the buried oxide layer is between about 10 angstroms and about 20,000 angstroms, and a thickness of the buried oxide layer is between about 500 angstroms and about 4,000 angstroms.

Embodiment 20: A method for manufacturing a semiconductor structure, including: sequentially forming an epitaxial layer and a first patterned hard mask on a semiconductor substrate; forming a second patterned hard mask surrounding the first patterned hard mask; performing a first implantation process through the first patterned hard mask and the second patterned hard mask to form a first doped region in the epitaxial layer; removing the second patterned hard mask; performing a second implantation process through the first patterned hard mask to form a second doped region surrounding the first doped region in the epitaxial layer; removing a portion of the first patterned hard mask to form a third patterned hard mask; and performing a third implantation process through the third patterned hard mask to form a third doped region in the epitaxial layer, the third doped region at least partially overlapping the second doped region.

Embodiment 21: The method of Embodiment 20, wherein the third doped region is disposed at a sidewall of the second doped region.

Embodiment 22: The method of Embodiment 20 or 21, wherein the first implantation process implants the epitaxial layer at an implantation angle less than or equal to 45 degrees, and the first implantation process is performed at room temperature or is a hot injection process.

Embodiment 23: The method of Embodiment 20 or 21, wherein a thickness of the first patterned hard mask is greater than or equal to about 3 microns.

Embodiment 24: A method for manufacturing a semiconductor structure, including: sequentially forming an epitaxial layer, a protective layer and a first patterned hard mask on a semiconductor substrate; performing a first implantation process through the first patterned hard mask to form a first doped region in the epitaxial layer; forming a second patterned hard mask surrounding the first patterned hard mask; performing a second implantation process through the first patterned hard mask and the second patterned hard mask to form a second doped region in the epitaxial layer; and removing the second patterned hard mask, a portion of the first patterned hard mask and a portion of the protective layer, wherein a remaining portion of the first patterned hard mask and a remaining portion of the protective layer form a buried oxide (BOX) layer, and both the first doped region and the second doped region are exposed out of covering of the buried oxide layer.

Embodiment 25: The method of Embodiment 24, wherein the first patterned hard mask comprises a first dielectric layer formed on the protective layer, a semiconductor layer formed on the first dielectric layer, and a second dielectric layer formed on the semiconductor layer, wherein a melting point of the first dielectric layer is higher than a melting point of the second dielectric layer.

Embodiment 26: The method of Embodiment 25, wherein removing the portion of the first patterned hard mask includes: removing the second dielectric layer, the semiconductor layer and part of the first dielectric layer, such that the buried oxide layer includes a remaining portion of the first dielectric layer and the remaining portion of the protective layer.

The foregoing provides the structures of some embodiments so that people in the art can better understand aspects of the present disclosure. Those in the art should appreciate that the present disclosure may readily be used this as a basis for designing or modifying other manufacturing processes and structures for carrying out the same purposes and/or achieving the same advantages of the embodiments of the present disclosure. Those in the art should further realize that such equivalent constructions do not depart from the spirit and scope of the present disclosure, and may be variously changed, substituted and modified herein without departing from the spirit and scope of the present disclosure.

Although the description has been described in detail, it should be understood that various changes, substitutions and alterations can be made without departing from the spirit and scope of this disclosure as defined by the appended claims. Moreover, the scope of the present disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed:

1. A method for manufacturing a semiconductor structure, comprising:
    forming an epitaxial layer on a semiconductor substrate, and forming a first patterned hard mask on the epitaxial layer, the first patterned hard mask comprising a first opening extending over a first portion of the epitaxial layer;
    forming a second patterned hard mask on side surfaces of the first patterned hard mask, the second patterned hard mask together with the first patterned hard mask forming a second opening extending over a second portion of the epitaxial layer that is different from and within the first portion of the epitaxial layer;
    forming a first doped region in the second portion of the epitaxial layer by performing a first implantation through the first patterned hard mask and the second patterned hard mask;
    forming, in the first portion of the epitaxial layer with the second patterned hard mask removed, a second doped region surrounding the first doped region by performing a second implantation through the first patterned hard mask; and
    forming, in the epitaxial layer, a third doped region at a corner of the first doped region by performing a third implantation through the first patterned hard mask; and
    wherein the method further comprises: forming a protective layer on the epitaxial layer, wherein the first patterned hard mask is formed on the protective layer exposing a portion of the protective layer through the first opening; and
    wherein forming the second patterned hard mask comprises:
        forming a second hard mask layer covering the exposed portion of the protective layer and the first patterned hard mask; and
        anisotropically etching the second hard mask layer to form the second patterned hard mask, wherein a thickness of the second hard mask layer is less than a thickness of the first patterned hard mask, and a thickness of the second patterned hard mask layer on the side surfaces of the first patterned hard mask gradually increases from top to bottom of the second patterned hard mask layer.

2. The method of claim 1, wherein forming the first patterned hard mask comprises:
    forming a first hard mask layer on the protective layer; and
    etching the first hard mask layer to form the first patterned hard mask.

3. The method of claim 2, further comprising:
    forming a patterned photoresist layer on the first hard mask layer; and
    wherein etching the first hard mask layer comprises:
    etching the first hard mask layer using the patterned photoresist layer as an etching mask.

4. The method of claim 1, wherein anisotropically etching the second hard mask layer comprises:
    removing a portion of the second hard mask layer that is disposed on a top surface of the exposed portion of the protective layer and on a top surface of the first patterned hard mask, with a remaining portion of the second hard mask layer on the side surfaces of the first patterned hard mask forming the second patterned hard mask.

5. The method of claim 1, wherein the first doped region and the second doped region are in contact with the protective layer, and a bottom of the first doped region is in contact with the second doped region.

6. The method of claim 1, wherein,
    forming the first doped region comprises: forming a plurality of first doped regions separated from each other;
    forming the second doped region comprises: forming a plurality of second doped regions separated from each other, wherein each second doped region surrounds a corresponding first doped region; and
    forming the third doped region comprises: forming a plurality of third doped regions separated from each other, wherein each third doped region is at a corner of one of the plurality of first doped regions.

7. The method of claim 1, wherein the first doped region and the second doped region have different conductivity types.

8. The method of claim 1, wherein an implantation dose of the third implantation process ranges from about $1 \times 10^{13}$ cm$^{-2}$ to about $1 \times 10^{15}$ cm$^{-2}$.

9. The method of claim 1, wherein the first implantation comprises implantation to the epitaxial layer performed in a direction perpendicular to a surface of the epitaxial layer.

10. The method of claim 1, wherein the third doped region at the corner of the first doped region extends into the second doped region.

11. The method of claim 1, further comprising:
    removing the first patterned hard mask after performing the third implantation, wherein the third implantation is performed at room temperature or is a hot implantation process.

12. The method of claim 1, wherein the protective layer comprises opposing first surface and second surface, the first patterned hard mask is formed on the first surface of the protective layer, and the first doped region and the second doped region in the in the epitaxial layer are in contact with the second surface of the protective layer.

13. The method of claim 1, wherein the second doped region is in a U-shape surrounding the first doped region.

14. The method of claim 1, wherein the first doped region has a doping concentration higher than the second doped region.

15. The method of claim 1, wherein forming the third doped region comprises:
    forming, in the epitaxial layer, two third doped regions at two corners of the first doped region respectively, the two corners being at a bottom of the first doped region.

16. The method of claim 1, wherein the third doped region is in an elliptical shape in a cross-sectional view of the semiconductor structure, and is obliquely disposed at the corner of the first doped region.

17. The method of claim 6, further comprising:
forming, in the epitaxial layer, a source region and a drain region spaced apart by two adjacent first doped regions of the plurality of first doped regions, wherein the source region partially extends into one of the two adjacent first doped regions, and the drain region partially extends into the other one of the two adjacent first doped regions.

18. The method of claim 17, further comprising:
forming a metal silicide region in the protective layer, wherein the metal silicide region is in contact with the source region or the drain region.

19. The method of claim 6, further comprising:
forming a gate dielectric layer on the protective layer, and forming a gate electrode on the gate dielectric layer, the gate dielectric layer and the gate electrode extending over part of two adjacent first doped regions of the plurality of first doped regions.

20. The method of claim 1, further comprising:
forming an interlayer dielectric layer on the protective layer.

* * * * *